(12) United States Patent
Nozaki et al.

(10) Patent No.: US 6,612,290 B2
(45) Date of Patent: Sep. 2, 2003

(54) INJECTOR INTEGRATED MODULE

(75) Inventors: Takao Nozaki, Nagoya (JP); Fumiyoshi Tanigawa, Yokkaichi (JP)

(73) Assignees: Autonetworks Technologies, Ltd., Nagoya (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 123 days.

(21) Appl. No.: 09/984,220

(22) Filed: Oct. 29, 2001

(65) Prior Publication Data

US 2002/0053342 A1 May 9, 2002

(30) Foreign Application Priority Data

Nov. 6, 2000 (JP) ........................................ 2000-337529
Feb. 23, 2001 (JP) ........................................ 2001-048299

(51) Int. Cl.[7] .............................................. F02M 41/00
(52) U.S. Cl. ........................ 123/456; 123/468; 123/470
(58) Field of Search ................. 123/456, 468, 123/470, 472, 143 C, 198 E; 439/130, 652

(56) References Cited

U.S. PATENT DOCUMENTS 5,030,116 A * 7/1991 Sakai et al. ................. 439/130
5,086,743 A * 2/1992 Hickey ........................ 123/468
5,127,382 A * 7/1992 Imoehl ........................ 123/470
5,408,971 A * 4/1995 Jaeger et al. ................ 123/456
5,597,980 A * 1/1997 Weber ........................ 174/72 A
6,019,928 A   2/2000 Fujitani et al.
6,053,148 A * 4/2000 Glovatsky et al. .......... 123/470
6,394,825 B1 * 5/2002 Fujitani et al. ............. 439/130

FOREIGN PATENT DOCUMENTS

JP         B2 3011048         12/1999

* cited by examiner

*Primary Examiner*—Mahmoud Gimie
(74) *Attorney, Agent, or Firm*—Oliff & Berridge, PLC

(57) ABSTRACT

The present invention provides an injector integrated module that can be easily incorporated at the engine body side and whose weight can be decreased, wherein respective injector members 10 are inserted into injector inserting holes 43 of a flexible wiring member 40, and the flexible wiring member 40 is held and fixed between a collar-shaped holding portion 20 formed at the outer circumferential portion of the respective injector members 10 and injector fixing members 30 externally fitted from the lower end portion of the respective injector members 10. And, respective lead-out connection end portions 41*a* of the flexible wiring member 40 are pressed to connection pieces 14 formed at one side portion of the injector members 10 in the respective injector fixing members 30, so that the lead-out connection end portions 41*a* are electrically connected to the connection pieces 14.

15 Claims, 35 Drawing Sheets

INJECTOR INTEGRATED MODULE

BACKGROUND OF THE INVENTION

1. Field of the Invention

The present invention relates to an injector integrated module that is used for an internal combustion engine for automobiles, etc.

2. Related Arts

Recently, electronic control of an engine system in automobiles, etc., is advanced, wherein such a technology is employed in a fuel system of an engine, which is provided with respective injector members in intake manifolds of respective combustion chambers and controls an amount of fuel injection, etc., into the respective combustion chambers by controlling respective injector members by means of an engine control unit.

In this case, in prior arts, such a construction is employed, in which respective harness end portions led out from the engine control unit are, respectively, connected one by one to respective injector members installed at the engine side by connectors, using harnesses consisting of electric wire bundles as wiring members between the engine control unit and the respective injector members.

3. Problems to be Solved

However, there is a problem in that it is very cumbersome to connect, one by one, the respective harness end portions led out from the engine control unit to the respective injector members installed at the engine side by connectors as in the prior arts.

Further, since a harness consisting of electric wire bundles is used as a wiring member between the engine control unit and respective injector members and the respective harness end portions are connected to the respective injector members by using connectors, another problem arises, which causes the total weight to be increased.

SUMMARY OF THE INVENTION

It is therefore an object of the invention to provide an injector integrated module that can be easily attached to the engine body side and can simultaneously attempt to reduce the weight.

Means for Solving the Problems

In order to solve the above-described problems and other shortcomings, an injector integrated module according to Aspect 1 is provided with a plurality of injector members corresponding to respective combustion chambers of an engine, which carries out fuel injection control of the respective injector members by an engine control unit; and the injector members comprises a flexible wiring member in which a wiring conductor to make electrical connections between the engine control unit and the respective injector members is placed between a pair of insulation films; and a plurality of injector members internally having a fuel opening and shutting mechanism incorporated, which is driven to open and shut on the basis of a fuel injection control signal from the engine control unit and adjusts injection timing of fuel from a fuel injection hole; wherein the wiring conductor of the flexible wiring member is electrically connected to the fuel opening and shutting mechanism in the respective injector members at respective positions on the flexible wiring member having spacing that permits the respective injector members to be installed at the engine body side.

As is described in Aspect 2, the respective injector members are formed to be roughly cylindrical, at one end side of which a fuel intake port is formed, and at the other end portion of which a fuel injection hole is formed; collar-shaped holding portions are formed at the circumferential portion of the respective injector so as to protrude along the circumferential portion thereof, and simultaneously, a plurality of injector fixing members that are externally fitted from the end portion at the fuel intake port side or the fuel injection hole side and are fixed at the respective injector members are provided, corresponding to the respective injector members; a circumferential edge part of the respective injector inserting holes of the flexible wiring member is held and fixed between the respective collar-shaped holding portions and the respective injector fixing members that are externally fitted to the respective injector members in a state where the injector members are, respectively, inserted into a plurality of injector inserting holes formed on the flexible wiring member; connection pieces that are electrically connected to the fuel opening and shutting mechanism are exposed at and formed at the outer circumference of the respective injector members while connection end portions of the wiring conductor to the respective injector members are formed at an exposed connection end portion that is exposed to the outside at the circumferential edge part of the respective injector inserting holes; and the exposed connection end portions may be electrically connected to the connection pieces between the collar-shaped holding portions and the injector fixing members in the respective injector members.

In this case, as is described in Aspect 3, resilient pressing pieces that press the respective exposed connection end portions toward the respective connection pieces are formed at the respective injector fixing member between the respective collar-shaped holding portions and the respective injector fixing members; and the exposed connection end portions are pressed so as to be brought into electrical contact with the connection pieces by the resilient pressing pieces in the respective injector members.

In addition, as is described in Aspect 4, the respective connection pieces are exposed to and formed at positions where the respective connection pieces can be brought into contact with one surface side of the flexible wiring member of the respective collar-shaped holding portions, which is held and fixed between the respective collar-shaped holding portions and the respective injector fixing members; the respective exposed connection end portions are formed so as to be exposed to a position where the respective exposed connection end portions are brought into contact with the respective connection pieces at one surface side of the flexible wiring member; resilient pressing pieces that press the respective exposed connection end portions from the other side of the flexible wiring member to the connection pieces corresponding thereto are formed at the respective injector fixing members; the exposed connection end portions may be pressed by the resilient pressing members from the other side of the flexible wiring member along the direction orthogonal to the surface direction of the flexible wiring member in the respective injector members so that the exposed connection end portions are brought into electrical contact with the connection pieces.

Also, as is described in Aspect 5, an annular resilient member is disposed, at a position avoiding the respective injector members so that the injector members are not internally included, between the respective collar-shaped holding portions and the respective injector fixing members; and the exposed connection end portions may be electrically connected to the connection pieces, at a position surrounded by the annular resilient member, between the collar-shaped holding portions and the injection fixing members.

In addition, as is described in Aspect 6, the respective injector members may be integrated with a delivery pipe in a state where the respective injector members are connected to and held at the engine body side in an installable state.

Further, as is described in Aspect 7, the respective injector members are formed to be roughly cylindrical, at one end side of which a fuel intake port is formed, and at the other end side of which a fuel injection hole is formed; a delivery pipe having a plurality of injection attaching base portions is provided, into and to which the end portion at the fuel intake port side of the respective injector members are inserted and connected, and which holds the respective injector members in a state where the respective injector members are installed at the engine body side; a plurality of injector fixing members, which are externally fitted to the respective injector members from the end portion at the fuel injection hole side, and are fixed at the respective injector attaching base portions, are provided, corresponding to the respective injector members; circumferential edge parts of the respective injector inserting holes of the flexible wiring member are held and fixed between the respective injector attaching base portions and the respective injector fixing members, which are externally fitted to the respective injector members, in a state where the end portions of the respective injector members at the fuel intake port side are inserted into and connected to the respective injector attaching base portions, and at the same time the respective injector members are, respectively, inserted into and connected to a plurality of injector inserting holes formed in the flexible wiring member; connection pieces that are electrically connected to the fuel opening and shutting mechanism are exposed to and formed at the outer circumference of the respective injector members while connection end portions of the wiring conductor to the respective injector members are formed at exposed connection end portions that are exposed to the outside at the circumferential edge part of the respective injector inserting holes; and the exposed connection end portions may be electrically connected to the connection pieces between the injector attaching base portions and the injector fixing members at the respective injector members.

In this case, as is described in Aspect 8, the injector fixing member may be integrated with the injector member. In addition, as shown in Aspect 9, resilient pressing pieces that press the respective exposed connection end portions toward the connection pieces are formed at the respective injector attaching base portions between the respective injector attaching base portions and the respective injector fixing members, and the exposed connection end portions may be pressed to the connection pieces by the resilient pressing pieces in the respective injector members so as to be brought into electrical contact with the connection pieces.

Also, as is described in Aspect 10, the respective connection pieces are exposed to and formed at positions where the connection pieces are brought into contact with one surface side of the flexible wiring member of the respective injector fixing members, which is held and fixed between the respective injector fixing members and the respective injector attaching base portions; the respective exposed connection end portions exposed to and formed at positions where the exposed connection end portions are brought into contact with the respective connection pieces at one surface side of the flexible wiring member; resilient pressing pieces that press the respective exposed connection end portions to the respective connection pieces corresponding thereto from the other side of the flexible wiring member are formed at the respective injection attaching base portions; and the exposed connection end portions may be pressed, by the resilient pressing pieces, along the direction orthogonal to the surface direction of the flexible wiring member in the respective injector members in a state where the exposed connection end portions are brought into electrical contact with the connection pieces.

Further, as is described in Aspect 11, annular resilient members are disposed at positions avoiding the respective injector members, so that the respective injector members are not internally included, between the respective injector attaching base portions and the respective injector fixing members; and the exposed connection end portions are electrically connected to the connection pieces at positions, where the exposed connection end portions are surrounded by the annular resilient member between the injector attaching base portions and the injector fixing members.

Also, as is described in Aspect 12, connection base portions are formed at one side of the respective injector members, and at the same time, connection pieces that are electrically connected to the fuel opening and shutting mechanism are exposed to and formed at the connection base portions; injector fixing members that are able to be fixed at the respective connection base portions from a side direction are provided, corresponding to the respective injector members; the flexible wiring member is held and fixed between the respective injector fixing members and the respective connection base portions by the respective injector fixing members being fixed at the respective connection base portions; exposed connection end portions in which the connection end portions of the wiring conductor to the respective injector members are exposed to the outside are formed at respective portions of the flexible wiring member, which are held and fixed between the respective injector fixing member and the respective connection base portions; and the exposed connection end portions are electrically connected to the connection pieces between the connection end portions and the injector fixing members in the respective injector members.

In this case, as is described in Aspect 13, an annular resilient member is disposed so as to surround the connection portions of the respective exposed connection end portions and the respective connection pieces between the respective connection end portions and the respective injector fixing members. Also, as shown in Aspect 14, resilient pressing pieces that press the exposed connection end portions toward the connection pieces between the respective connection base portions and the respective injector fixing members are formed in the injector fixing members; and the exposed connection end portions are pressed by the resilient pressing member so as to be brought into electrical contact with the connection pieces in the respective injector members.

In the injector integrated module described above, as in Aspect 15, the delivery pipe may be integrated with the engine head cover.

DETAILED DESCRIPTION OF THE PREFERRED EMBODIMENTS

EMBODIMENTS OF THE INVENTION

A general construction of an injector integrated module according to the invention is such that, in an injector integrated module which carries out fuel injection control of a plurality of injector members corresponding to respective combustion chambers of an engine by means of an engine control unit (a so-called "EFI-ECU"), a flexible wiring member is at least partially used as an electric wiring structure between the engine control unit and the respective injector members, wiring conductors of the flexible wiring member are electrically connected to the fuel opening and shutting mechanism in the above-described respective injector members at respective positions on the corresponding flexible wiring member with spacing in which the respective injector members are installed at the engine body side.

Figure 1:
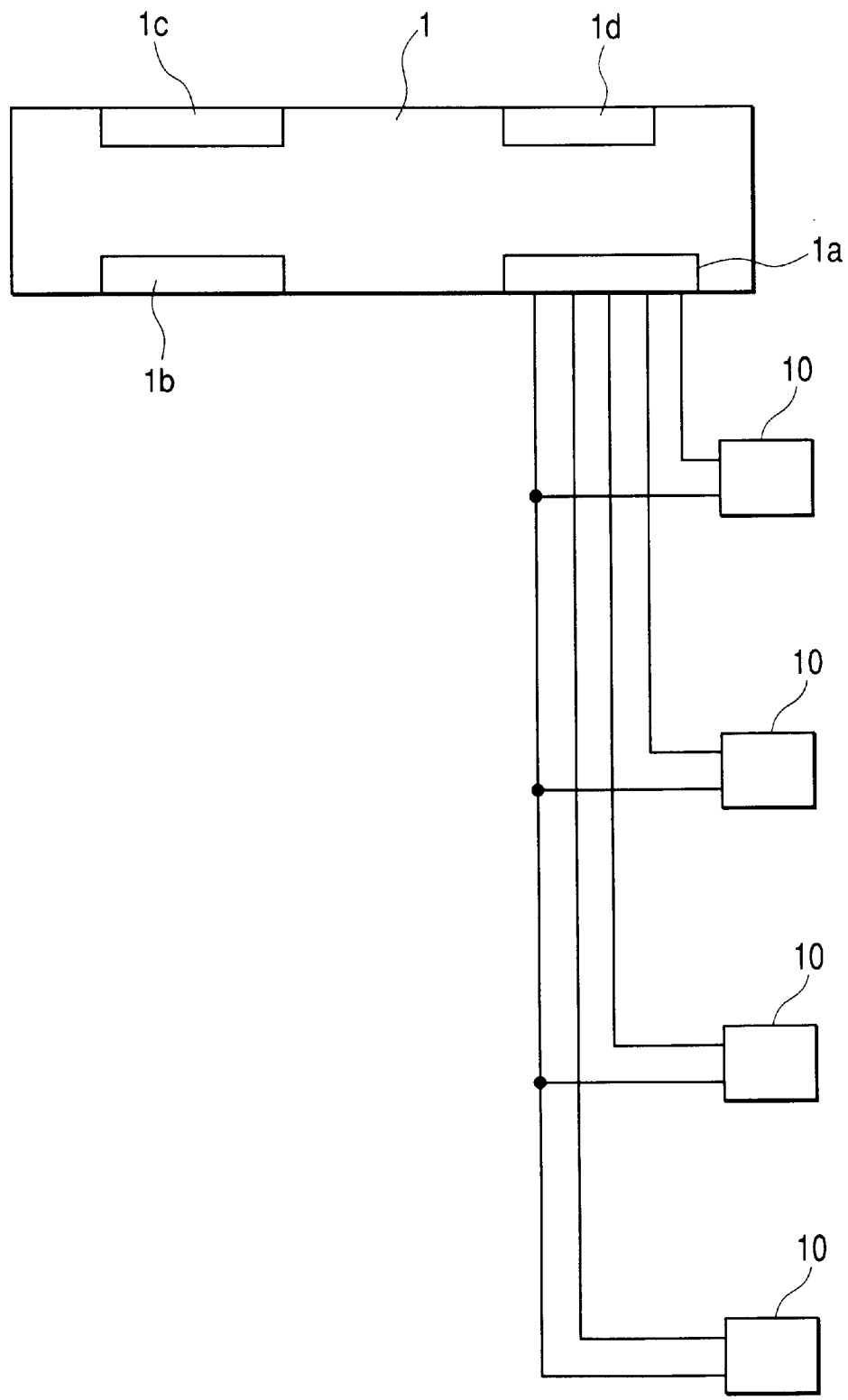
FIG. 1 is a block diagram showing an electrical configuration of the engine control unit.
Figure 2:
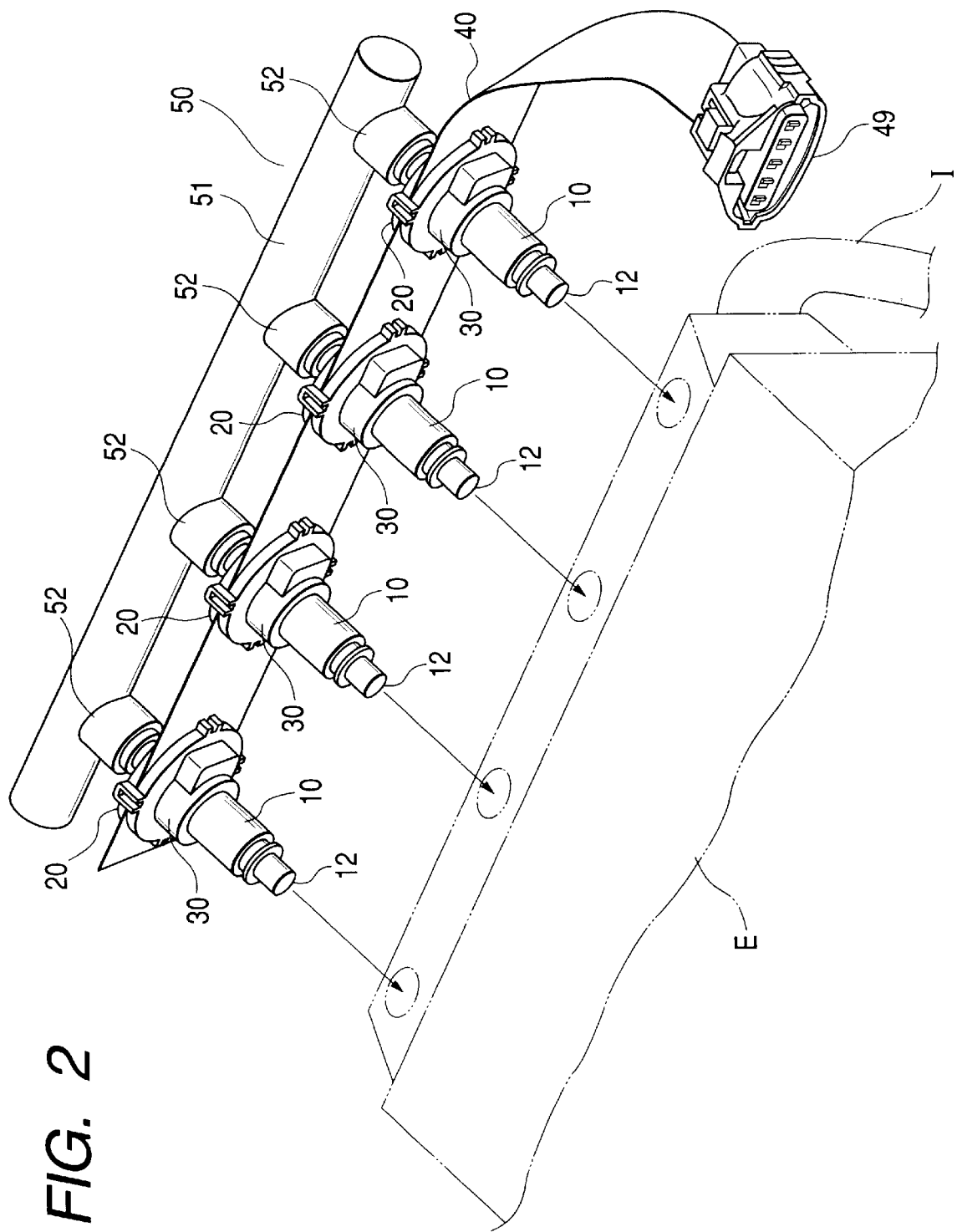
FIG. 2 is a perspective view showing an injector integrated module according to Embodiment 1 of the invention.
Figure 3:
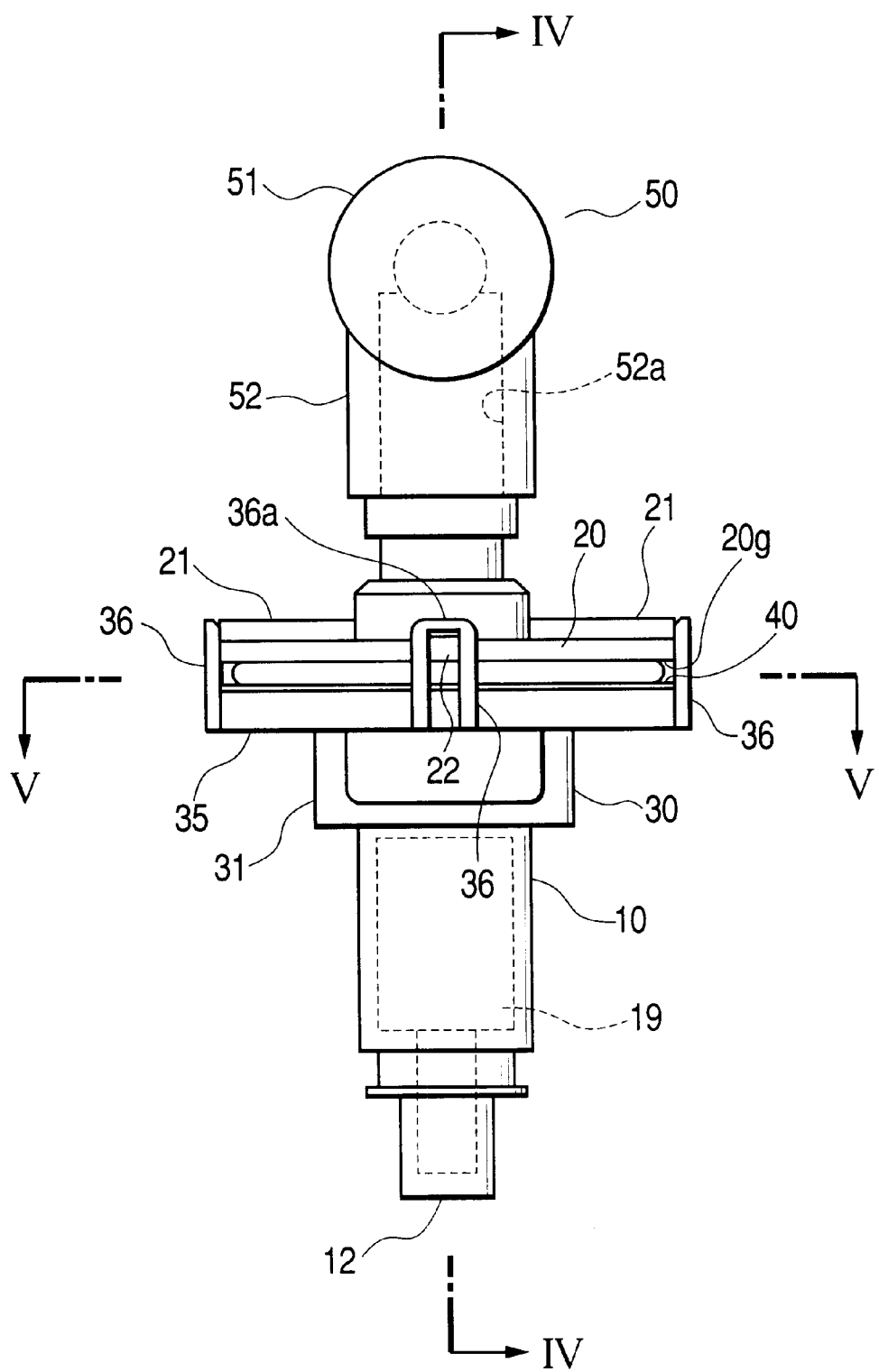
FIG. 3 is a side elevational view showing the same injector integrated module as above.
Figure 4:
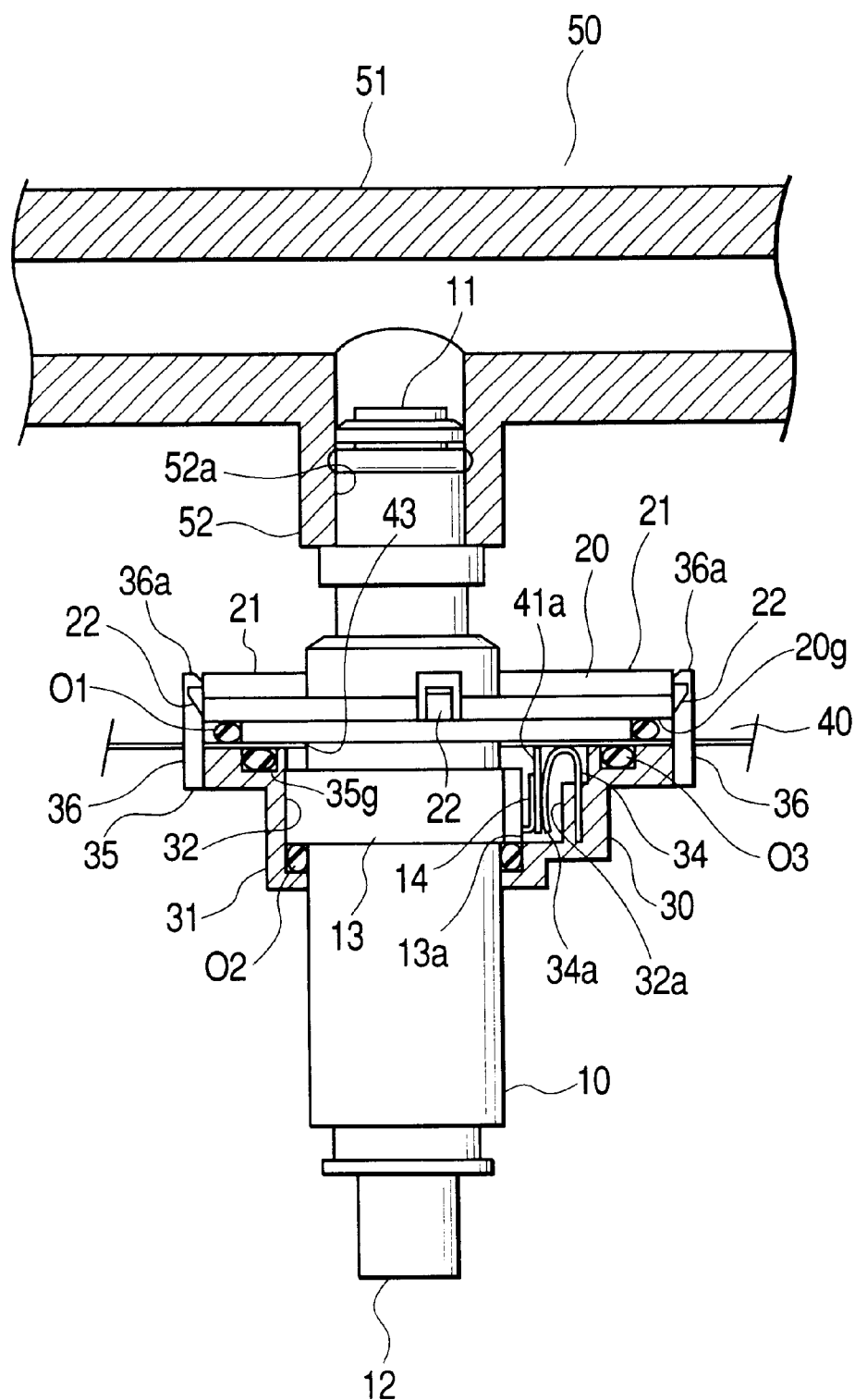
FIG. 4 is a partially broken front elevational view taken along the line IV—IV in FIG. 3.
Figure 5:
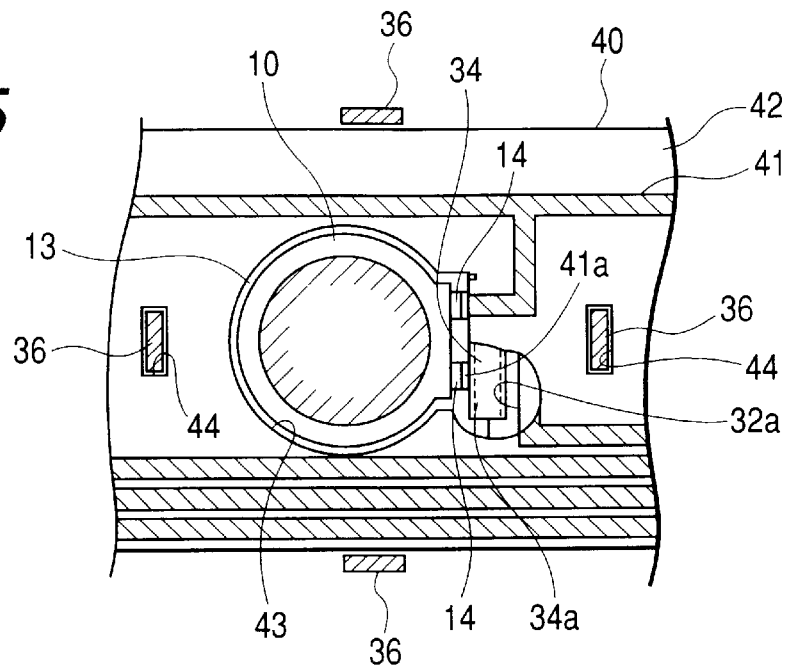
FIG. 5 is a sectional view taken along the line V—V in FIG. 3.
Figure 6:
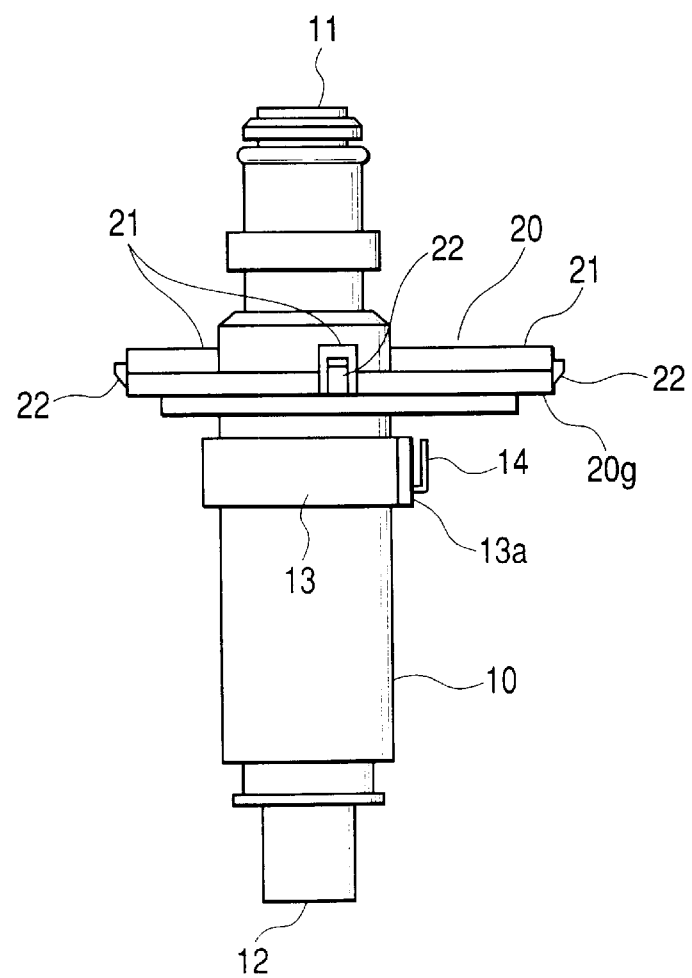
FIG. 6 is a front elevational view showing an injector member.
Figure 7:
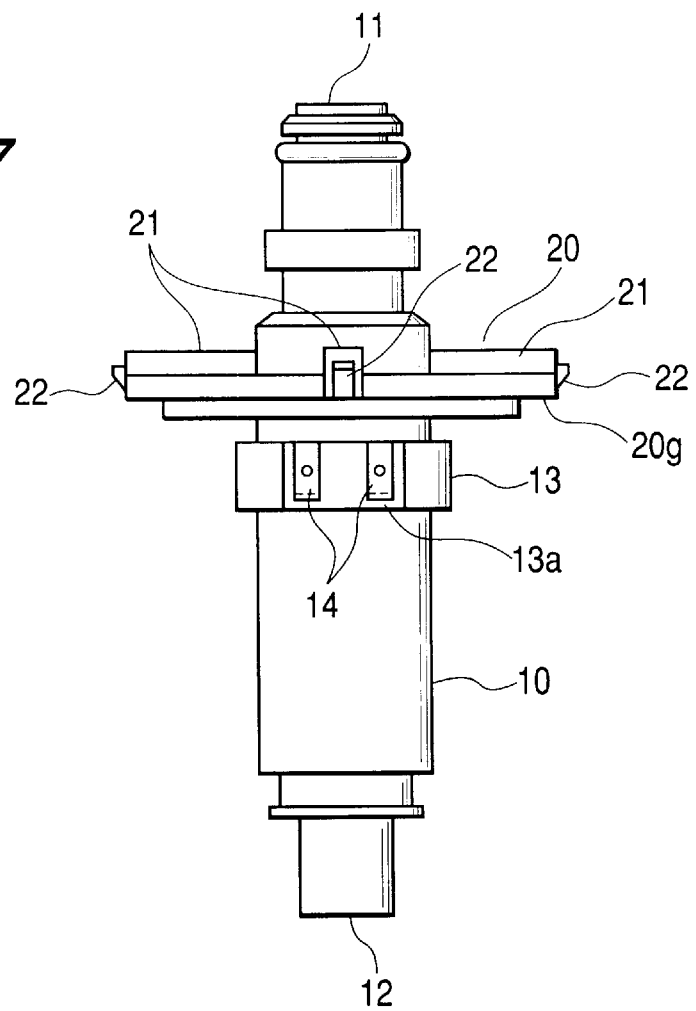
FIG. 7 is a side elevational view showing the injector member.
Figure 8:
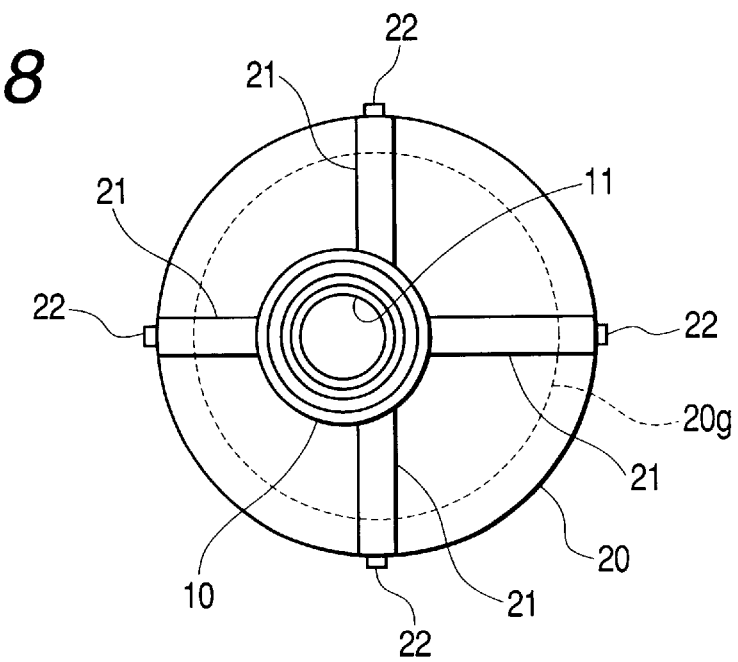
FIG. 8 is a plan view showing the injector member.

Herein, first, a description is given of an example of an engine control system to which the injector integrated module is applied. In the engine control system, as shown in FIG. 1, the engine control unit 1 is connected to the respective injector members 10 via input and output portions 1a, and simultaneously is further connected, via input and output portions 1b through 1d, to various types of sensors secured in the engine body side, and various components such as a power system like batteries, junction blocks, etc., in a vehicle compartment, and is still further connected to various ignition coil devices. And, the engine control unit 1 controls the fuel injection timing, etc., of the injector members 10 on the basis of various types of detection signals from the above-described various types of sensors. Also, in the engine control system, it is assumed to be based on a four-cylinder engine. Therefore, the engine is provided with four injector members 10. However, the number of injector members 10 may be adequately varied in compliance with the number of cylinders of an engine.

Under the above-described assumption, a description is given of a further detailed embodiment of the invention.

Embodiment 1

Hereinafter, an injector integrated module according to Embodiment 1 of the invention is described below.

The injector integrated module is such that, in an engine control system shown in FIG. 1, the respective injector members 10 and an electric wiring structure between the respective injector members 10 and the engine control unit are at least partially integrated together.

As shown in FIG. 2 through FIG. 5, the injector integrated module is provided with a plurality of injector members 10, a flexible wiring member 40, and a plurality of injector fixing members 30 for attaching and fixing the above-described injector members 10 on the flexible wiring member 40.

The respective injector members 10 are, respectively, installed in the intake manifold 1 of the respective combustion chambers. As shown in FIG. 2 through FIG. 8, the respective injector members 10 are formed to be roughly cylindrical, at one end side of which a fuel intake port 11 is formed and at the other end side of which a fuel injection hole 12 is formed, wherein a fuel opening and shutting mechanism 19 (See FIG. 3) that adjusts the injection timing of fuel from the above-described fuel injection hole 12 is provided therein.

One end portion of the respective injector members 10 is inserted into respective attaching portions 52 of a delivery pipe 50 and is connected thereto. Herein, the delivery pipe 50 has a plurality of attaching portions 52 formed at and suspended from the straight tubular fuel pass portion 51 thereof at appointed space so as to protrude therefrom along its lengthwise direction, and fuel feeding ports 52a are formed at the respective attaching portion 52. And, where one end portion of the respective injector members 10 is inserted into and connected to the fuel feeding ports 52a of the respective attaching portions 52, the corresponding respective injector members 10 are connected to and held at the engine body E side in an installable state, and fuel that is supplied through the above-described fuel pass portion 51 is bifurcated by the respective fuel feeding ports 52a and can be supplied to the respective injector members 10 through the respective fuel intake ports 11.

In addition, the fuel opening and shutting mechanism 19 is driven to open and shut on the basis of fuel injection control signals from the engine control unit 1 and is constructed so that the mechanism 19 can control the injection timing of fuel from the fuel injection holes 12. As is publicly known, an electromagnetic coil is excited in response to the fuel injection control signals from the engine control unit 1 to attract a plunger, whereby a needle valve is opened to inject fuel through the fuel injection hole 12. At this time, the injection amount of fuel can be controlled by exciting the electromagnetic coil and adjusting the interval during which fuel is injected from the fuel injection hole 12.

Also, a connection piece 14 that is electrically connected to the fuel opening and shutting mechanism 19 is formed at one end side of the outer circumferential portion of the injector members 10, wherein an excitation current is permitted to flow into the above-described electromagnetic coil through the connection piece 14. In the present embodiment, the intermediate portion of the injector members 10 in the lengthwise direction thereof is made so as to have a slightly larger diameter than that of the circumferential edge part, that is, made into a large diameter section 13, and a flat portion 13a is formed at one side portion of the large diameter section 13. And, a pair of left and right connection pieces 14 are formed at the flat portion 13a. The respective connection pieces 14 are made roughly L-shaped in its side view, wherein one end portion of a thin band-shaped conductive piece such as metal is buried in the lower part of the above-described flat portion 13a and is electrically connected to the above-described electromagnetic coil while the other end portion hereof is bent so that it is raised upward after being projected slightly outward from the flat portion 13a. That is, the respective connection pieces 14 are formed so as to have a resilient deforming area from outward to inward in the diameter direction of the injector members 10.

A collar-shaped holding portion 20 is formed so as to protrude along the circumferential direction at the outer circumferential portion of the injector members 10. The collar-shaped holding portion 20 is formed in the upper vicinity of the above-described connection pieces 14, wherein the connection pieces 14 can be disposed in the injector fixing members 30 in a state where the connection pieces 14 overlap the injector fixing members 30.

Also, a reinforcement rib-shaped portion 21 of the collar-shaped holding portion 20 is provided so that the rib-shaped portion 21 extends in four directions centering around the injector member 10 on the upper surface of the collar-shaped holding portion 20, and simultaneously, a projection 22 described later, which is engaged with respective engagement portions 36 that are formed at the side of the injector fixing member 30, is provided so as to protrude from the outer surface at respective parts where the rib-shaped portion 21 is formed.

Also, in the embodiment, an annular recess 20g is formed along the lower circumferential edge part of the collar-shaped holding portion 20, and at the same time, a waterproof ring member O1 such as a rubber is provided in the annular recess 20g, wherein the waterproof ring member O1 is compressed to intervene between the flexible wiring member 40 and the collar-shaped holding portion 20, wherein water can be prevented from invading therealong.

A flexible wiring member 40 is constructed so that a wiring conductor 41, which makes electrical connections between the engine control unit 1 and the respective injector members 10, is placed between a pair of insulation films 42. And an FPC (flexible printed circuit board) may be used.

The flexible wiring member 40 is formed to be roughly band-like in its plan view, and a connector 49 attached to one end portion thereof is connected to a connector at the engine control unit 1 side or to a connector of the engine control unit 1. Also, the place of installation of the above-described engine control unit 1 is not specially limited. However, in order to make the wiring members between the engine control unit 1 and the respective injector members 10 as short as possible, it is preferable that the engine control unit 1 is installed on the engine head cover or in the vicinity of the engine body E.

A plurality of injector inserting holes 43 are formed at appointed spaces along the lengthwise direction of the flexible wiring member 40, in detail, corresponding to the respective positions where the above-described respective injector members 10 are installed at the engine body E side. The respective injector inserting holes 43 are formed so as to match the shape of the large diameter section 13 having the above-described connection piece 14 of the injector members 10 formed, whereby the injector members 10 can be inserted from the fuel injection hole 12 side. Also, the connection end portion of the wiring conductor 41 to the respective injector members 10 are formed at the exposed connection end portion that is exposed to the outside at the circumferential edge part of the respective injector inserting hole 43. In the embodiment, the connection end portion of the wiring conductor 41 to the respective injector members 10 are taken out at the circumferential edge parts of the respective injector inserting holes 43, that is, at the positions where the above-described connection pieces 14 are disposed, and the connection end portions are, respectively, formed at the lead-out connection end portions 41a as the exposed connection end portions. The lead-out connection end portions 41a may be such that the wiring conductor 41 is independently exposed, or that it is taken out outwardly in such a state where only one side insulation film 42 is peeled off with the other side insulation film 42 remained thereat.

As shown in FIG. 2 through FIG. 5, the respective injector fixing members 30 are externally fitted to the respective injector members 10 from the fuel intake port 11 or the fuel injection hole 12 side, and are formed so as to be fixed at the above-described collar-shaped holding portion 20. In the embodiment, the injector fixing members 30 are externally fitted from the fuel injection hole 12 side. And, the flexible wiring member 40 is held and fixed between the injector fixing member 30 and the collar-shaped holding portion 20 in a state where the injector fixing member 30 is fixed at the collar-shaped holding portion 20.

In detail, the injector fixing members 30 are, respectively, provided with an injector accommodating portion 31 that can accommodate the large diameter section 13 of the respective injector members 10 and a collar-shaped portion 35 formed so as to protrude from the upper portion of the injector accommodating portion 31 along its circumferential direction.

Also, in the injector accommodating portion 31, an accommodation hole portion 32 that is able to accommodate the above-described large diameter section 13 is formed, and a resilient pressing piece 34 is formed in the accommodation hole portion 32, which presses the above-described lead-out connection end portion 41a so as to be brought into electrical connection with the connection piece 14.

In detail, in a state where the large diameter section 13 is accommodated in the injector accommodation portion 31, the portion facing the above-described flat portion 13a of the inner surface of the above-described injector accommodation portion 31 is disposed and formed at a flat portion 32a formed with appointed spacing remaining between the same and the corresponding flat portion 13a, and the above-described resilient pressing piece 34 is provided at the side wall potion of the injector accommodation portion 31 where the flat portion 32a is formed. The resilient pressing piece 34 is formed of a resilient material such as metal or resin, etc., one end portion of which is buried in the side wall portion of the above-described injector accommodating portion 31, and simultaneously the other end portion of which is formed and bent so as to fold downward from the upper end portion of the side wall portion directed between the above-described flat portion 13a and the flat portion 32a. Thus, where the lead-out connection portion 41a is held and disposed between the fold-over end portion 34a of the resilient pressing piece 34 and the connection piece 14, the lead-out connection end portion 41a is pressed by the resilient pressing piece 34 so that it can be brought in to electrical contact with the respective connection pieces 14.

Also, the resilient pressing piece 34 may be made of a single material or may be made of a plurality of materials corresponding to the respective connection pieces 14.

Also, in the embodiment, the lead-out connection end portion 41a is pressed toward the connection piece 14 so that the lead-out connection end portion 41a is electrically connected thereto. However, welding and/or soldering may be employed for electrical connection there between.

In addition, the collar-shaped portion 35 has an outer circumferential shape to match the collar-shaped holding portion 20, and the circumferential edge part of the injector inserting hole 43 of the above-described flexible wiring member 40 is placed between the same and the collar-shaped holding portion 20.

Further, engagement portions 36 that are engageable with the above-described respective projections 22a reformed in four directions of the outer circumferential portion of the collar-shaped portion 35. The respective engagement portions 36 are roughly inverted U-shaped members, and are formed so as to be resiliently deformable outwardly. After the respective projections 22 are engaged with the tip end portion 36a of the engagement portions 36 once the respective engagement portions 36 are resiliently deformed outwardly, the engagement portions 36 are resiliently returned, whereby the engagement portions 36 are engaged with the projections 22, and the collar-shaped portion 35 and the respective injector fixing members 30 are held and fixed so that they overlap each other with the flexible wiring member 40 held therebetween.

In addition, an appointed pair of engagement portions 36 of the respective engagement portions 36 are engaged with the corresponding projections 22 through the outside at both sides of the flexible wiring member 40, and the other pair of engagement portions 36 are formed so as to be engageable with the corresponding projections 22 through the inside of the inserting hole 44 (See FIG. 5) formed at a position avoiding the above-described wiring conductor 41 of the flexible wiring member 40.

Also, in the present embodiment, a waterproof ring member O2 such as a rubber is disposed so as to surround the injector member 10 on the inner surface of the bottom in the accommodation hole portion 32, wherein the waterproof ring member O2 is compressed and caused to intervene between the inner circumferential surface of the corresponding accommodation hole portion 32 and the outer circumferential surface of the injector member 10, whereby it is possible to prevent water from invading through the surface of the injector member 10.

Also, the annular recess 35a is formed on the upper surface of the collar-shaped portion 35, and simultaneously a waterproof ring member O3 such as a rubber is disposed in the annular recess 35g. The waterproof ring member O3 is compressed and caused to intervene between the flexible wiring member 40 and the collar-shaped portion 35, whereby it is possible to prevent water from invading therebetween.

A description is given of an assembling example of an injector integrated module constructed as described above.

First, after the waterproof ring members O2 and O3 are mounted in the respective injector accommodation portions 31, an appointed pair of engagement portions 36 are caused to pass through the inserting hole 44, and the other pair of engagement portions 36 are disposed at the outside at both sides of the flexible wiring member 40, wherein the flexible wiring member 40 is disposed on the injector fixing member 30. At this time, the lead-out connection end portions 41a that are taken out outwardly at the injector inserting hole 43 are disposed so as to extend along the surface of the fold-over end portion 34a of the resilient pressing piece 34.

In this state, the respective injector members 10 in which the waterproof ring member O1 is mounted are inserted from the fuel injection holes 12 into the respective injector inserting holes 43, whereby the respective lead-out connection end portions 41a are disposed in a state where they are held between the resilient pressing piece 34 and the respective connection piece 14, and the lead-out connection end portions 41a are pressed so as to be brought into electrical contact with the respective connection pieces 14 by the resilient pressing piece 34. And, where the respective engagement portions 36 are engaged with the respective projections 22 and the injector fixing member 30 is fixed at the collar-shaped holding portion 20, the circumferential edge part of the respective injector inserting hole 40 of the flexible wiring member 40 is held and fixed between the collar-shaped holding portion 20 at the injector member 10 side and the collar-shaped portion 35 at the respective injector fixing members 30 side.

If these operations are carried out for all the injector members 10, the injector integrated module is assembled.

In addition, in an adequate process of carrying out the above-described assembly, the end portion of the fuel intake port 11 side of the respective injector members 10 is inserted into and connected to the respective attaching portions 52 of the delivery pipe 50 and is integrated with the corresponding delivery pipe 50.

And, thus, after the injection integrated module is assembled, the respective injector members 10 are installed at the E side of the engine body E side, whereby the injector integrated module is attached to the engine body E.

The injector integrated module constructed as described above is provided with a flexible wiring member 40 in which a wiring conductor 41 to make electrical connections between the engine control unit 1 and the respective injector members 10 is placed between a pair of insulation films 42; and a plurality of injector members 10 internally having a fuel opening and shutting mechanism 19 incorporated, which is driven to open and shut on the basis of a fuel injection control signal from the engine control unit 1 and adjusts injection timing of fuel from a fuel injection hole 12. Since the respective wiring conductors 41 is electrically connected to the fuel opening and shutting mechanism 19 in the respective injector members 10 at respective positions on the flexible wiring member 40 having spacing that permits the respective injector members 10 to be installed at the engine body E side, that is, if the construction is described in compliance with the mode of the embodiment, the collar-shaped holding portion 20 is formed so as to protrude along the circumferential direction of the respective injector members 10 at the circumferential portion thereof, and simultaneously, a plurality of injector fixing members 30 that can be externally fitted from one end side thereof are provided at the respective injector members 10, wherein the respective injector members 10 are externally fitted to the respective collar-shaped holding portion 20 and the respective injector members 10 in a state where the respective injector members 10 are, respectively, inserted to a plurality of injector inserting holes 43 formed on the flexible wiring member 40, and the circumferential edge part of the respective injector inserting holes 43 of the flexible wiring member 40 are held and fixed between the same and the respective injector fixing members 30 that are fixed on the collar-shaped holding portion 20. Connection pieces 14 that are electrically connected to the fuel opening and shutting mechanism 19 are exposed to and formed at one side portion of the outer circumferential portion of the respective injector members 10 while the connection end portions of the wiring conductor 41 to the respective injector members 10 are taken outwardly at the circumferential edge parts of the respective injector inserting holes 43 and are, respectively, formed at the lead-out connection end portions 41a. Since the lead-out connection end portions 41a are pressed, by the resilient pressing piece 34 secured at the respective injector fixing members 30, so that the same can be brought into electrical contact with the respective connection pieces 14, there is no need for harness end portions led out from the engine control unit to be connected, one by one, to the respective injector members 10 installed at the engine body as in the prior arts. And it is possible for the injector members 10 and wiring materials therefor to be easily assembled in the engine body.

Further, since the flexible wiring member 40 is employed as a wiring material to the respective injector members, the total weight can be decreased in comparison with the construction using harnesses consisting of electric lines as wiring materials to the respective injector members 10.

Also, since the circumferential edge parts of the respective injector inserting holes 43 of the flexible wiring member 40 are held and fixed between the respective collar-shaped holding portion 20 and the respective injector fixing members 30 and the lead-out connection end portion 41a are pressed to the connection pieces 14 between the respective collar-shaped holding portion 20 and the respective injector fixing members 30 so that the lead-out connection end portions 41a are brought into electrical contact with the connection pieces 14, it is readily possible to prevent any positional slip between the flexible wiring member 40 and the respective injector members 10 from occurring, and it is possible to reliably hold the electrical connection state between the lead-out connection end portions 41a and the connection pieces 14.

Further, in the present embodiment, resilient pressing pieces 34 that press the respective lead-out connection end members 41a to the respective connection pieces 14 are formed at the respective injector fixing members 30 between the respective collar-shaped holding portions 20 and the respective injector fixing members 30, and the lead-out connection end portions 41a are pressed to the connection pieces 14 by the resilient pressing pieces 34 at the respective injector members 10 so that the lead-out connection end portions 41a are brought into electrical contact with the connection pieces 14. Therefore, it is readily possible to electrically connect the lead-out connection end portions 41a and the connection pieces together in comparison with cases of welding and/or soldering.

Further, since such a construction is employed, in which the end portion of the injector member 10 at the fuel intake port 11 side is inserted into and connected to the attaching portion 52, it is possible to absorb a slip between the delivery pipe 50 and the attaching portion of the injector member 10 at the cylinder head side of the engine body E, which results from a slip due to production tolerances and thermal expansion.

Also, if such a construction is employed, in which, prior to incorporating the respective injector members 10 in the engine body E, the respective injector members 10 are integrated with the delivery pipe 50 in a state where the injector members 10 are connected to and held at the engine body E side in an installable state, it is possible to simultaneously and easily install the respective injector members 10 in the engine body E.

Figure 9:
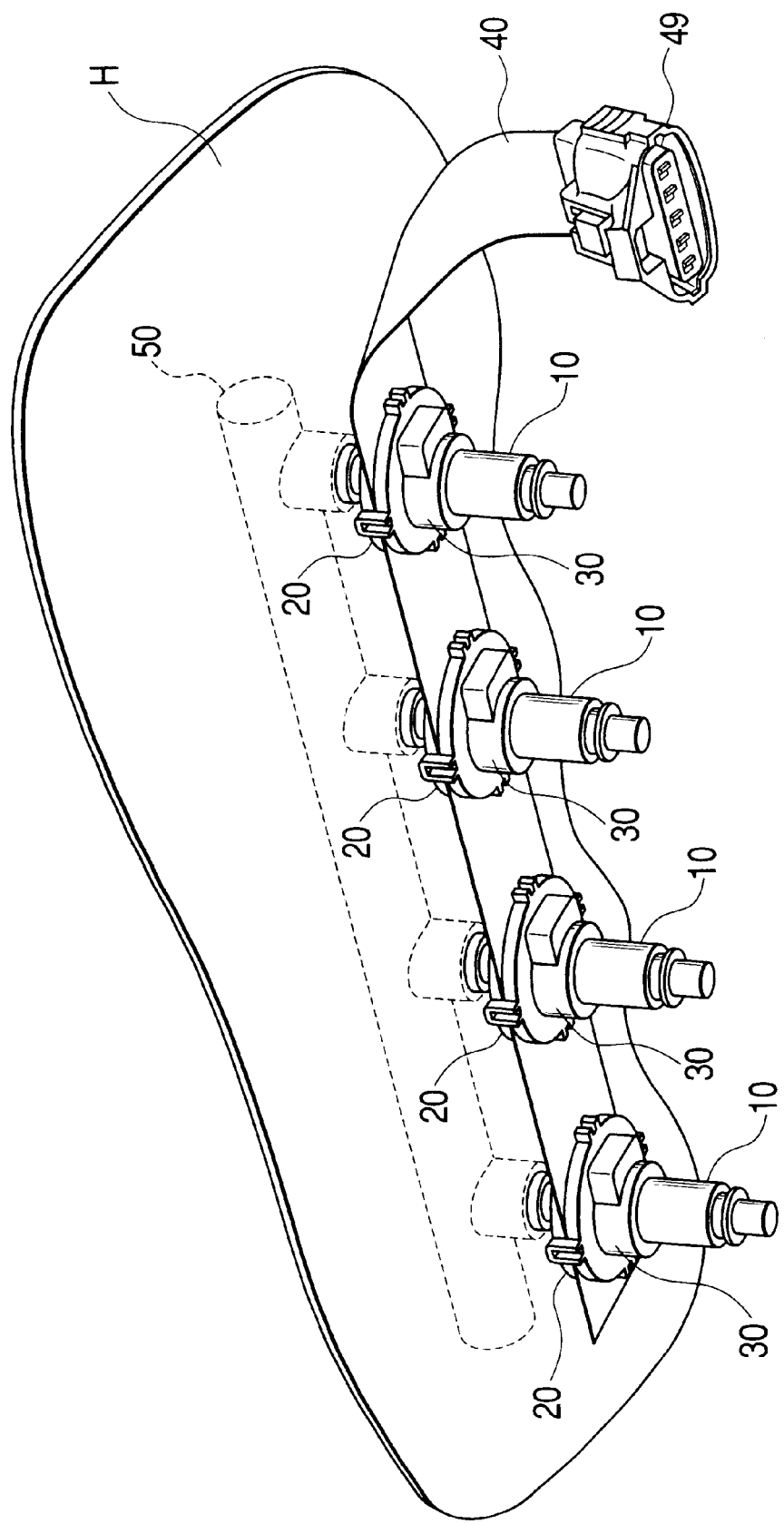
FIG. 9 is a perspective view showing a state where the delivery pipe is integrated with the engine head cover.

In addition, as shown in FIG. 9, if the delivery pipe 50 is integrated with the engine head cover H that surrounds the engine head, the respective injector members 10 can be assembled simultaneously with the mounting of the engine head cover H, wherein the assembly thereof can be made much easier.

Modified Example 1 according to Embodiment 1

Next, a description is given of Modified Example 1 of Embodiment 1 according to the invention with reference to FIG. 10 through FIG. 14.

Component elements that are similar to those in the injector integrated module according to the above-described Embodiment 1 are given the same reference numbers, and description thereof is omitted. A description is given, focusing on the points of difference therebetween.

In the injector integrated module, instead of forming the connection pieces 14 at the outer circumferential surface of the injector members 10 as in Embodiment 1, the connection pieces 114 that are electrically connected to the fuel opening and shutting mechanism 19 are exposed to and formed at the position which can be brought into contact with one surface side of a flexible wiring member 140 (corresponding to the flexible wiring member 40) which is held and fixed between the corresponding respective collar-shaped holding portion 20 and respective injector fixing member 130 (corresponding to the injector fixing members 30) with respect to the respective collar-shaped holding portion 20 of respective injector members 110 (corresponding to the injector members 10) (Refer to FIG. 10, FIG. 12 through FIG. 14).

In detail, the respective connection pieces 114 are formed of a thin band-shaped conductive piece such as metal, wherein the respective one end portions thereof are buried in the injector member 10 and electrically connected to the internal fuel opening and shutting mechanism 19, and the respective other side ends thereof are disposed so as to extend in parallel outwardly from the outer circumferential surface of the injector members 110 along the underside surface of the collar-shaped holding member 20, wherein the respective connection pieces 114 are exposed to the underside surface of the collar-shaped holding portion 20 and formed thereon.

Figure 10:
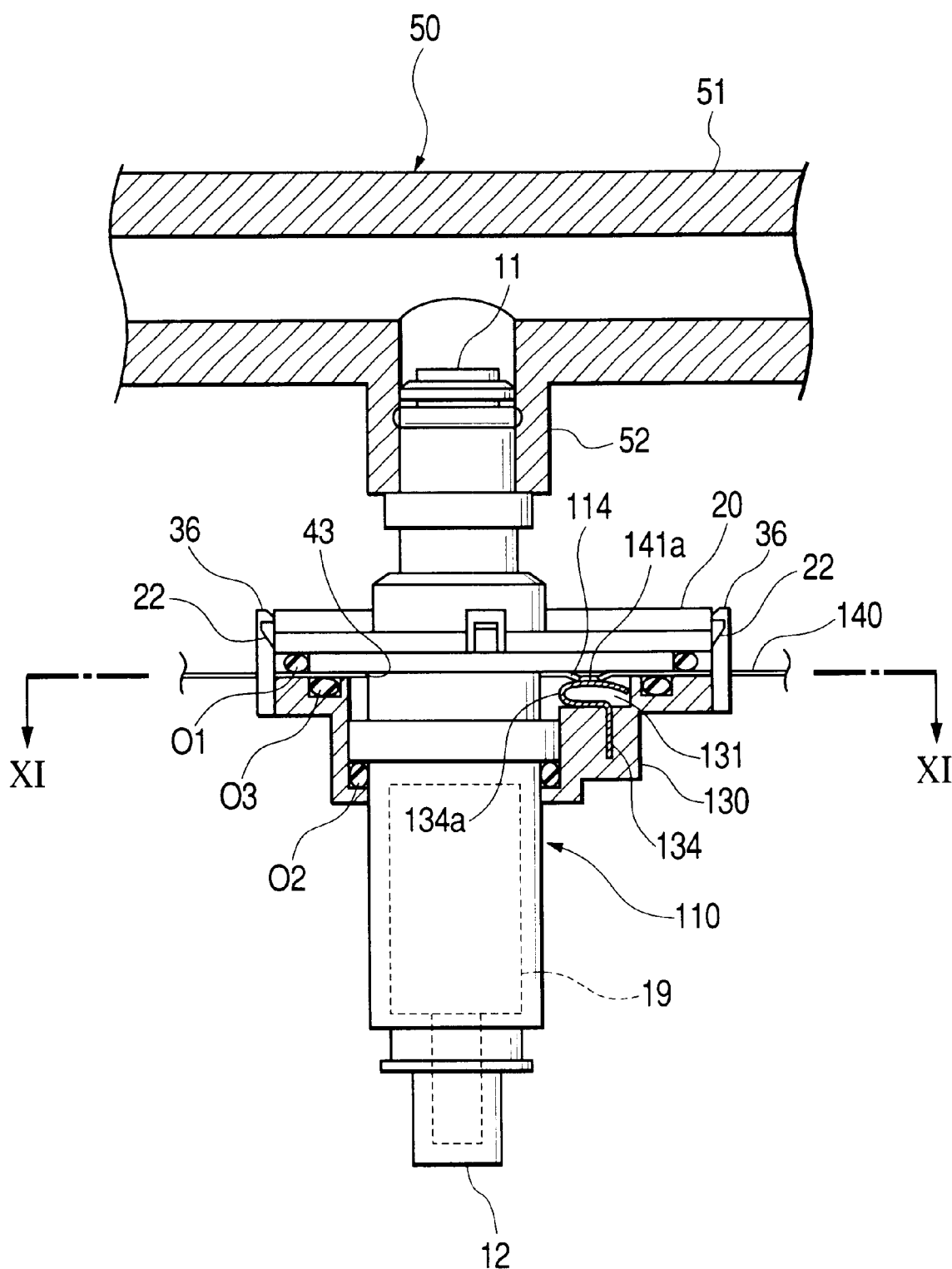
FIG. 10 is a partially broken front elevational view showing the injector integrated module of Modified Example 1 according to Embodiment 1.
Figure 11:
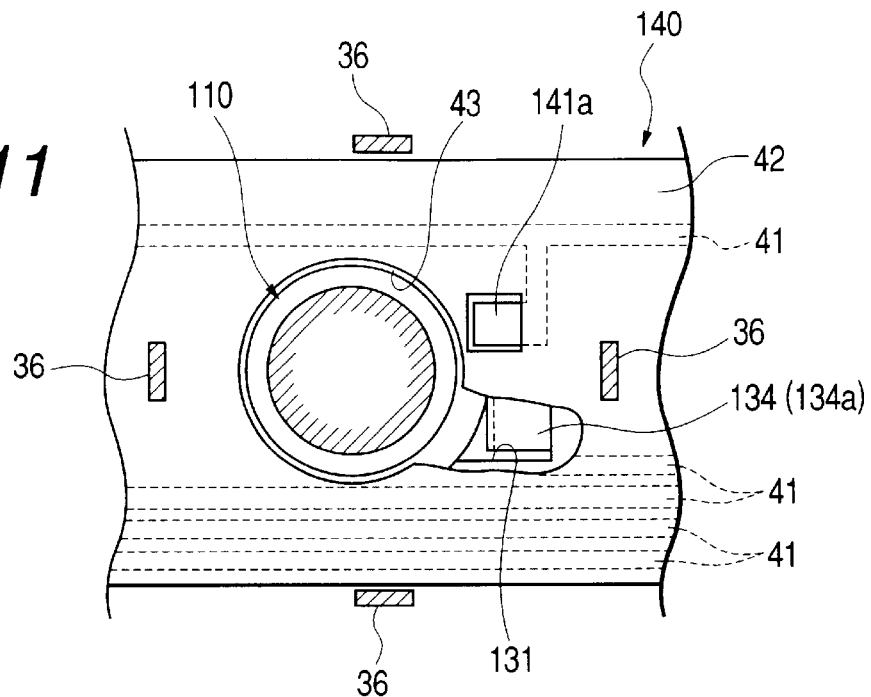
FIG. 11 is a sectional view taken along the line XI—XI in FIG. 10.
Figure 12:
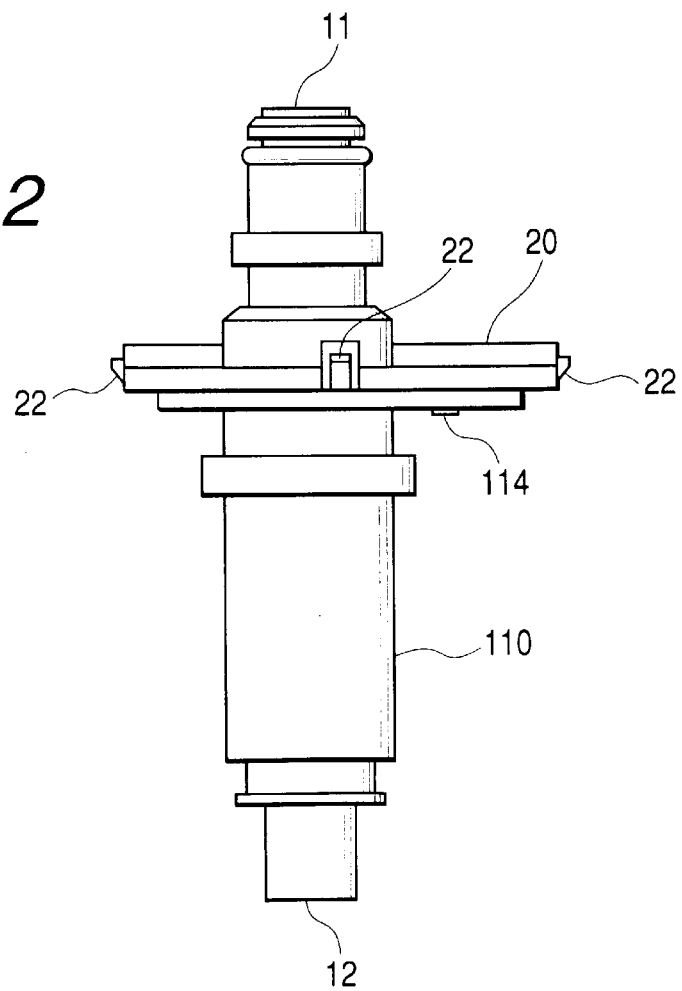
FIG. 12 is a front elevational view showing an injector member.
Figure 13:
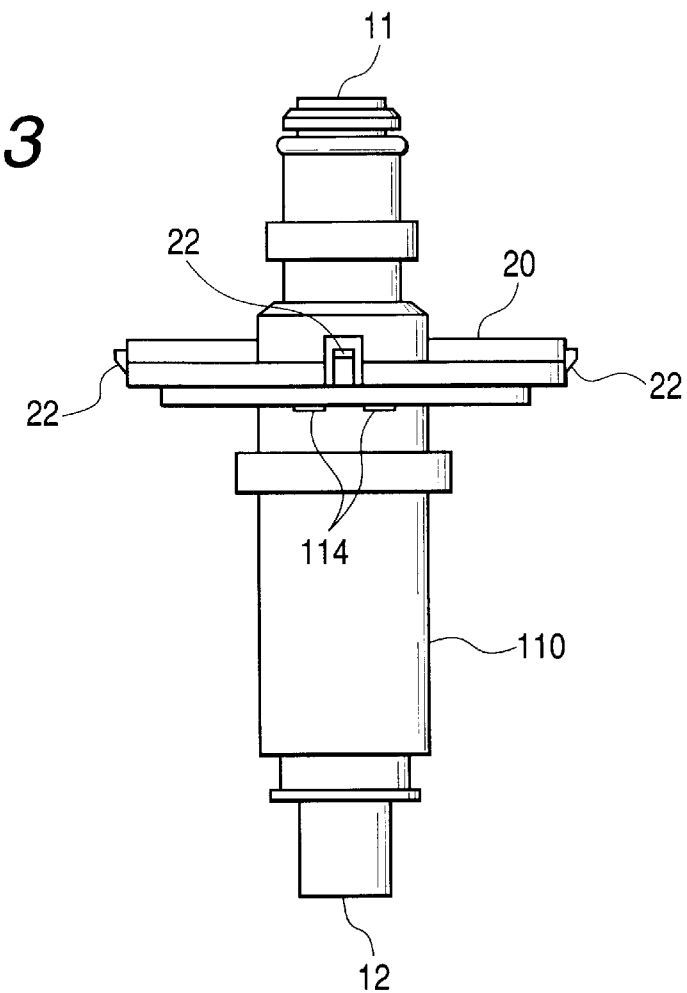
FIG. 13 is a side elevational view showing the injector member.
Figure 14:
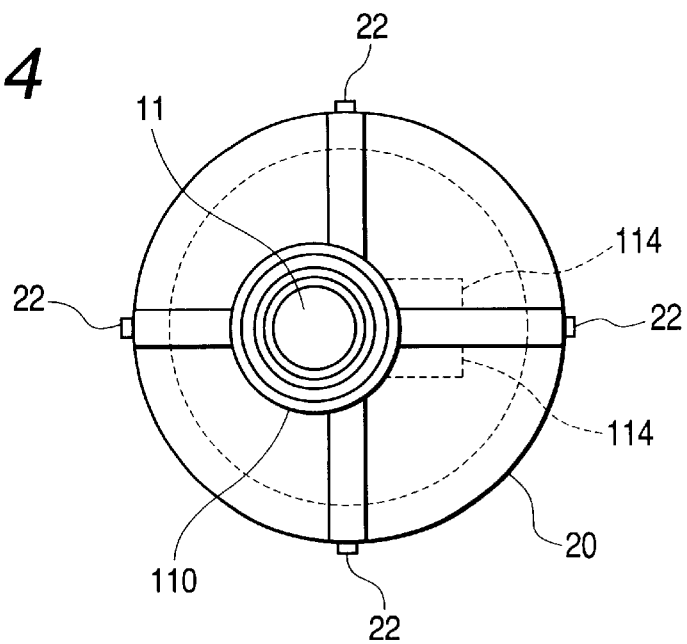
FIG. 14 is a plan view showing the injector member.
Figure 15:
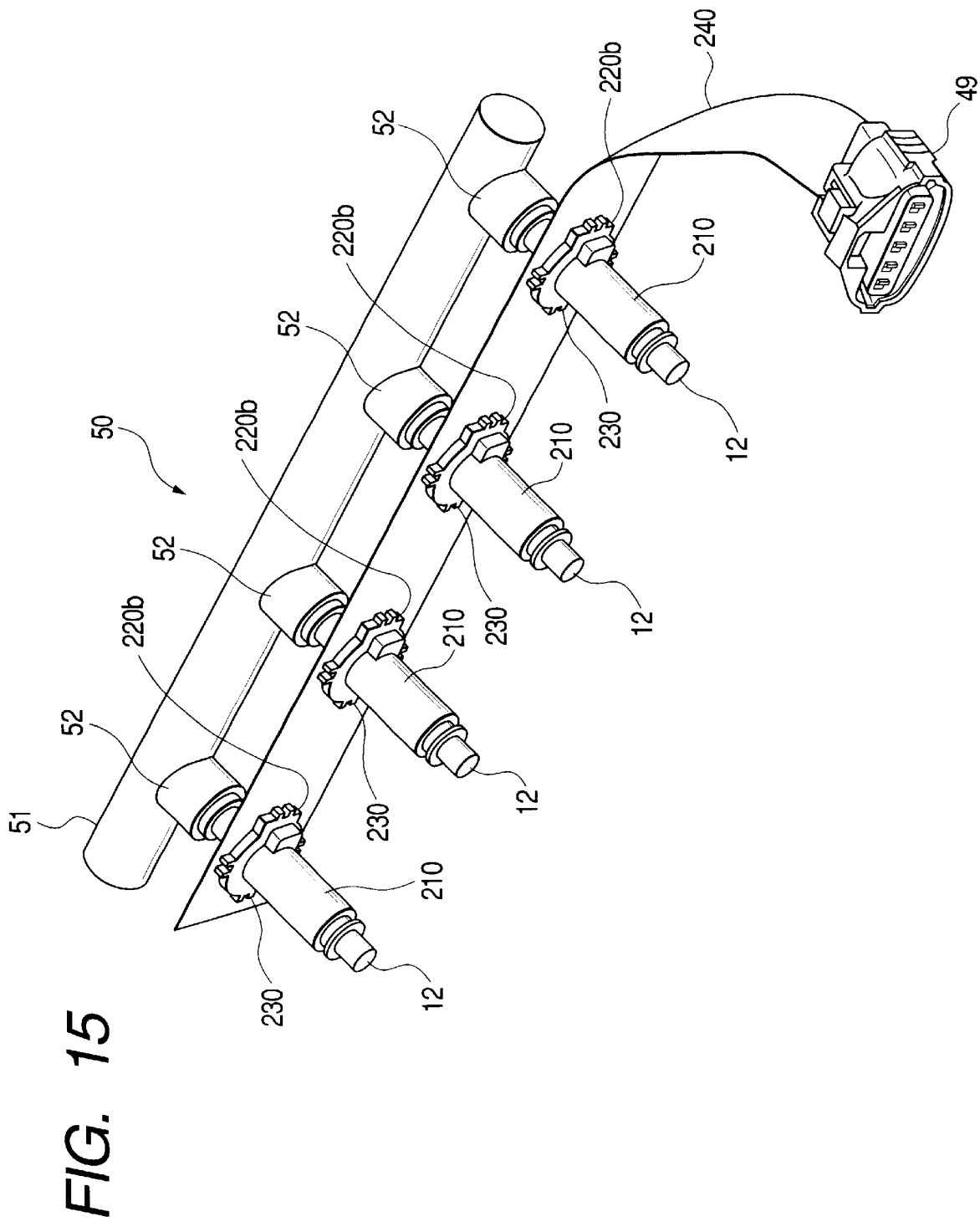
FIG. 15 is a perspective view showing an injector integrated module according to Modified Example 2 according to Embodiment 1.
Figure 16:
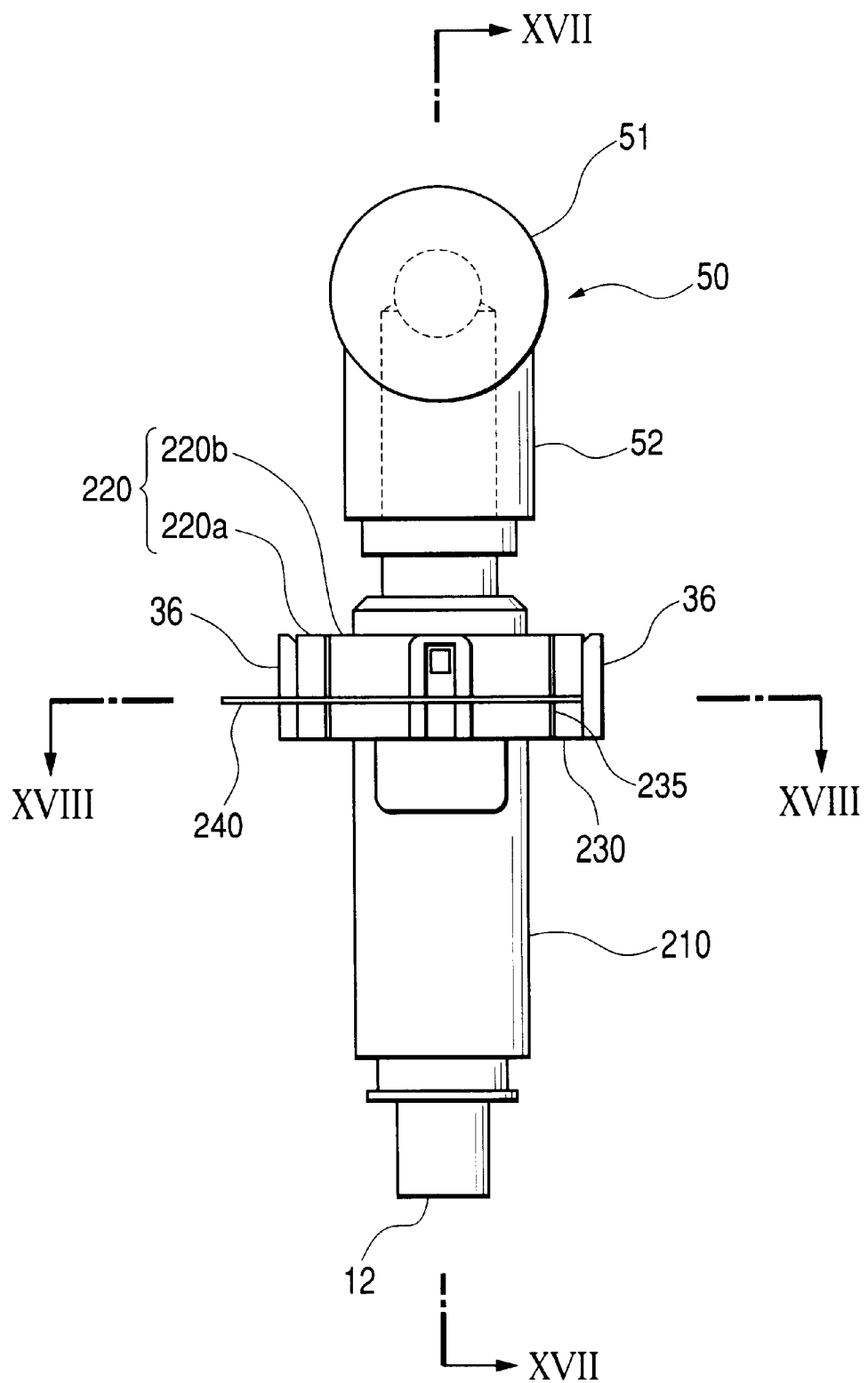
FIG. 16 is a side elevational view showing the same injector integrated module.
Figure 17:
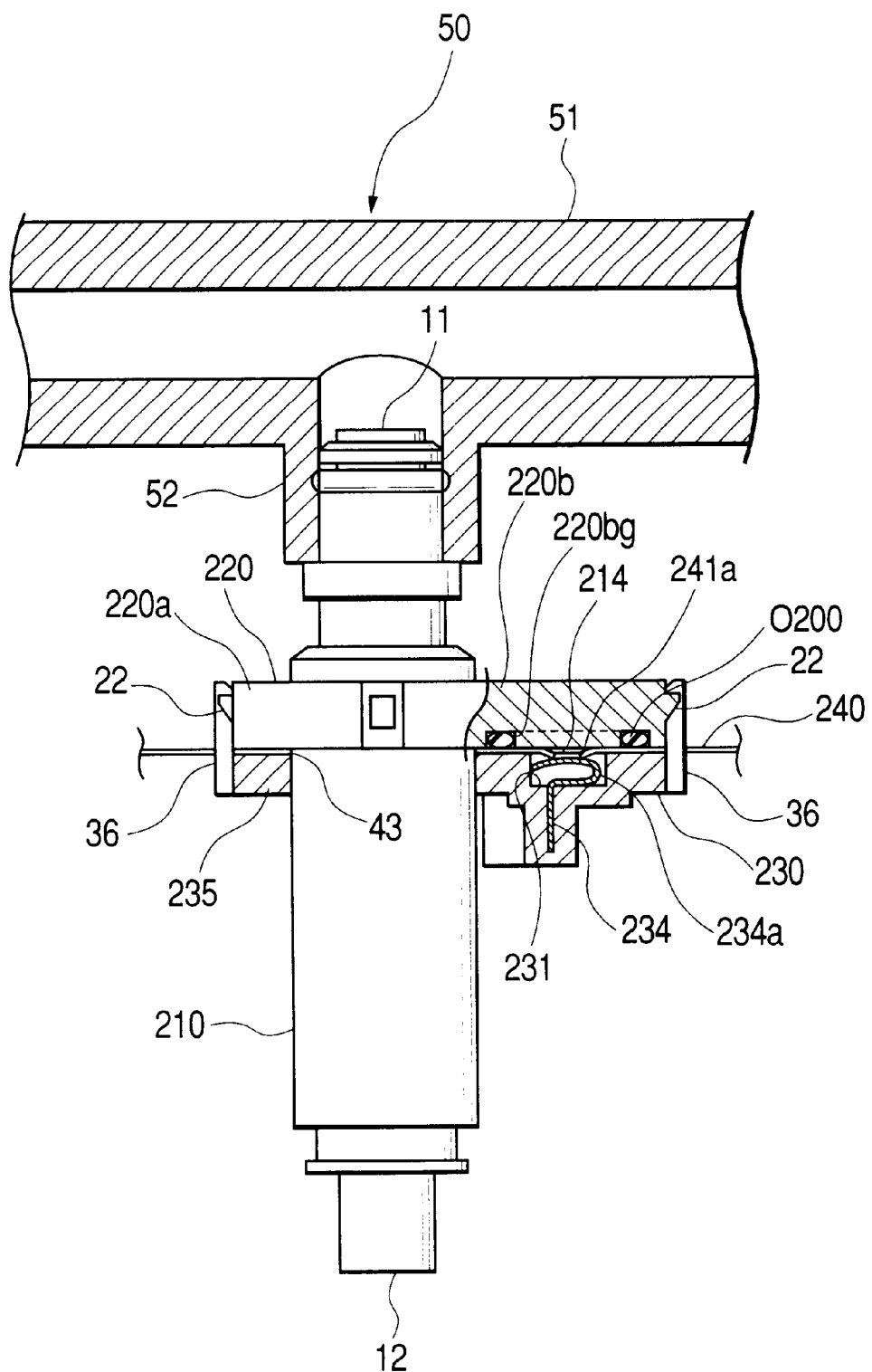
FIG. 17 is a partially broken front elevational view taken along the line XVII—XVII in FIG. 16.
Figure 18:
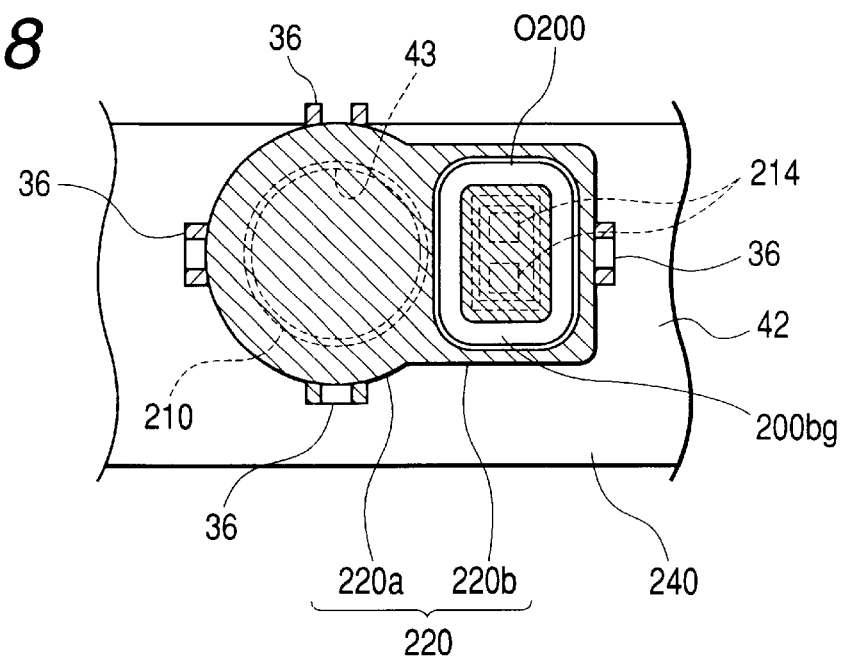
FIG. 18 is a sectional view taken along the line XVIII—XVIII in FIG. 16.
Figure 19:
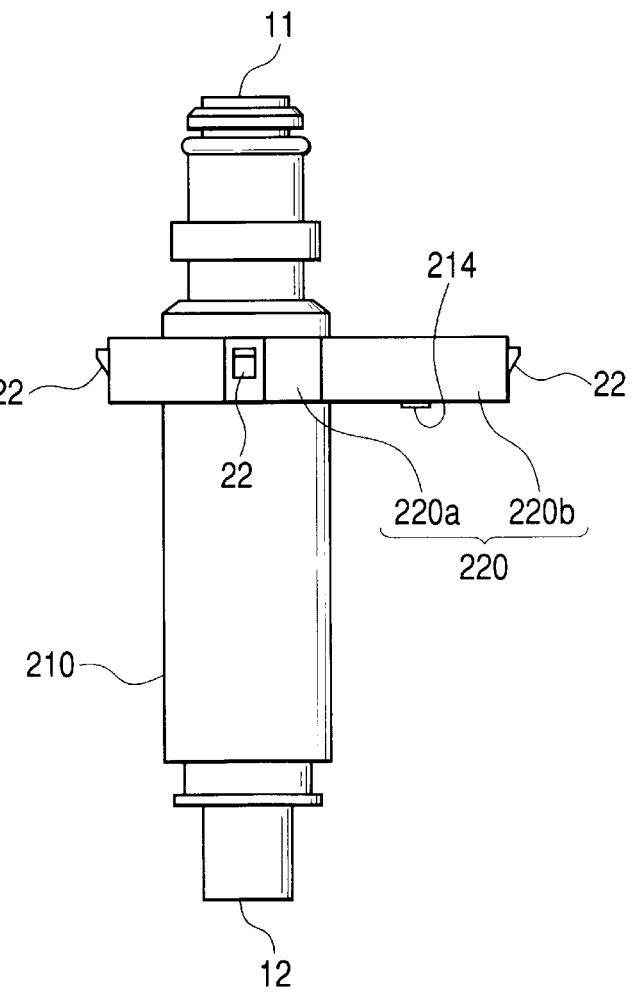
FIG. 19 is a front elevational view showing an injector member.
Figure 20:
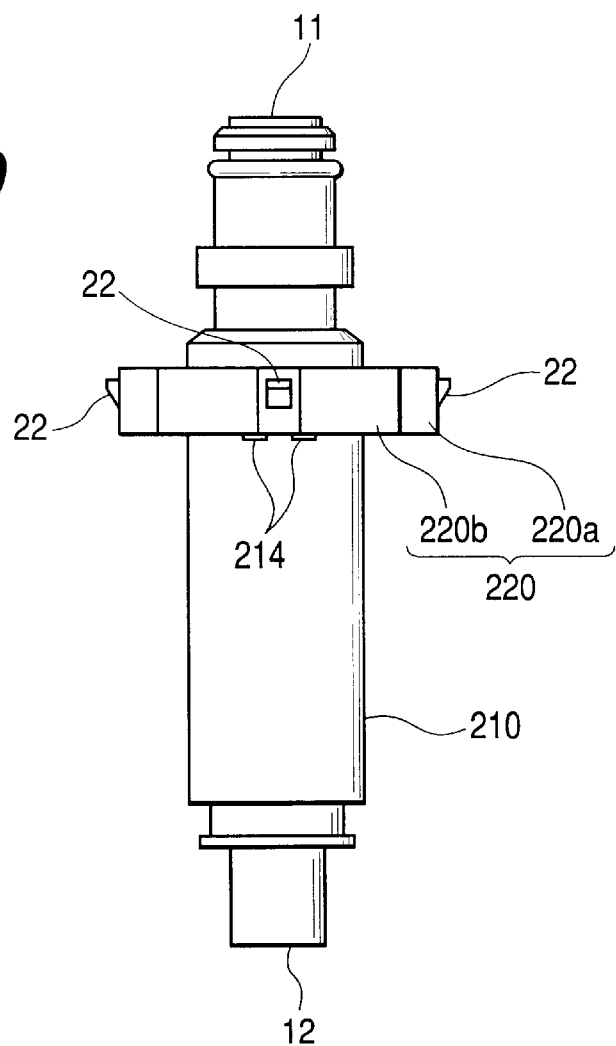
FIG. 20 is a side elevational view showing the injector member.
Figure 21:
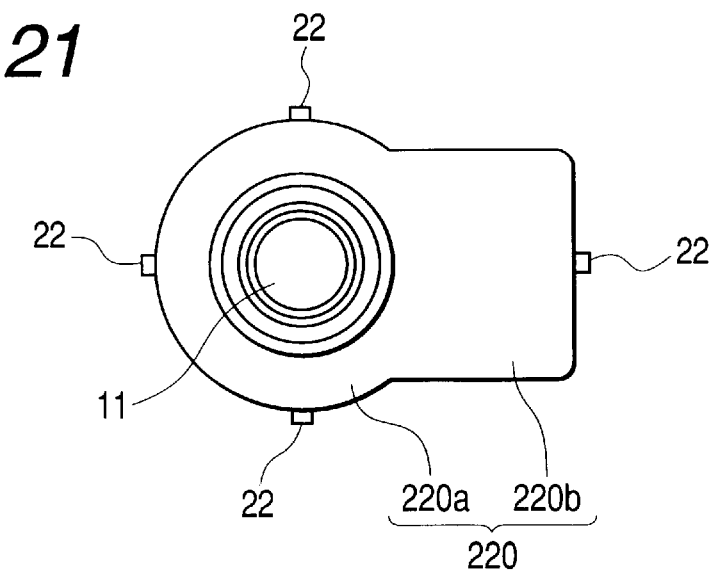
FIG. 21 is a plan view showing the injector member.

Also, in the injector integrated module, instead of taking out the connection end portions of the wiring conductor 41 to the respective injector members 10 outwardly at the circumferential edge parts of the respective injector inserting holes 43 and forming the same as the lead-out connection end portions 41a as in Embodiment 1, the connection end portions of the wiring conductor 41 to the respective injector members 110 are formed so as to be exposed to one side end of the flexible wiring member 140, that is, the position where the same can be brought into contact with the respective connection pieces 114 at the circumferential edge parts of the respective injector holes 43, wherein the same are formed as the exposed connection end portions 141a (Refer to FIG. 10 and FIG. 11).

In detail, the upper surface side insulation film 42 is partially removed at the circumferential edge parts of the respective injector inserting holes 43 of the flexible wiring member 140, and the respective connection end portions of the wiring conductor 41 are exposed to the removed part, whereby the exposed connection end portions 141a are formed.

Further, in the injector integrated module, instead of providing the inside wall portions of the injector accommodating portions 31 of the respective fixing members 30 with resilient pressing pieces 34 as in the above-described Embodiment 1, resilient pressing pieces 134 press the respective exposed connection end portions 141a from the other surface side of the flexible wiring member 40 toward the corresponding connection pieces 114 (Refer to FIG. 10 and FIG. 11).

In detail, a recess 131 is formed at the upper part of the injector fixing member 130, that is, at the part corresponding to the connection piece 114 at the collar-shaped holding portion 20 side. Since the resilient pressing pieces 134 are formed of resilient members such as metal or resin, one end portion of which is buried in the bottom of the above-described recess 131, and the other end portion of which is formed to a roughly C-shaped and flat pressing portion 134a and is disposed in the above-described recess 131. And, if the exposed connection end portion 141a of the flexible wiring member 140 is held and formed between the pressing portion 134a of the resilient pressing piece 134 and the above-described connection piece 114, the pressing portion 134a of the resilient pressing piece 134 is caused to press the respective exposed connection end portions 141a toward the respective connection pieces 114 along the direction orthogonal to the surface direction of the flexible wiring member 140.

Also, the resilient pressing piece 134 may be made of a single material or may be made of a plurality of materials corresponding to the respective connection pieces 114.

In the injector integrated module thus constructed, where the end portions of the injector members 110 at the fuel injection hole 12 side are inserted into the injector inserting holes 43 in a state where the flexible wiring member 140 is disposed on the injector fixing members 130 so that the respective exposed connection end portions 141a are disposed on the respective resilient pressing pieces 134, the exposed connection end portions 141a are disposed between the connection pieces 114 and the resilient pressing pieces 134. And, where the injector fixing member 130 is fixed on the collar-shaped holding portion 20 of the injector member 110, the exposed connection end portions 141a are pressed from the other surface (underside surface) of the flexible wiring member 140 along the direction orthogonal to (that is, vertical) the surface direction of the flexible wiring member 140, so that the exposed connection end portions 141a are brought into electrical contact with the connection pieces 114.

According to the injector integrated module constructed as described above, the respective connection pieces 114 are formed so as to be exposed at the position where the connection pieces 114 are brought into contact with one surface (upper surface) side of the flexible wiring member 140, which is held and fixed between the respective collar-shaped holding portions 20 and the respective injector fixing members 130, of the collar-shaped holding portions 20, and the respective exposed connection end portions 141a are formed so as to be exposed at the position where the exposed connection end portions 141a are brought into contact with the respective connection pieces 114 at one surface (upper surface) side of the flexible wiring member 140 while resilient pressing pieces 134 that press the respective exposed connection end portions 141a from the other surface (lower surface) side of the flexible wiring member 140 toward the connection pieces 114 corresponding thereto are formed on the respective injector fixing members 130. Since the exposed connection end portions 141a are pressed, by the resilient pressing pieces 134, from the other surface (lower surface) side of the flexible wiring member 140 along the direction orthogonal to the surface direction of the flexible wiring member 140 in a state where the exposed connection end portions 141a are brought into electrical contact with the connection pieces 114, the injector fixing members 130 are fixed on the collar-shaped holding portion 20 of the injector members 110 in a state where the flexible wiring member 140 is disposed on the injector fixing members 130 so that the respective exposed connection end portions 141 are disposed on the respective resilient pressing pieces 134, and the flexible wiring member 140 is held and fixed between the injector fixing member 130 and the collar-shaped holding member 20. Therefore, since the exposed connection end portions 141a are electrically connected to the connection pieces 114, it is possible to easily connect the exposed connection end portions 141a and the connection pieces 114 together electrically when assembling the injector integrated module.

Also, since, by the resilient pressing pieces 134, the exposed connection end portions 141a are pressed from the other surface (lower surface) side of the flexible wiring member 140 along the (vertical) direction orthogonal to the surface direction of the flexible wiring member 140 so that the exposed connection end portions 141a are brought into electrical contact with the connection pieces 114. Since electrical contact between the exposed connection end portions 141 and the connection pieces 114 can be maintained even if the respective injector members 110 slip more or less along the surface direction of the flexible wiring member 140, electrical connection between both can be reliably secured.

Also, it is preferable that the exposed connection end portions 141a of the wiring conductor 41 are formed to be wider than at the other portions to secure a wide area, so that a further large positional slip of the respective injector members 10 can be easily handled.

Modified Example 2 of Embodiment 1

Next, with reference to FIG. 15 through FIG. 21, a description is given of second modified example of Embodiment 1 of the invention.

Also, component elements that are similar to those of the injector integrated module according to the above-described Embodiment 1 are given the same reference numbers, and the overlapping description thereof is omitted. The description is given, focusing on the points of difference therebetween.

Instead of such a construction in which, as in Embodiment 1, a waterproof ring member O2 such as a rubber is disposed on the inner surface of the bottom portion in the accommodation hole portion 32 of the injector fixing members 30 so as to surround the injector members 10, a waterproof ring member O1 is compressed to intervene between the flexible wiring members 40 and the collar-shaped holding portion 20 along the outer circumferential edge part of the lower side of the collar-shaped holding portion 20, and a waterproof ring member O3 is compressed to intervene between the flexible wiring member 40 and the collar-shaped portion 35 along the outer circumferential edge part of the upper side of the collar-shaped portion 35 of the injector fixing member 30, a construction may be employed for the injector integrated module, in which an annular resilient member O200 is disposed at the position, avoiding the injector members 210 (corresponding to the injector members 10), so as not internally include the injector members 210, between the collar-shaped holding portion 220 (corresponding to the collar-shaped holding portion 20) and the injector fixing member 230 (corresponding to the injector fixing member 30). (Refer to FIG. 17 and FIG. 18).

In detail, in the injector integrated module, the waterproof ring members O1, O2 and O3 in the above-described Embodiment 1 are removed, and the collar-shaped holding portion 220 is constructed so that a wide connection portion 220b, which is rectangular in its plan view, is formed at one side portion of small diameter sections 220a formed along the circumferential direction at the intermediate portion in the lengthwise direction of the injector member 210. Also, the collar-shaped portion 235 (corresponding to the collar-shaped portion 35) at the injector fixing member 230 side has a shape corresponding to the collar-shaped holding portion 220.

Also, an annular (in this modified example, to be annular with a rectangular section whose corners are round) accommodating groove 220bg is formed at the surface (lower surface) of the wide connection portion 220b at the collar-shaped holding portion 220 side, and an annular resilient member O200 formed of a rubber, etc., is disposed and accommodated in the accommodating groove 220bg.

Also, in the injector integrated module, instead of the connection construction between the connection pieces 14 and the lead-out connection end portions 41a in the above-described Embodiment 1, the exposed connection end portion 241a is electrically connected to the connection piece 214 at the position surrounded by the annular resilient member O200 between the collar-shaped holding portion 220 and the injector fixing member 230.

In detail, the respective connection pieces 214 are formed of thin band-shaped conductive pieces such as metal, and the respective one end portions are buried in the injector members 210 and are electrically connected to the fuel opening and shutting mechanism therein. And, the other end portions thereof are exposed, via the small diameter collar-shaped portion 220a of the collar-shaped holding portion 220, to the annular resilient member O200 on the surface at the injector fixing member 230 side of the wide connection portion 220b. (Refer to FIG. 17 through FIG. 20).

In addition, the upper surface side insulation film 42 is partially removed at the circumferential edge parts of the respective injector inserting holes 43 of the flexible wiring member 240, and the respective connection end portions of the wiring conductor 41 are exposed to the removed part thereof, whereby exposed connection end portions 241a are formed. (Refer to FIG. 17)

In addition, a recess 231 is formed at a part corresponding to an area in the annular resilient member O200 at the collar-shaped holding portion 220 side on the upper part of the injector fixing member 230. A resilient pressing piece 234 is formed of a resilient material such as metal or resin, one end portion of which is buried in the bottom of the above-described recess 231, and the other end portion of which is formed on a flat and roughly C-shaped pressing portion 234a. The resilient pressing piece 234 is disposed in the above-described recess 231. And, the part of the exposed connection end portion 241a of the flexible wiring conductor 240 is held and disposed between the pressing portion 234a of the resilient pressing piece 234 and the above-described connection piece 214, wherein the pressing portion 234a of the resilient pressing piece 234 presses the respective exposed connection end portions 241a toward the respective connection pieces 214 along the direction orthogonal to the surface direction of the flexible wiring member 240. (Refer to FIG. 17 and FIG. 18).

Also, the resilient pressing piece 234 maybe made of a single material or may be made of a plurality of materials corresponding to the respective connection pieces 214.

According to the injector integrated module thus constructed, in addition to the effects of the above-described Embodiment 1, since such a construction is employed, in which the annular resilient member O200 is disposed at the position avoiding the injector members 210 so as not to internally include the same between the collar-shaped holding portion 220 and the injector fixing members 230, the exposed connection end portions 241a are electrically connected to the connection pieces 214 at the position surrounded by the annular resilient member O200 between the collar-shaped holding portion 220 and the injector fixing member 230. Therefore, a waterproof measure can be secured at the connection portions between the exposed connection end portions 241a and the connection pieces 214 by the corresponding annular resilient member O200. Accordingly, it is possible to get rid of at least the waterproof ring member O2 that is used in the injector integrated module according to Embodiment 1, wherein the waterproof structure can be simplified, and can be made small in size.

The annular resilient member O200 may be provided so as to surround only the connection portion between the exposed connection end portion 241a and the connection piece 214. Therefore, the corresponding waterproof structure can be made small in size, wherein a small-sized injector integrated module that is excellent in a waterproof feature can be provided.

Also, in Modified Example 2, as in Modified Example 1, since the respective exposed connection end portions 241a are pressed, by the resilient pressing pieces 234, to the respective connection pieces 214 along the direction orthogonal to the surface direction of the flexible wiring member 240, effects that are similar to those in Modified Example 1 can be brought about.

Embodiment 2

Next, a description is given of an injector integrated module according to Embodiment 2 of the invention.

Figure 22:
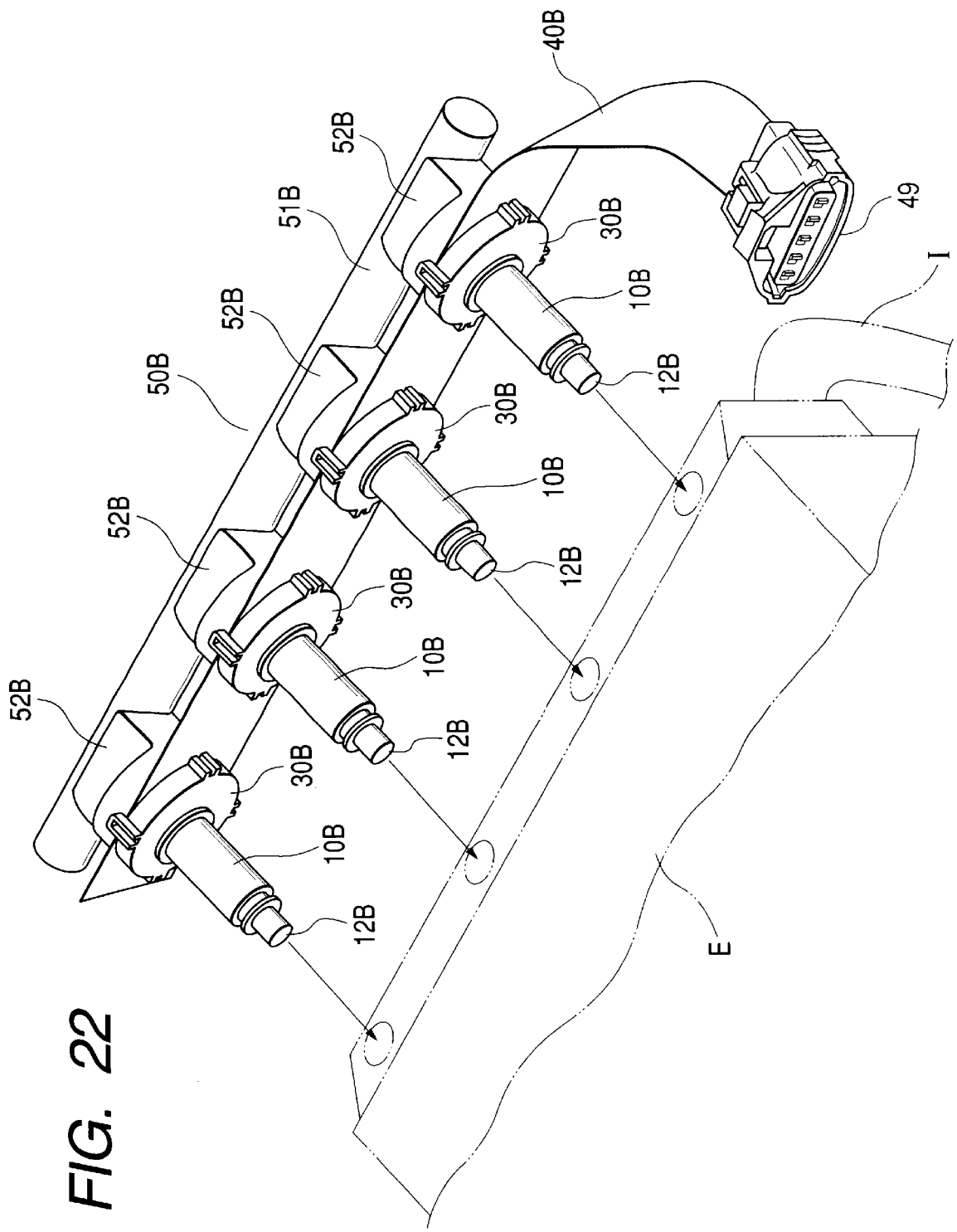
FIG. 22 is a perspective view showing an injector integrated module according to Embodiment 2 of the invention.
Figure 23:
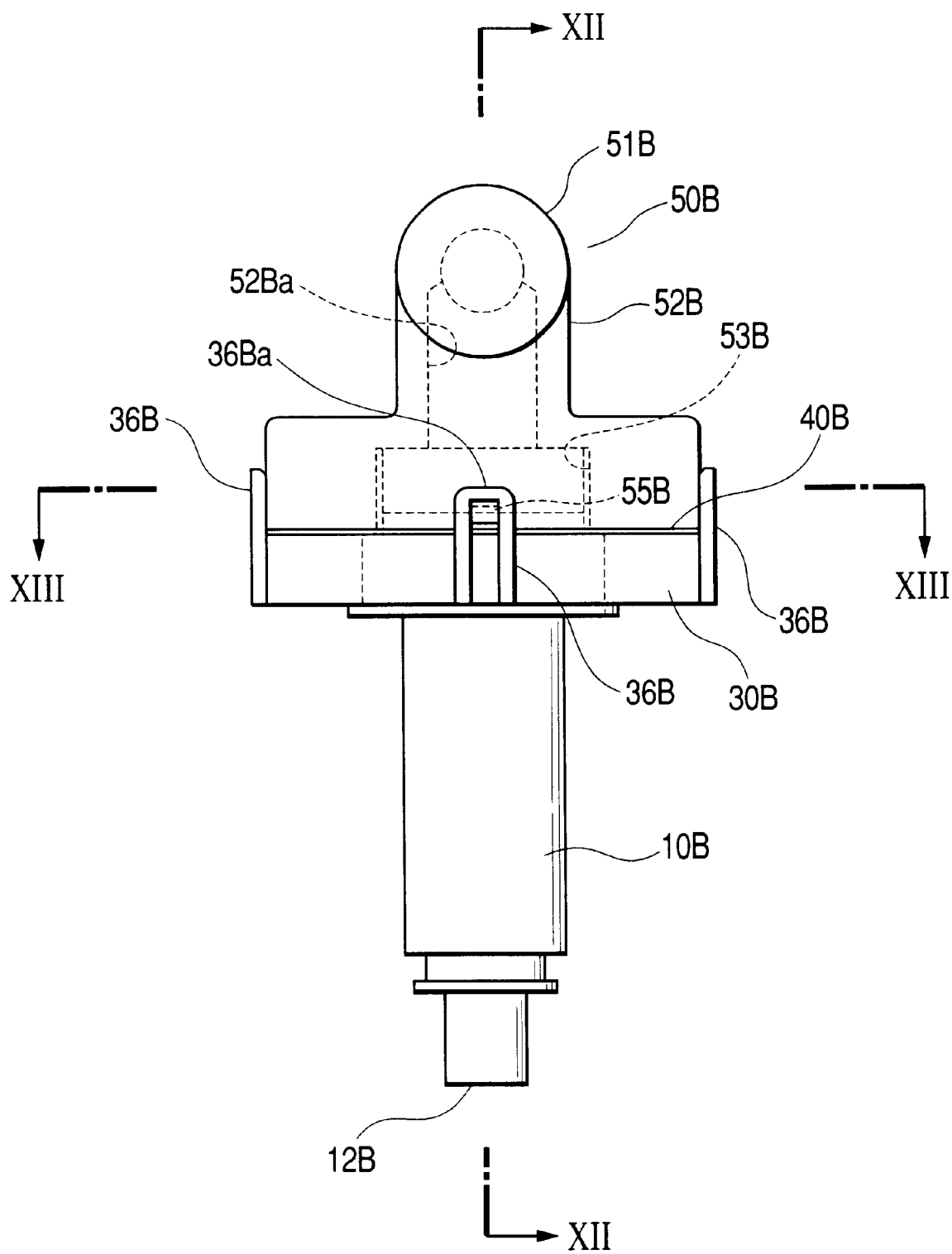
FIG. 23 is a side elevational view showing the same injector integrated module.
Figure 24:
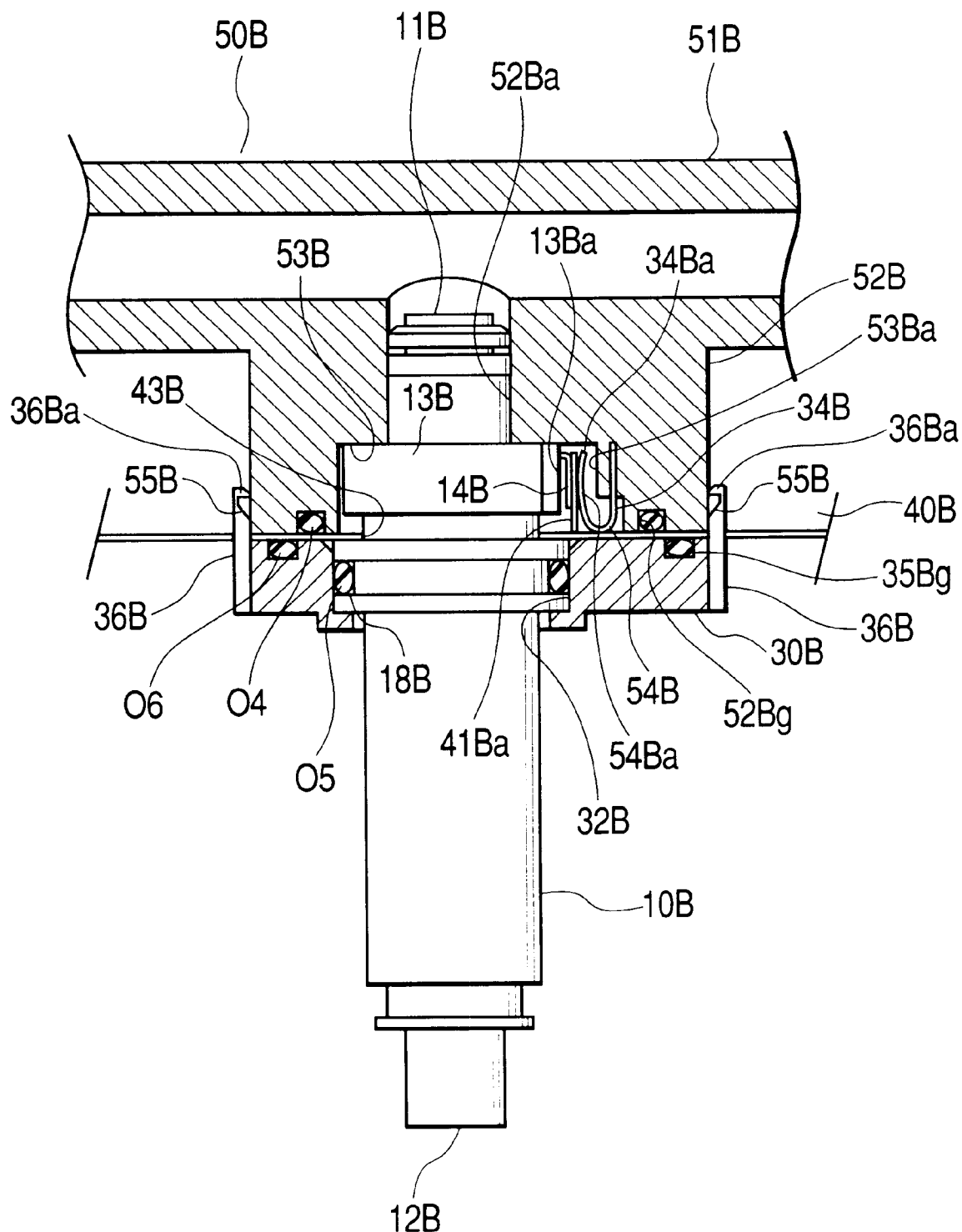
FIG. 24 is a partially broken front elevational view taken along the line XII—XII in FIG. 23.
Figure 25:
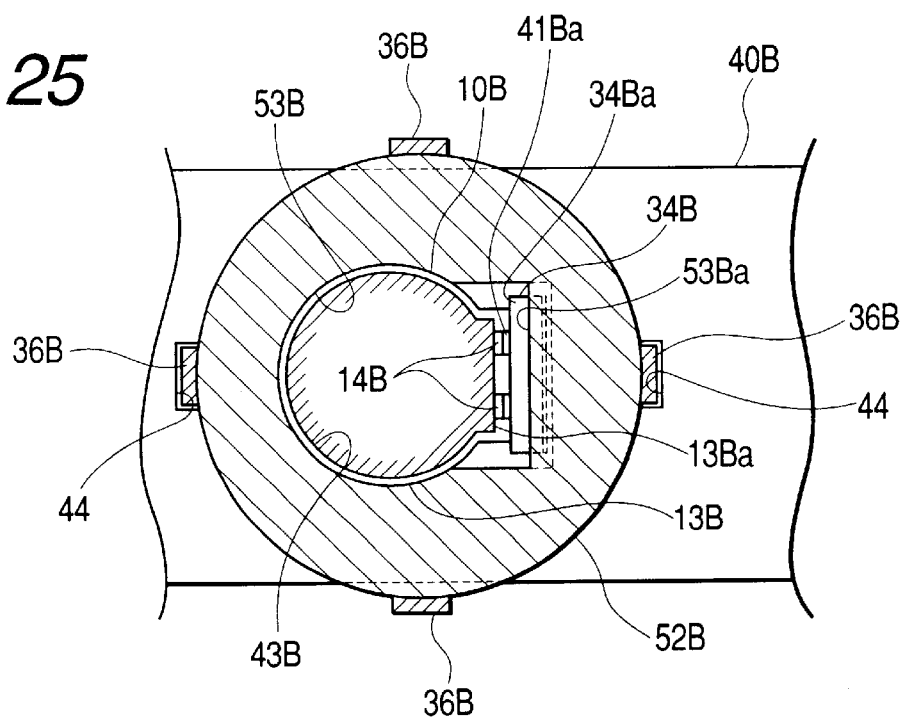
FIG. 25 is a sectional view taken along the line XIII—XIII in FIG. 23.
Figure 26:
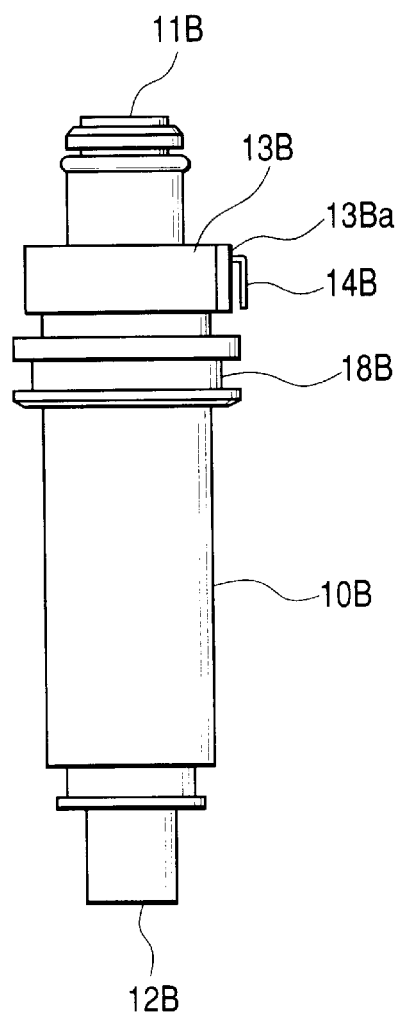
FIG. 26 is a front elevational view showing an injector member.
Figure 27:
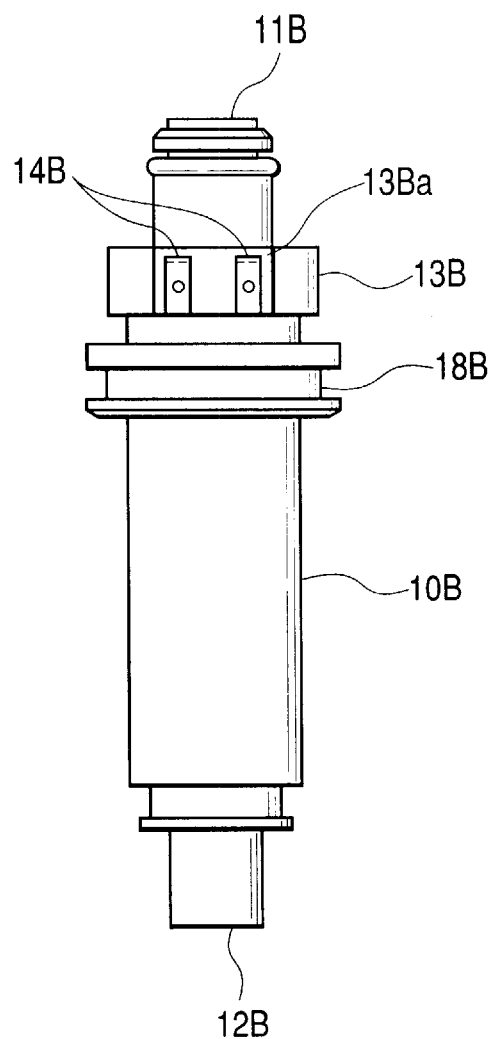
FIG. 27 is a side elevational view showing the injector member.
Figure 28:
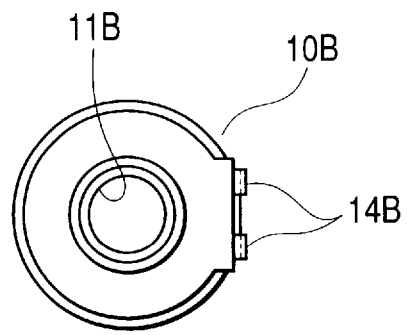
FIG. 28 is a plan view showing the injector member.
Figure 29:
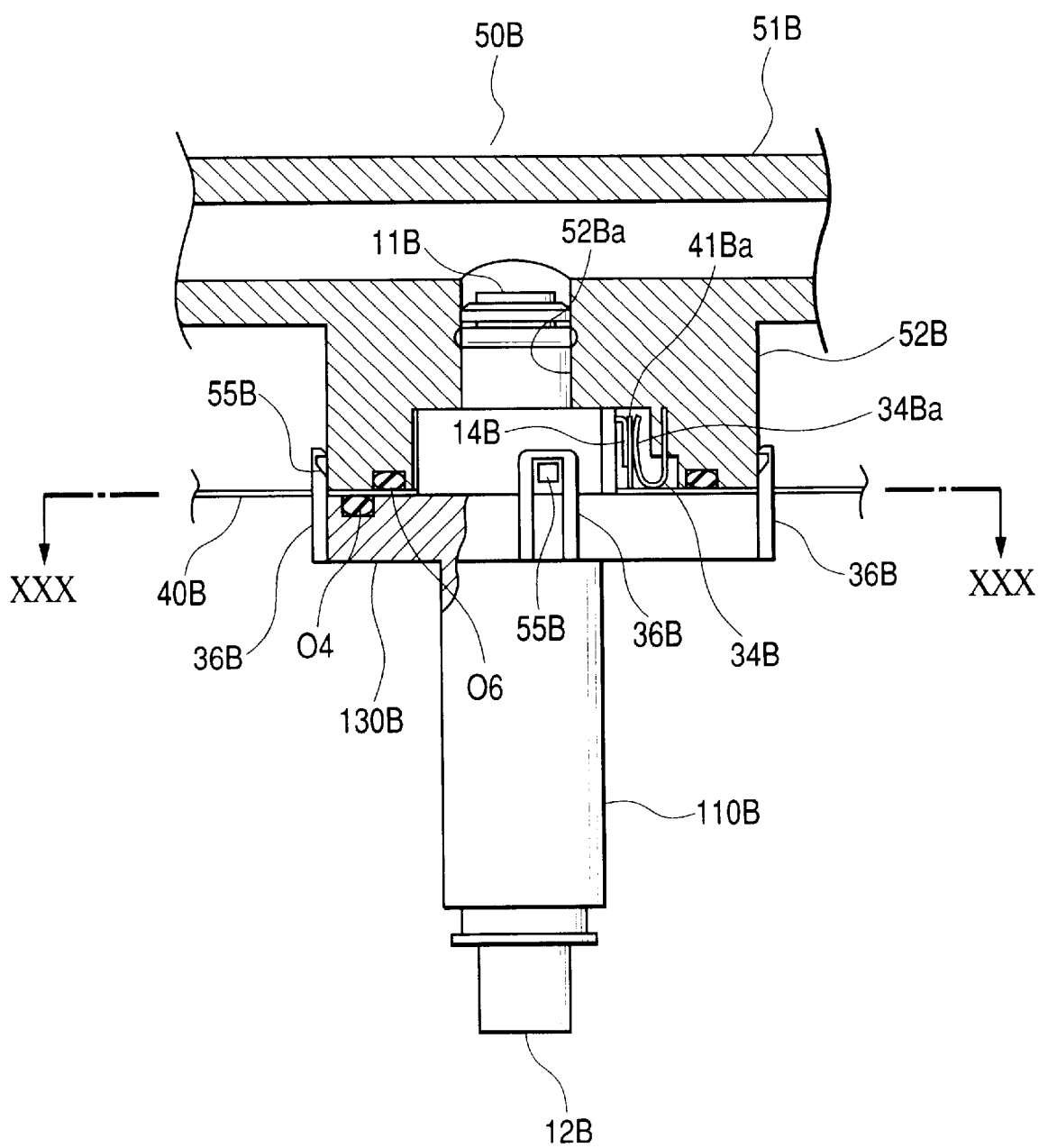
FIG. 29 is a partially broken front elevational view showing the injector integrated module according to Modified Example 1 of Embodiment 2.
Figure 30:
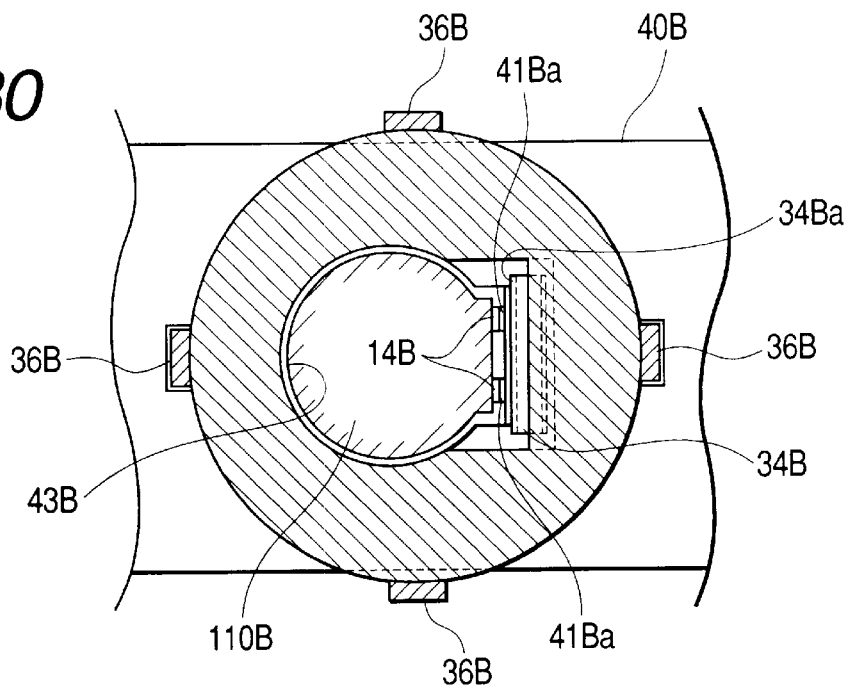
FIG. 30 is a sectional view taken along the line XXX—XXX in FIG. 29.
Figure 31:
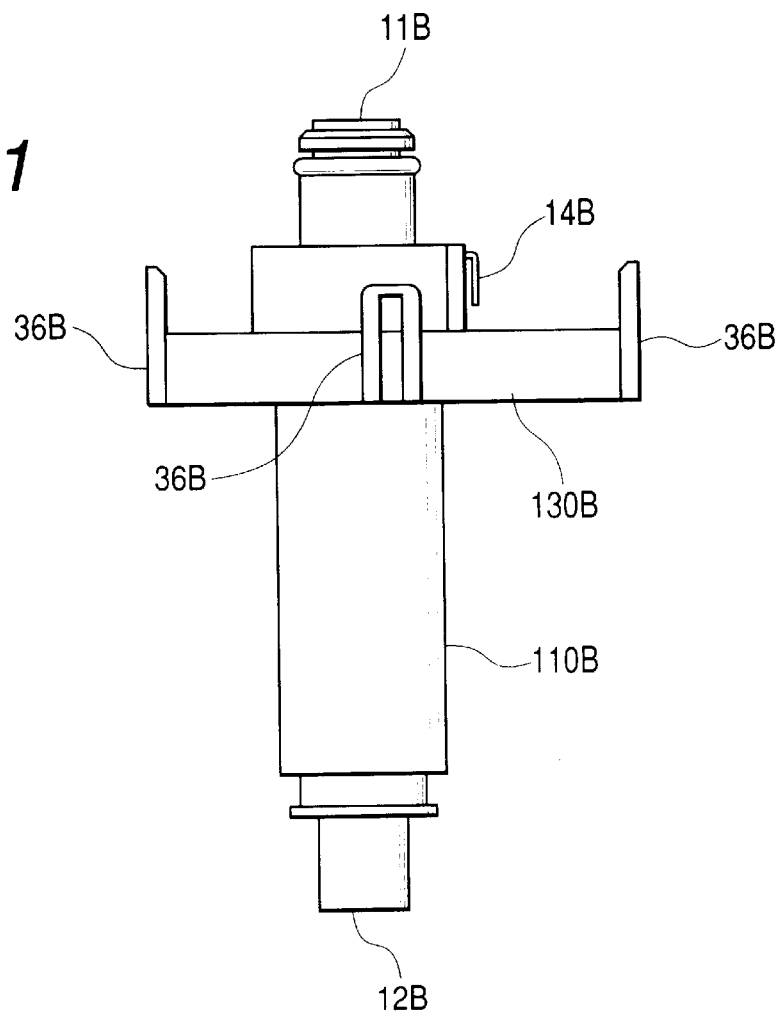
FIG. 31 is a front elevational view showing an injector member.
Figure 32:
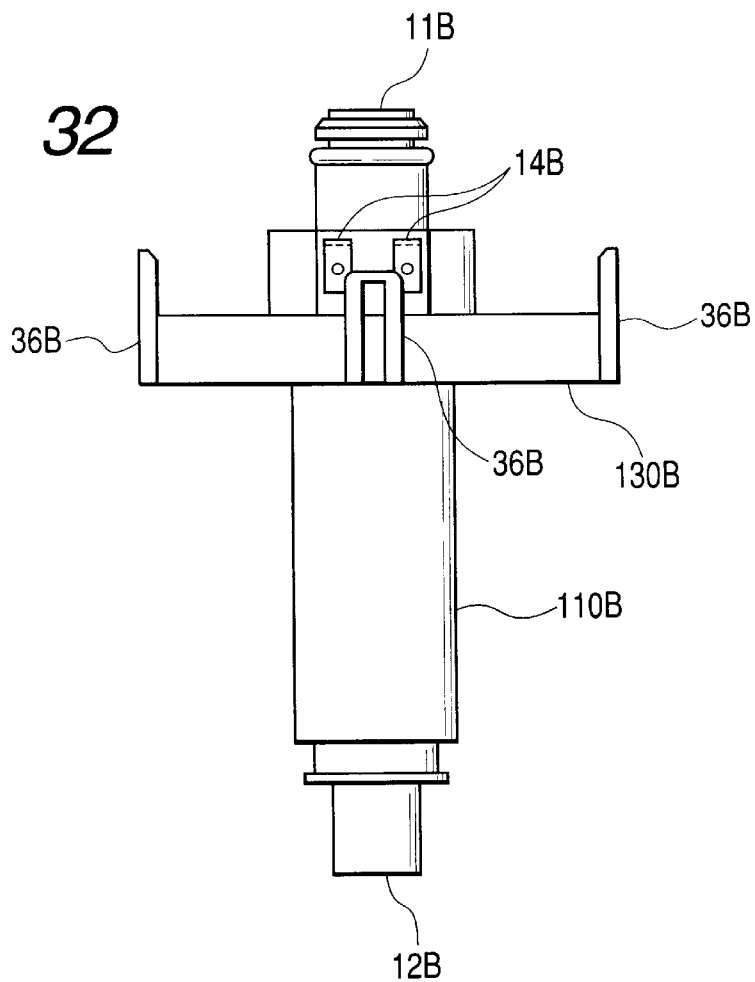
FIG. 32 is a side elevational view showing the injector member.
Figure 33:
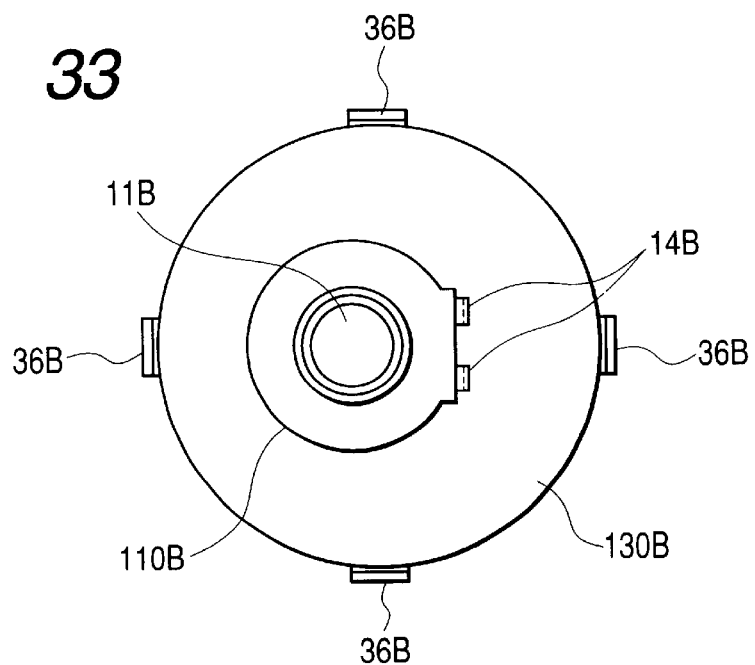
FIG. 33 is a plan view showing the injector member.
Figure 34:
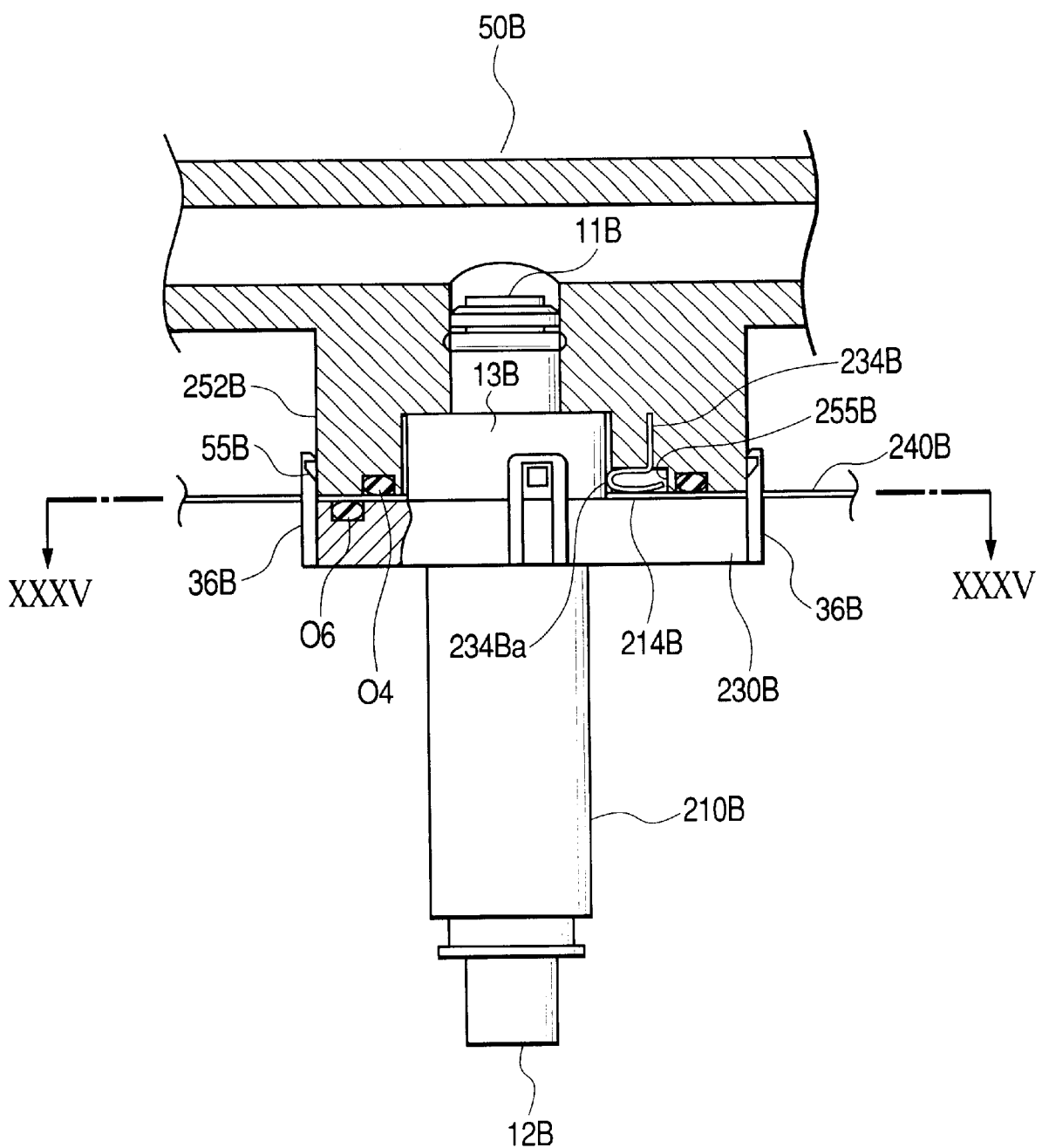
FIG. 34 is a partially broken front elevational view showing the injector integrated module according to Modified Example 2 of Embodiment 2.
Figure 35:
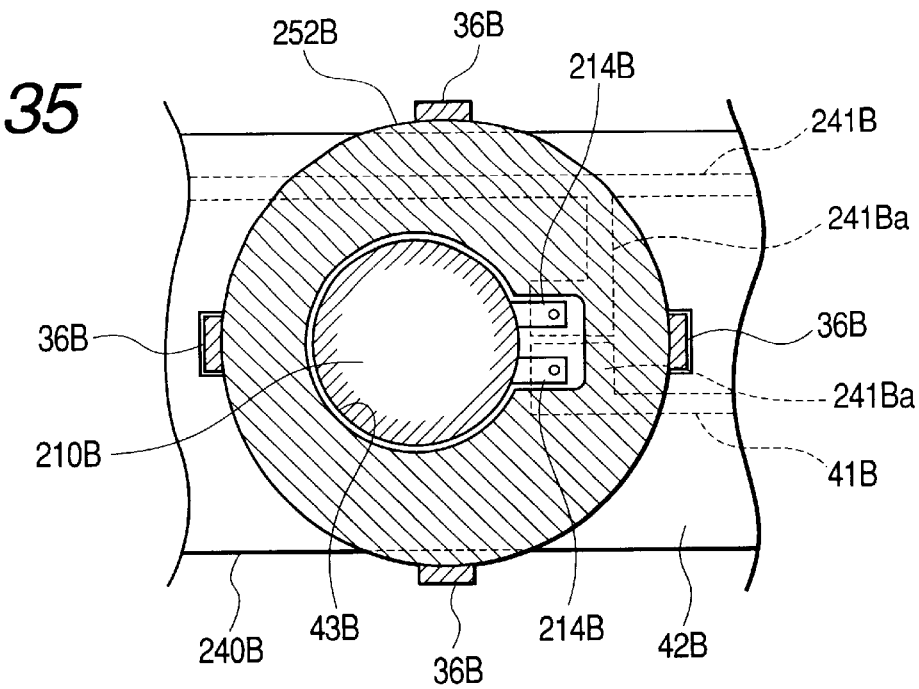
FIG. 35 is a sectional view taken along the line XXXV—XXXV in FIG. 34.
Figure 36:
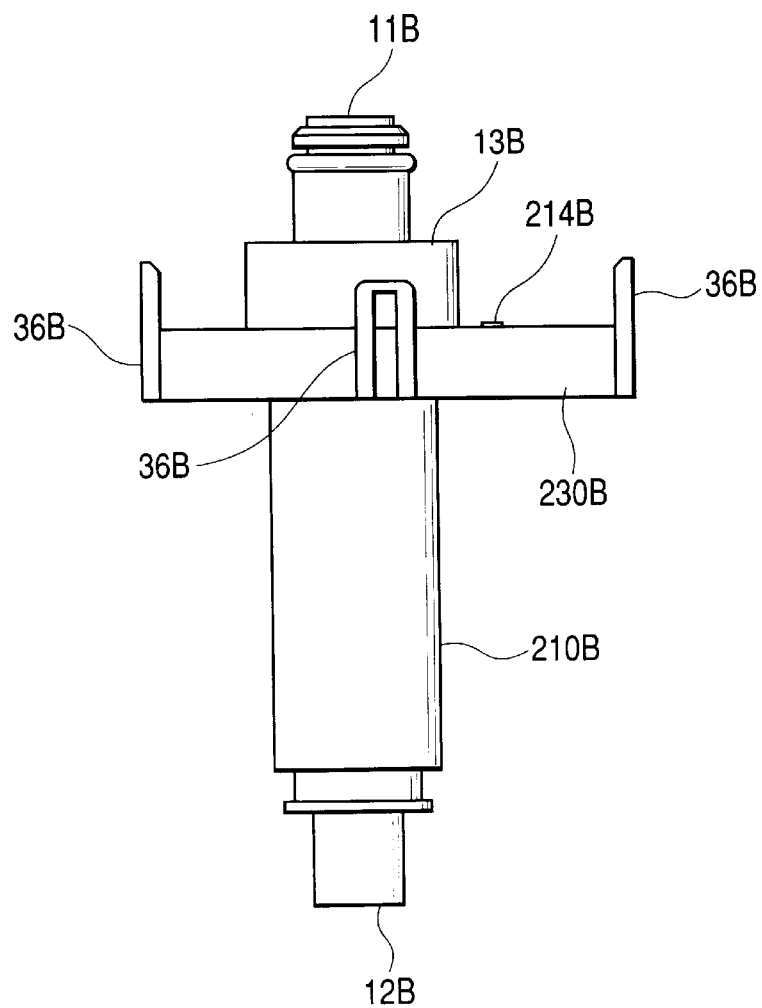
FIG. 36 is a front elevational view showing an injector member.
Figure 37:
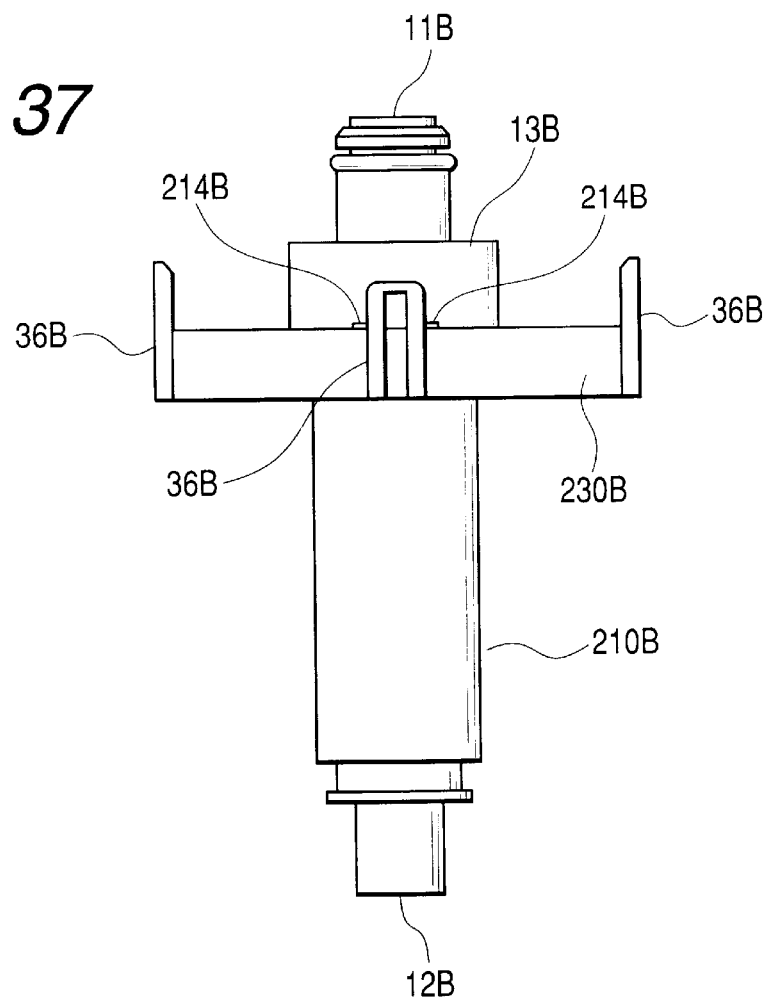
FIG. 37 is a side elevational view showing the injector member.
Figure 38:
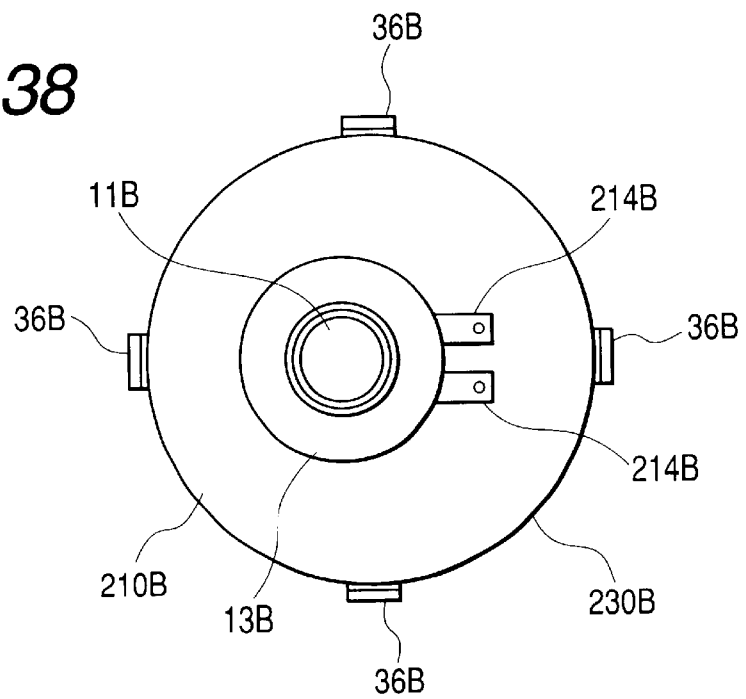
FIG. 38 is a plan view showing the injector member
Figure 39:
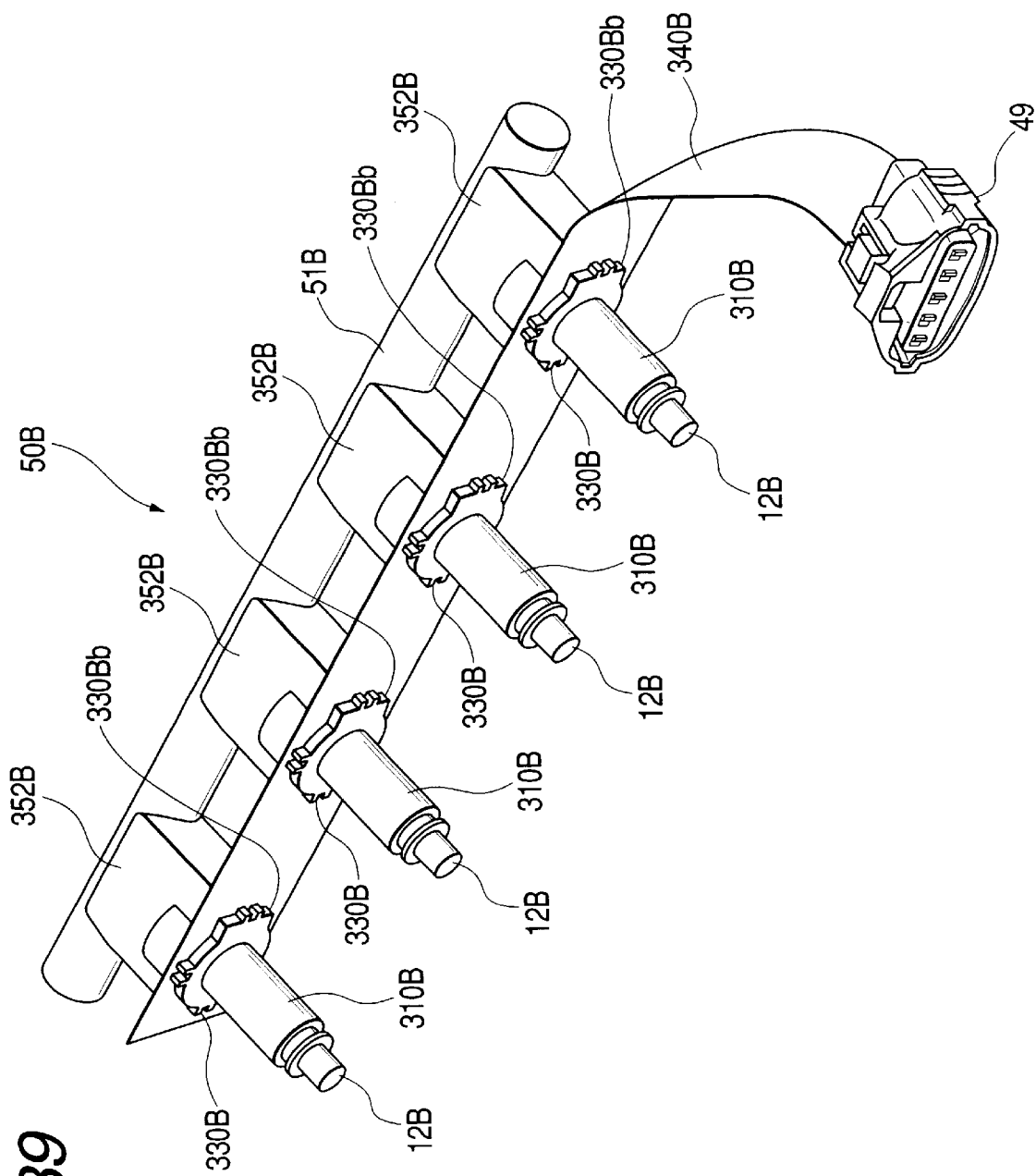
FIG. 39 is a perspective view showing the injector integrated module according to Modified Example 3 of Embodiment 2.
Figure 40:
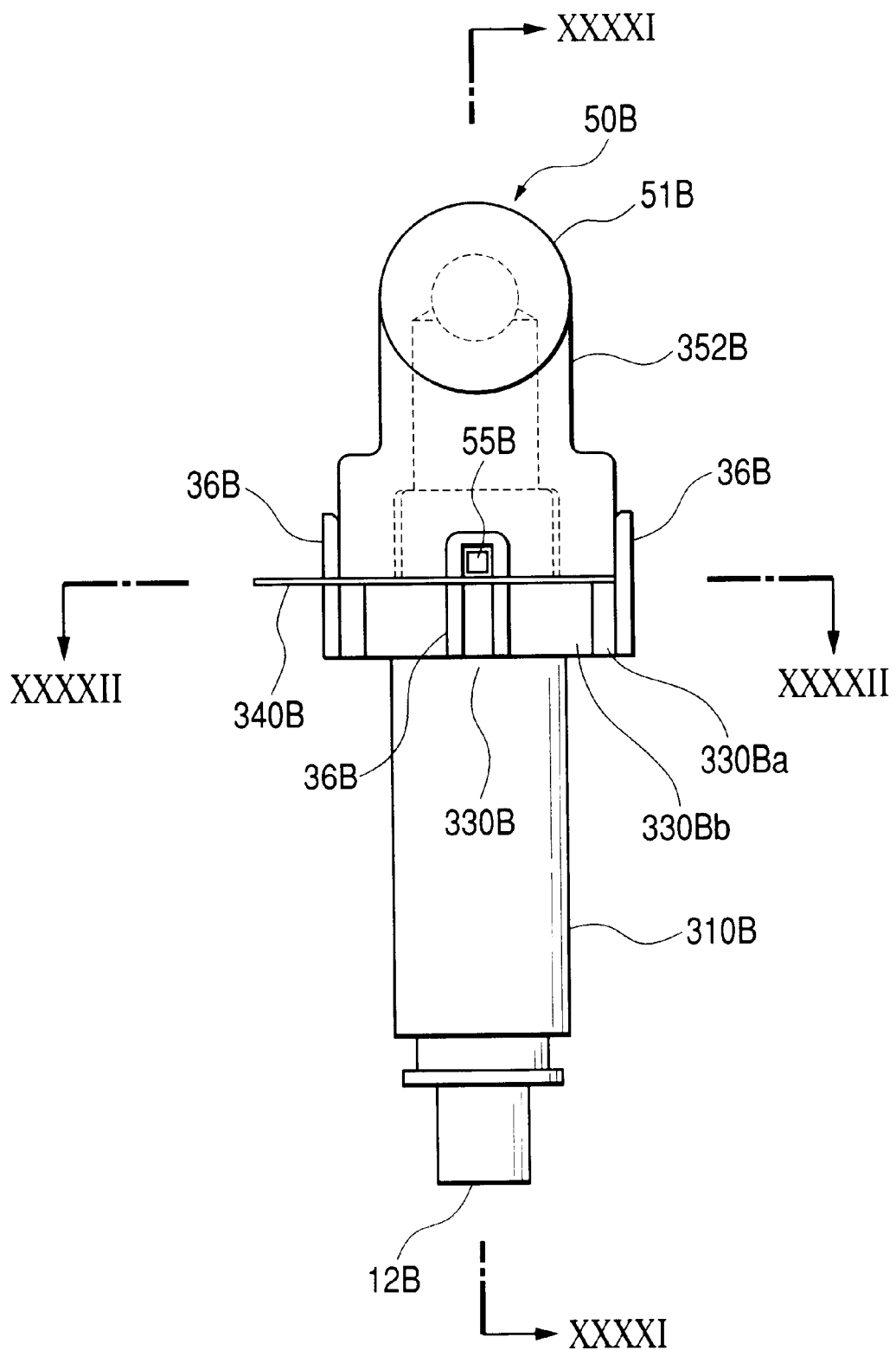
FIG. 40 is a side elevational view showing the same injector integrated module.

The injector integrated module is, as shown in FIG. 22, such that a delivery pipe 50B and an electrical wiring structure between the engine control unit 1 (which is identical to the engine control unit 1 described above) are at least partially integrated with the respective injector members 10B.

As shown in FIG. 22 through FIG. 25, the injector integrated module is provided with a plurality of injector members 10B, a flexible wiring member 40B, a plurality of injector fixing members 30B provided, corresponding to the above-described respective injector members 10B, and a delivery pipe 50B.

As shown in FIG. 22 through FIG. 28, the above-described respective injector members 10B are installed in the intake manifolds 1 of the respective combustion chamber, and are formed to be roughly cylindrical, at one end side of which a fuel intake port 11B is formed, and at the other end side of which a fuel injection hole 12B is formed. The end portions where the fuel intake port 11B is formed is inserted into and connected to the respective injector attaching base portions 52B of the delivery pipe 50B described later, wherein the fuel intake port 11B can be retained.

In addition, a fuel opening and shutting mechanism that is similar to the above-described fuel opening and shutting mechanism 19 is incorporated in the respective injector members 10B. Connection pieces 14B that are electrically connected to the fuel opening and shutting mechanism are formed at one side of the outer circumferential portion of the injector members 10B. An excitation current is permitted to flow into the above-described electromagnetic coil through the connection pieces 14B. In the present embodiment, the intermediate portion of the injector members 10B in its lengthwise direction is formed to be slightly larger in diameter than that of the circumferential edge parts, and a flat portion 13Ba is formed on one side portion of the large diameter section 13B. A pair of left and right connection pieces 14B are formed at the flat portion 13Ba. The respective connection pieces 14B are formed to be roughly inverted L-shaped in its side view by burying one end portion of a thin band-shaped conductive piece such as metal in the upper portion of the above-described flat portion 13Ba, bringing the same into electrical contact with the above-described electromagnetic coil, and bending the other end portion thereof downward after having projecting the same slightly outward of the flat portion 13Ba, and is further formed so as to be resiliently deferrable inward from outward in the diameter direction of the injector members 10.

Also, as shown in FIG. 22 through FIG. 25, the flexible wiring member 40B has a plurality of injector inserting holes 43B (corresponding to the injector inserting holes 43) and the lead-out connection end portions 41Ba (corresponding to the lead-out connection end portions 41a) as the exposed connection end portions as in those described with reference to the above-described Embodiment 1).

The delivery pipe 50B has a plurality of injector attaching base portions 52B into and to which the end portions of the respective injector members 10B at the fuel intake portion 11B side are inserted and connected, and which holds the respective injector members 10B at the engine body E side in an installable state. In detail, a plurality of injector attaching base portions 52B are formed so as to suspend from and protrude from a straight tubular fuel pass portion 51B at appointed spaces along the lengthwise direction thereof. The respective injector attaching base portions 52B are formed to be short-columnar, wherein a fuel feeding port 52Ba that communicates with spacing in the above-described fuel pass portion 51B, and a large diameter accommodating portion 53B that is capable of accommodating the above-described large diameter section 13B is formed downward of the fuel feeding port 52a and continuously therefrom.

And, where one endportion of the respective injector members 10B is inserted into and connected to the large diameter accommodating portion 53B and the fuel feeding port 52B of the respective injector attaching base portions 52B, the corresponding respective injector members 10B are connected and held at the engine body E side in an installable state, and fuel that is supplied through the above-described fuel pass portion 51B is bifurcated by the respective fuel feeding ports 52B and is supplied from the respective fuel intake ports 11B into the respective injector members 10B.

Also, in the respective injector members 10B, the above-described lead-out connection end portion 41Ba is electrically connected to the connection piece 14B between the injector attaching base portions 52B and the injector fixing members 30B described later. In the present embodiment, the lead-out connection end portion 41Ba is electrically connected to the connection piece 14B by the following construction.

That is, a resilient pressing piece 34B that presses the above-described lead-out connection end portion 41Ba so that the lead-out connection end portion 41Ba is brought into electrical contact with the connection piece 14B is formed at the respective injector attaching base portions 52B.

In detail, the part corresponding to the flat portion 13Ba of the large diameter section 13B of the above large diameter accommodating portion 53B is formed as a flat portion 53Ba that is disposed with spacing between the same and the corresponding flat portion 13Ba, and the above-described resilient pressing piece 34B is formed on the side wall portion of the injector attaching base portion 52B on which the flat portion 53Ba is formed. The resilient pressing piece 34B is formed of a resilient member such as metal or resin, one end portion of which is buried in the side wall portion of the above-described injector attaching base portion 52B, and at the same time, the other end portion of which is bent and formed so as to be folded over upward from the lower end part of the corresponding side wall portion directed between the above-described flat portion 13Ba and the flat portion 53Ba. And, where the above-described lead-out connection end portion 41Ba is disposed between the fold-over end portion 34Ba of the resilient pressing piece 34B and the respective connection pieces 14B so that the same is held therebetween, the lead-out connection end portion 41Ba is pressed so as to be brought into electrical contact with the respective connection pieces 14B by the resilient pressing piece 34B.

Also, the resilient pressing piece 34B may be made of a single material or may be made of a plurality of materials corresponding to the respective connection pieces 14.

Also, in the present embodiment, the lead-out connection end portion 41Ba is pressed to the connection piece 14B by the resilient pressing piece 34B so that the same can be brought into electrical contact with the connection pieces 14B. However, the lead-out connection end portion 41Ba may be electrically connected to the connection piece 14B by other welding or soldering, etc.

Projections 55B are formed at the lower part of the injector attaching base portion 52B in four directions of the outer circumferential surface of the injector attaching base portions 52B, and respective engagement portions 36B are constructed so as to be formed at the injector fixing member 30B side described later, which may be engaged with the above-described projections 55B.

In addition, an annular recess 52Bg is formed on the underside of the injector attaching base portion 52B, simultaneously, a waterproof ring member O4 such as a rubber is disposed in the annular recess 52Bg, and the waterproof ring member O4 is compressed to intervene between the flexible wiring member 40B and the injector member 10B, wherein water can be prevented from invading therethrough.

Also, the respective injector fixing members 30B are formed at the respective injector members 10B so that the fixing members 30B can be externally fitted thereto from the fuel injection hole 12B side, and are formed as members for attaching the respective injector members 10B to the flexible wiring members 40B and fixing the same thereat.

And, the circumferential edge part of the respective injector inserting holes 43B of the flexible wiring member 40B is held and fixed between the respective injector attaching base portions 52B and the respective injector fixing members 30B that are externally fitted to the respective injector members 10B in a state where the end portions of the respective injector members 10B at the fuel intake ports 11B side are inserted into the respective injector attaching base portions 52B and connected thereat, and simultaneously, the respective injector members 10B are inserted into and connected to the respective injector inserting holes 43B that are formed at the respective flexible wiring member 40B.

In detail, the respective injector fixing members 30B are formed to be roughly disk-shaped with an appointed thickness, and injector inserting holes 32B into which the above-described injector members 10B can be inserted are formed therein. That is, the respective injector fixing members 30B are formed at the respective injector members 10B so that the former can be externally fitted thereto from the fuel injection hole 12B side.

Further, engagement portions 36B that are engageable with the above-described projections 55B are formed in the four directions of the outer circumferential portion of the respective injector fixing members 30B. The respective engagement portions 36B are a roughly inverted U-shaped member, and are formed so as to be resiliently deformable outwards. By resiliently returning the engagement portions 36B after the respective projections 55B are engaged with the tip end portions 36Ba of the engagement portions 36B once the respective engagement portions 36B are resiliently deformed outwardly, the respective engagement portions 36B are engaged with the projections 55B, whereby the respective injector attaching base portions 52B and the respective injector fixing members 30B are fixed and held in a state where they overlap each other with the flexible wiring member 40B placed therebetween.

Further, an appointed pair of engagement portions 36B of the respective engagement portions 36B are engaged with the projections 55B corresponding thereto through the outside at both sides of the flexible wiring member 40B as in the above-described Embodiment 1, and the other pair of engagement portions 36B are engaged with the projections 55B corresponding thereto through an inserting hole 44 (See FIG. 25) that is formed at a position avoiding the wiring conductor of the flexible wiring member 40B.

An annular recess 18B is formed at the part, where the injector fixing members 30B are externally fitted, of the outer circumferential portion of the respective injector members 10B, and simultaneously, to a waterproof ring member O5 wherein a rubber is disposed in the annular recess 18B. By causing the waterproof ring member O5 to be compressed to intervene between the injector members 10B and the injector inserting hole portions B, water can be prevented from invading therethrough.

An annular recess 35Bg is formed on the upper circumferential surface of the injector fixing member 30B, and simultaneously, a waterproof ring member O6 such as a rubber is disposed in the annular recess 35Bg. By causing the waterproof ring member O6 to be compressed to intervene between the flexible wiring member 40B and the injector fixing member 30B, water can be prevented from invading therethrough.

The injector integrated module constructed as described above is assembled as follows:

First, after the waterproof ring member O4 is mounted to the respective injector attaching base portions 52B, the flexible wiring member 40B is disposed on the underside thereof. At this time, the respective injector inserting holes 43B are disposed at the lower side of the respective injector attaching base portions 52B, and simultaneously, the lead-out connection end portions 41Ba that are taken out from the respective injector inserting holes 43B are disposed along the surface of the fold-over end portion 34Ba of the resilient pressing piece 34B.

Next, after the waterproof ring member O5 is mounted in the respective injector members 10B, the end portions at the fuel intake port 11B side are inserted into and connected to the injector attaching base portions 52B, whereby the respective injector members 10B are held on the delivery pipe 50B at the engine body E side in an installable state. At this time, the respective lead-out connection end portions 41Ba are disposed in a state where the respective lead-out connection end portions 41B are held between the resilient pressing pieces 34B and the respective connection pieces 14B, and the lead-out connection end portions 41Ba are pressed by the resilient pressing pieces 34B so that the lead-out connection end portions 41Ba are brought into electrical contact with the respective connection pieces 14B.

At this time, the respective injector fixing members 30B in which the waterproof ring member O6 is mounted are externally fitted to the injector members 10B from the end portion side where the fuel injection holes 12B are formed, and the respective engagement portions 36B are engaged with the projections 55B, wherein the circumferential edge parts of the respective injector inserting holes 43B of the flexible wiring member 40B is held and fixed between the respective injector attaching base portions 52B and the respective injector fixing members 30B.

And, after the injector integrated module is thus assembled, the respective injector members 10B are installed at the engine body E side, wherein the injector integrated module is assembled at and attached to the engine body E.

According to the injector integrated module constructed as described above, the injector integrated module constructed as described above is provided with a flexible wiring member 40B in which a wiring conductor to make electrical connections between the engine control unit 1 and the respective injector members 10B is placed between a pair of insulation films 42B; and a plurality of injector members 10B internally having a fuel opening and shutting mechanism incorporated, which is driven to open and shut on the basis of a fuel injection control signal from the engine control unit 1 and adjusts injection timing of fuel from a fuel injection hole 12B. Since the wiring conductor of the flexible wiring member 40B is electrically connected to the fuel opening and shutting mechanism in the respective injector members 10B at respective positions on the flexible wiring member 40B having spacing that permits the respective injector members 10B to be installed at the engine body E side, that is, if the construction is described in compliance with the mode of the embodiment, a plurality of injector fixing members 30B that are externally fitted to the respective injector members 10B from one end side thereof are provided so as to correspond to the respective injector members 10B. One end portion of the respective members 10B is inserted into and connected to the respective injector attaching base portions 52B, and at the same time, the respective injector members 10B are, respectively, inserted into a plurality of injector inserting holes 43B that are formed on the flexible wiring member 40B. In this state, the circumferential edge part of the respective injector inserting holes 43B of the flexible wiring member 40B is held and fixed between the respective injector attaching base portions 52B and the respective injector fixing members 30B that are externally fitted to the respective injector members 10B and fixed at the attaching base portions 52B, and the respective lead-out connection end portions 41Ba are pressed to the connection pieces 14B by the resilient pressing piece 34B secured at the corresponding injector attaching base portion 52B, so that the lead-out connection end portions 41Ba are brought into electrical contact with the respective connection pieces 14B. Therefore, differing from the prior arts, there is no need for the ends of the harnesses led out from the engine control unit to be connected, one by one, to the respective injector members 10B that are installed at the engine body, by using connectors, and it becomes possible to easily assemble the injector members 10B and wiring members thereto at the engine body.

Further, a flexible wiring member 40B is employed as the wiring material to the respective injector members 10B, the total weight can be decreased.

Also, the circumferential edge parts of the respective injector inserting holes 43B of the flexible wiring member 40B are held and fixed between the respective injector attaching base portions 52B and the respective injector fixing members 30B, and the lead-out connection end portions 41Ba are brought into electrical contact with the connection pieces 14B between the respective attaching base portions 52B and the respective injector fixing members 30B. Therefore, a relative positional slip between the flexible wiring member 40B and the respective injector members 10B can be prevented from occurring, wherein an electrically connected state can be securely maintained between the lead-out connection end portions 41Ba and the connection pieces 14B.

In addition, since the respective injector members 10B are constructed to be integrated with the delivery pipe 50B in a state where the respective injector members 10B are connected to and held at the engine body E side in an installable state at the engine body E side, it is possible to simultaneously and easily install the respective injector members 10B at the engine body E.

Further, since such a construction is employed, in which the end portion of the injector members 10B at the fuel intake portion 11 side are inserted into and connected to the injector attaching base portions 52B, it is possible to absorb a slip between the delivery pipe 50B and the attaching portions of the injector members 10B at the cylinder head side of the engine body E, which results from production tolerances and thermal expansion.

Also, in Embodiment 2, in the injector attaching base portions 52B, the respective lead-out connection end portions 41Ba are pressed to the respective connection pieces 14B by the resilient pressing pieces 34B secured at the corresponding injector attaching base portions 52B so that the lead-out connection end portions 41Ba can be brought into electrical contact with the connection pieces 14B. However, the resilient pressing pieces 34B may be provided at the respective injector fixing members 30B side, and at the same time, the respective connection pieces 14B may be formed at the part where they can be accommodated in the respective injector fixing members 30B of the respective injector members 10B, wherein, at the respective injector fixing members 30B side, the respective lead-out connection end portions 41Ba may be pressed to the respective connection pieces 14B so that the lead-out connection end portions 41Ba can be brought into electrical contact with the connection pieces 14B (Refer to the mode of Embodiment 1).

Also, in Embodiment 2, the delivery pipe 50B maybe integrated with the engine head cover as in the example shown in FIG. 9 in the above-described Embodiment 1.

Modified Example 1 of Embodiment 2

Next, a description is given of Modified Example 2 of Embodiment 2.

Also, component elements that are similar to those of the injector integrated module according to the above-described Embodiment 2 are given the same reference numbers, and an overlapping description thereof is omitted. A description is given, focusing on only the points of difference.

That is, as shown in FIG. 29 through FIG. 33, in the injector integrated module, the respective injector fixing members 130B (corresponding to the above-described injector fixing members 30B) are integrated with the outer circumference of the intermediate portion of the corresponding injector members 10B (corresponding to the above-described injector members 10B) in the lengthwise direction thereof.

When assembling the injector integrated module, in a state where the flexible wiring member 40B is disposed on the underside of the respective injector attaching base portions 52B, and simultaneously, the lead-out connection end portions 41Ba that are taken out from the respective injector inserting holes 43B are disposed along the surface of the fold-over end portions 34B of the resilient pressing pieces 34B, the end portions of the injector members 110B at the fuel intake ports 11B side are inserted into and connected to the injector attaching base portions 52B, the respective injector members 110B are retained at the delivery pipe 50B in a state where the respective injector members 110B can be installed at the engine body E side, and at the same time, the lead-out connection end portions 41Ba are pressed to the connection pieces 14B by the resilient pressing pieces 34B so that the lead-out connection end portions 41B are brought into electrical contact with the connection pieces 14B. Simultaneously, the circumferential edge part of the respective injector inserting hole 43B of the flexible wiring member 40B is held and fixed between the respective injector attaching base portions 52B and the respective injector fixing members 130B, so that the respective engagement portions 36B of the injector fixing members 130B are engaged with the projections 55B, whereby assembly of the injector integrated module is completed.

According to the above-described injector integrated module, in addition to the effects brought about by the above-described Embodiment 2, since the injector fixing members 130B and the injector members 110B are formed and integrated with each other, such a waterproof structure between the injector fixing members 30B and the injector members 10B as the waterproof ring member O5 in Embodiment 2 is no longer needed, wherein the waterproof structure can be simplified and be made small in size.

Modified Example 2 of Embodiment 2

In the injector integrated module of Modified Example 1 according to Embodiment 2, as shown in FIG. 34 through FIG. 38, as in Modified Example 1 of the above-described Embodiment 1, connection pieces 214B that are electrically connected to the fuel opening and shutting mechanism are exposed to and formed at the position, which can be brought into contact with one end side of the flexible wiring member 240B (corresponding to the flexible wiring member 40B) held and fixed between the corresponding respective injector fixing members 230B and the respective injector attaching base end portions 252B (corresponding to the injector attaching base end portions 52B), of the injector fixing members 230B (corresponding to the injector fixing members 130B) of the respective injector members 210B (corresponding to the injector members 10B) (Refer to FIG. 34 through FIG. 38). Also, the connection end portions of the wiring conductor 241B to the respective injector members 210B are formed so as to be exposed to the position, where the connection end portions thereof can be brought into electrical contact with the respective connection pieces 214B, at one end side of the flexible wiring member 240B, that is, at the circumferential edge part of the respective injector inserting holes 43B, whereby the connection end portions are formed at the exposed connection end portions 241B (Refer to FIG. 34 through FIG. 35). Further, resilient pressing pieces 234B that press the respective exposed connection end portions 241B from the other surface side of the flexible wiring member 240B toward the corresponding connection pieces 214B are formed at the respective injector attaching base portions 252B (Refer to FIG. 34), and, in the respective injector members 210B, the exposed connection end portions 241Ba are pressed, by the resilient pressing pieces 234B, to the connection pieces 214B along the (vertical) direction orthogonal to the surface direction of the flexible wiring member 240B so that the exposed connection base portions 241B are brought into electrical contact with the connection pieces 214B.

In detail, the respective connection pieces 214B are made of a thin band-shaped conductor piece such as metal, one end portion of which is buried in the injector members 210B and is electrically connected to the internal fuel opening and shutting mechanism, and the other end portion of which is disposed so as to extend in parallel, being directed to the outside from the circumferential surface of the injector members 210B along the upper surface of the injector fixing members 230B, wherein the respective connection pieces 214B are exposed to and formed at the upper surface side of the injector fixing members 230B.

Also, the lower surface side insulation film 42B is partially removed at the circumferential edge parts of the respective injector inserting holes 43B of the flexible wiring member 240B, and the respective connection end portions of the wiring conductor 241B is exposed to the removed part thereof, whereby the exposed connection end portions 241Ba are formed.

A recess 255B is formed at the lower part of the injector attaching base portion 252B, that is at the part corresponding to the connection piece 214B at the injector fixing member 230B side. The resilient pressing piece 234B is formed of a resilient material such as metal or resin, one end portion of which is buried in the above-described recess 255B, and the other end portion of which is formed to be a flat roughly C-shaped pressing portion 234Ba and is disposed in the above-described recess 255B.

And, by disposing the exposed connection end portion 241Ba of the flexible wiring member 240B between the pressing portion 234Ba of the resilient pressing piece 234B and the above-described connection piece 214B, the resilient pressing pieces 234B press the respective exposed connection end portions 241B toward the respective connection pieces 214B along the direction orthogonal to the surface direction of the flexible wiring member 240B.

Also, the resilient pressing piece 234B may be made of a single material or may be made of a plurality of materials corresponding to the respective connection pieces 214B.

In the injector integrated module constructed as described above, if the injector members 210B are inserted into and connected to the injector attaching base portions 252B from the fuel intake ports 11B in a state where the respective exposed connection end portions 241Ba are disposed on the respective connection pieces 214B, the exposed connection end portions 241B are disposed between the connection pieces 214B and the resilient pressing pieces 234B. And, where the injector fixing members 230B are attached to and fixed at the injector attaching base portions 252B, the exposed connection end portions 241Ba are pressed, by the resilient pressing pieces 234B, to the connection pieces 214B from the other surface (upper surface) side of the flexible wiring member 240B along the (vertical) direction orthogonal to the surface direction of the flexible wiring member 240B, so that the exposed connection end portions 241Ba are brought into electrical contact with the connection pieces 214B.

In the injector integrated module according to the modified example, it becomes possible to facilitate electrical connections between the exposed connection end portions 241Ba and the connection pieces 214B, when assembling the injector integrated module, on the basis of the same reason as that described with reference to Modified Example 1 of the above-described Embodiment 1, and even if the respective injector members 210B slip more or less along the surface direction of the flexible wiring member 240B, electrical connections between the exposed connection end portions 241B and the connection pieces 214B can be more reliably secured.

Also, it is preferable that the exposed connection end portions 241Ba of the wiring conductor 241B are formed to be wider than at other portions to secure a wide area, so that a further large positional slip of the respective injector members 210B can be easily handled.

Modified Example 3 of Embodiment 2

Next, a description is given of Modified Example 3 of Embodiment 2 of the invention.

Component elements that are similar to those in the injector integrated module according to the above-described Embodiment 2 are given the same reference numbers, and a description thereof is omitted. A description is given, focusing on the points of difference therebetween.

That is, the injector integrated module is basically based on the same idea as that on which Modified Example 2 according to the above Embodiment 1 is based. As shown in FIG. 39 through FIG. 45, the injector integrated module is constructed so that annular resilient members O300B are disposed at positions avoiding the injector members 310B (corresponding to the injector members 10B) so that the injector members 310B are not internally included, between injector attaching base portions 352B (corresponding to the injector attaching base portions 52B) and injector fixing members 330B (corresponding to the injector fixing members 30B). And, in the respective injector members 310B, exposed connection end portions 341Ba are electrically connected to connection pieces 314B at the position surrounded by the annular resilient members O300B between the injector attaching base portions 352B and the injector fixing members 330B.

In detail, in the injector integrated module, the waterproof ring members O4, O5, and O6 in the above-described Embodiment 2 are removed, and the injector fixing member 330B is constructed so as to form a wide connection portion 330Bb, whose shape is rectangular in its plan view, at one side portion of the small diameter collar-shaped portion 330Ba that is formed along the circumferential direction at the intermediate portion in the lengthwise direction of the injector member 310B. Also, the injector attaching base portion 352B has a shape corresponding to the injector fixing member 330B in its plan view.

In addition, an annular (in this modified example, to be annular with a rectangular section whose corners are slightly round) accommodating groove 330Bbg is formed on the surface (upper surface) at the injector attaching base portion 352B side of the wide connection portion 330Bb, and an annular resilient member O300B formed of a rubber, etc. is disposed and accommodated in the accommodating groove 330Bbg.

Also, the above-described injector fixing member 330B is integrated with and formed at the injector members 310B, one end portion of the respective connection pieces 314B formed by a thin band-shaped conductive piece such as metal is buried in the injector members 310B and is electrically connected to the internal fuel opening and shutting mechanism. At the same time, the other end portion thereof are exposed inside the annular resilient member O300B on the side of the injector fixing members 330B side of the wide connection portion 330Bb via the injector fixing members 330B.

Figure 41:
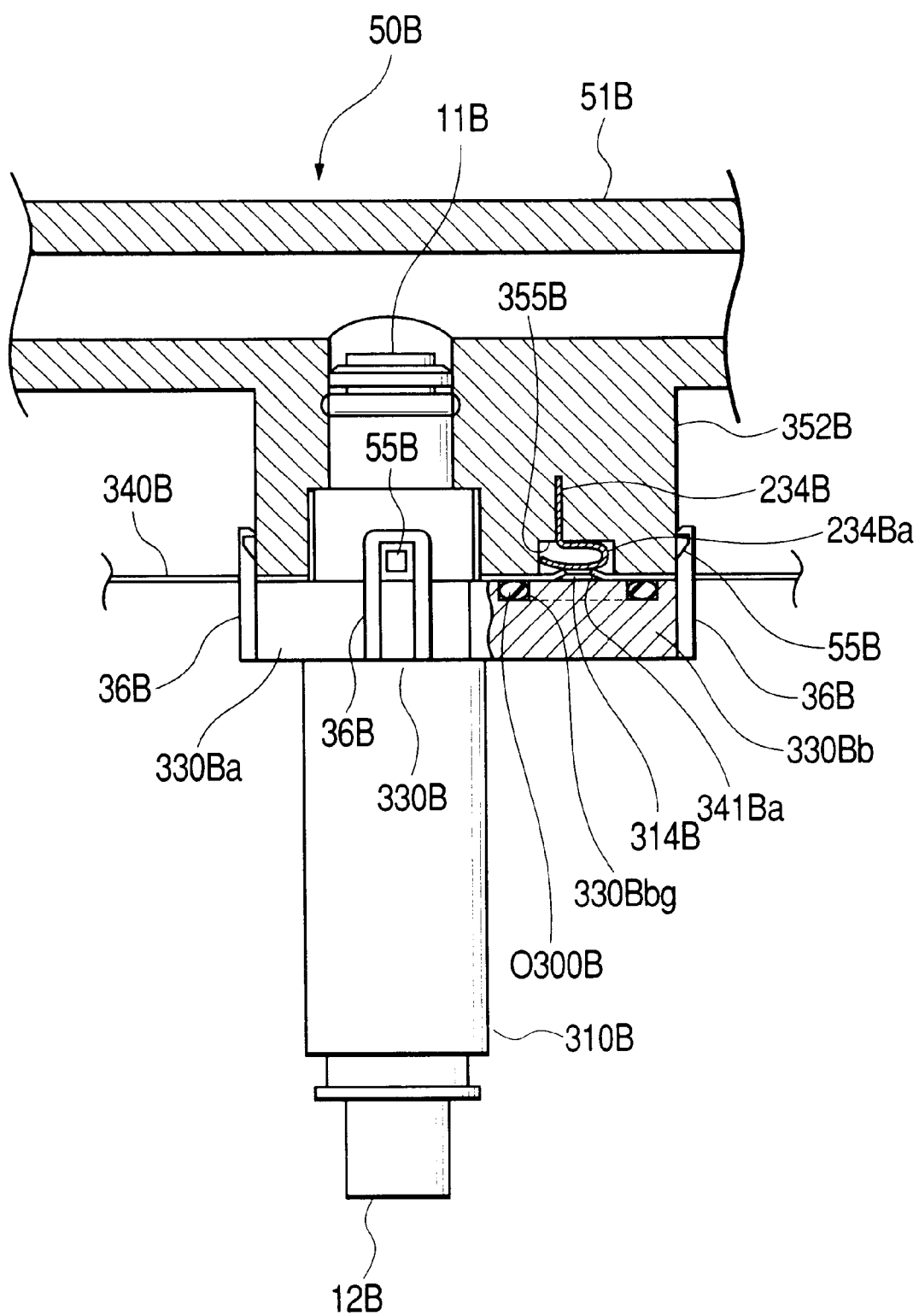
FIG. 41 is a partially broken front elevational view taken along the line XXXXI—XXXXI in FIG. 40.
Figure 42:
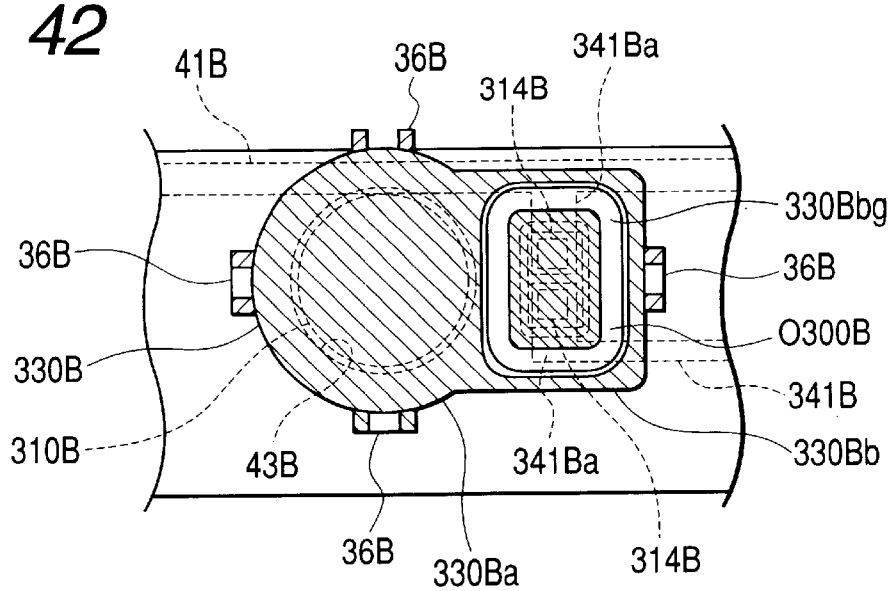
FIG. 42 is a partially broken front elevational view taken along the line XXXXII—XXXXII in FIG. 40.
Figure 43:
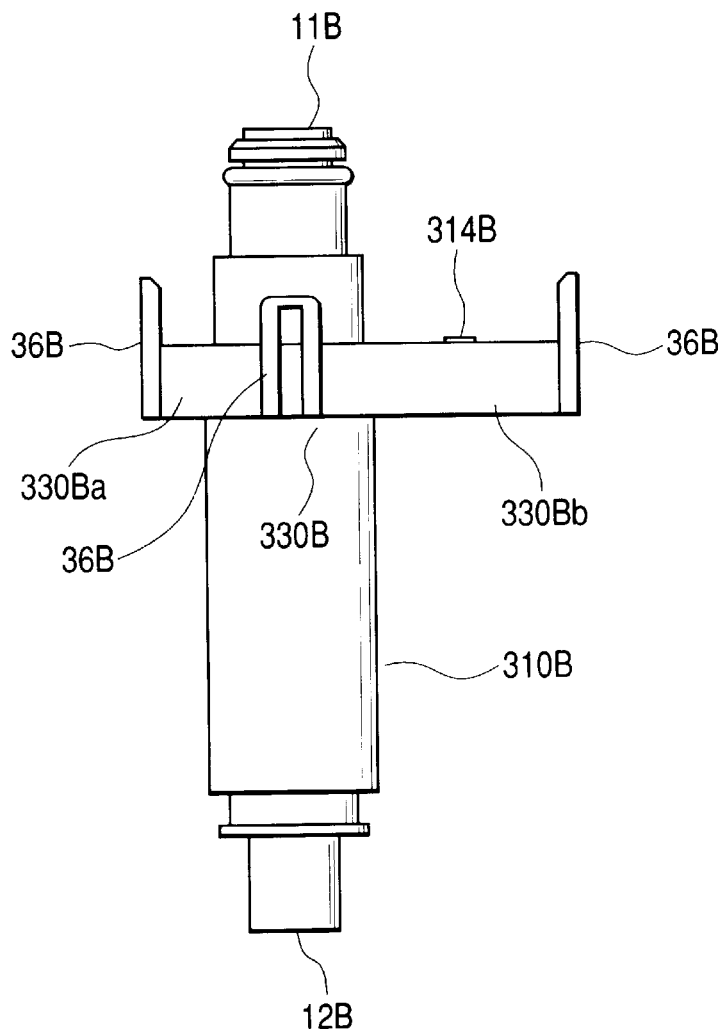
FIG. 43 is a front elevational view showing an injector member.
Figure 44:
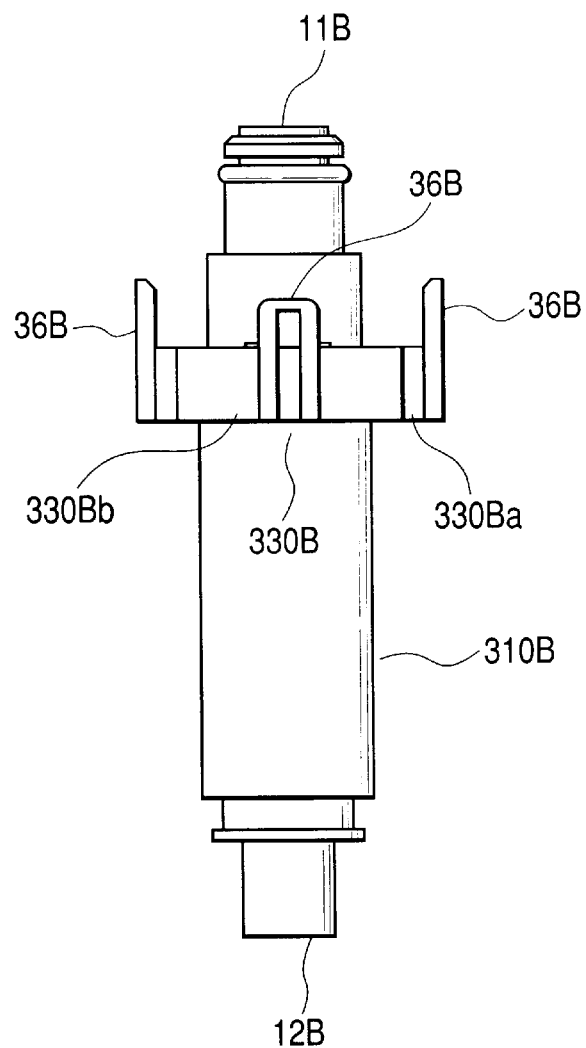
FIG. 44 is a side elevational view showing the injector member.
Figure 45:
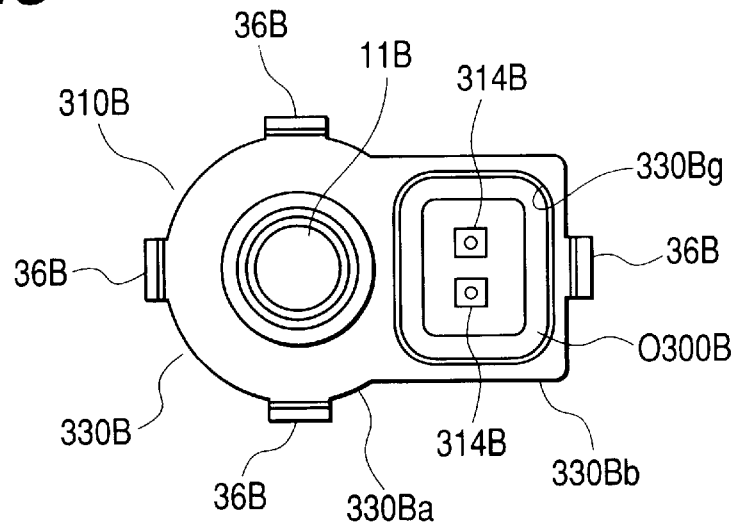
FIG. 45 is a plan view showing the injector member.

Also, the insulation film 42B on the under surface side is partially removed at the circumferential edge parts of the respective inserting holes 43B of the flexible wiring member 340B, and the respective connection end portions of the wiring conductor 341B are exposed to the removed part, whereby the exposed connection end portions 341Ba are formed (Refer to FIG. 41 and FIG. 42).

Further, a recess 355B is formed at the lower part of the injector attaching base portion 352B, that is, at the part corresponding to the area in the annular resilient member O300 at the injector fixing members 330B side. Also, one end portion of the resilient pressing piece 234B whose construction is similar to that of the above-described second modified example is buried in the ceiling portion of the above-described recess 355B, and the pressing portion 234Ba at the other end portion is disposed in the above-described recess 355B. And, where the portion of the exposed connection end portion 341Ba of the flexible wiring member 340B is held and disposed between the pressing portion 234B of the resilient pressing piece 234B and the above-described connection piece 314B, the pressing portion 234Ba of the resilient pressing piece 234B presses the respective exposed connection end portions 341B toward the respective connection pieces 314B along the direction orthogonal to the surface direction of the flexible wiring member 340B.

According to the injector integrated module, in addition to the effects brought about by the above-described Embodiment 2, a waterproof structure is no longer required between the injector fixing members 330B and the injector members 310B on the basis of the reason similar to that described with reference to Modified Example 2 according to the above-described Embodiment 1, wherein it is possible to simplify the waterproof structure and make it simple. Therefore, the corresponding structure can be made small in size, wherein it becomes possible to provide a small-sized injector integrated module that is excellent in waterproof property.

Embodiment 3

Next, a description is given of an injector integrated module according to Embodiment 3 of the invention with reference to FIG. 46 through FIG. 51.

The injector integrated module is provided with a plurality of injector members 10C and a flexible wiring member 40C, and is further provided with injector fixing members 30C, in which at one side portion of the respective injector members 10C, a connection base portion 20C is formed, a connection piece 14C that is electrically connected to the fuel opening and shutting mechanism in the injector member 10C is exposed to and formed at the connection base portion 20C, which can be fixed at the respective connection base portions 20C from the side corresponding to the respective injector members 10C. And, since the respective injector fixing members 30C are fixed at the respective connection base portions 20C, the flexible wiring member 40C is held and fixed between the respective injector fixing members 30C and the respective connection base portions 20C, and, at respective parts held and fixed between the respective injector fixing members 30C and the respective connection base portions 20C at the flexible wiring member 40C, the connection end portions of the wiring conductor 41C to the respective injector members 10C are formed at the exposed connection end portions 41Ca that are exposed to the outside. At the respective injector members 10C, the exposed connection end portions 41C are electrically connected to the connection pieces 14C between the connection base portions 20C and the injector fixing members 30C.

In detail, as shown in FIG. 46 through FIG. 51, the respective injector members 10C are formed to be roughly cylindrical so as to have fuel intake ports 11C (corresponding to the fuel intake ports 11) formed at one end side thereof, and fuel injection holes 12C (corresponding to the fuel injection holes 12) formed at the other end side thereof, as in the injector members 10 in the above-described Embodiment 1 of the invention. A fuel opening and shutting mechanism (not illustrated in this embodiment) that is similar to the above-described fuel opening and shutting mechanism 19 is internally incorporated.

Also, a structure that is similar to that described in connection with the above-described Embodiment 1 may be used as the delivery pipe 50.

Figure 46:
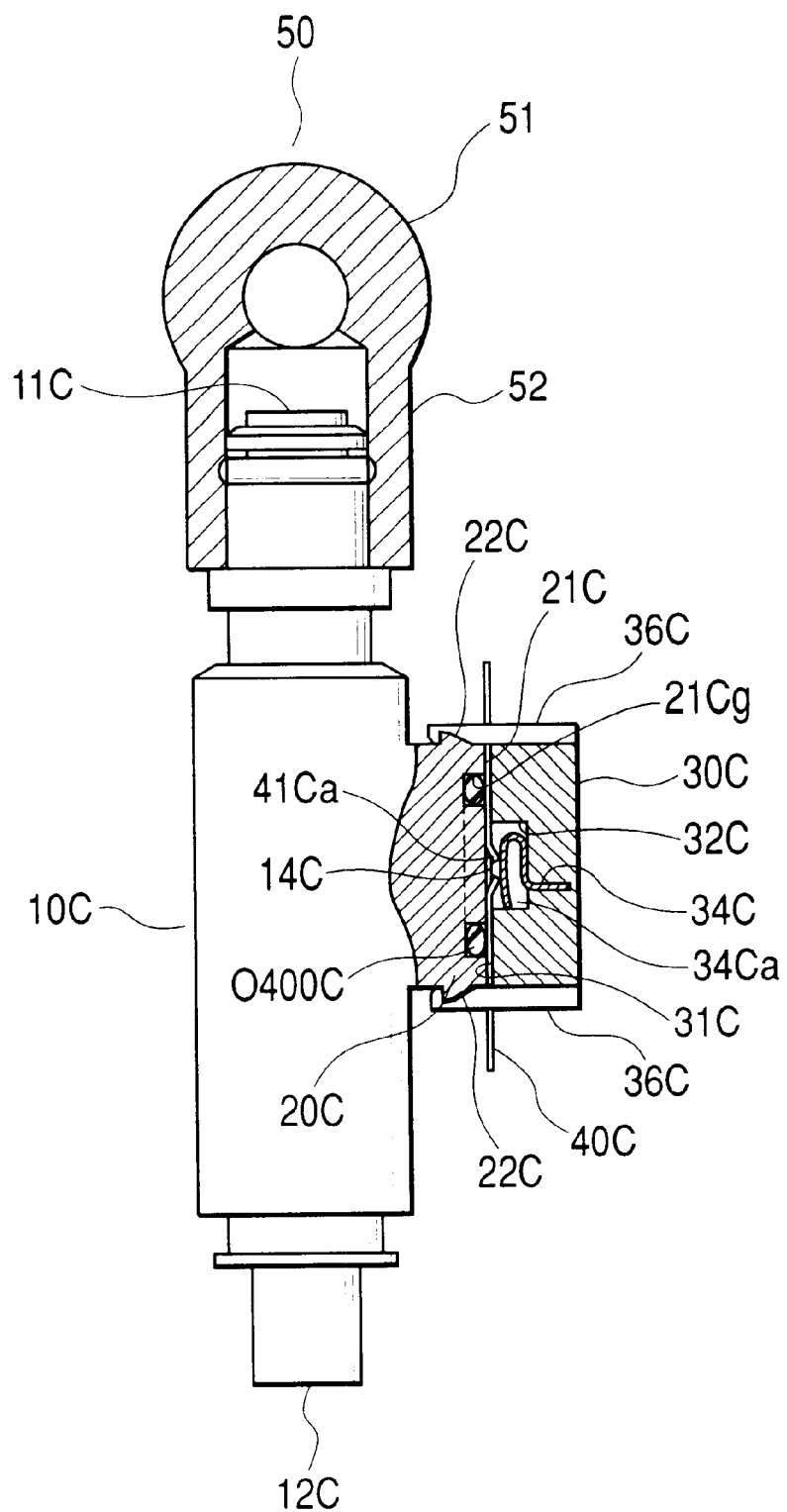
FIG. 46 is a partially broken side elevational view showing an injector integrated module according to Embodiment 3.
Figure 47:
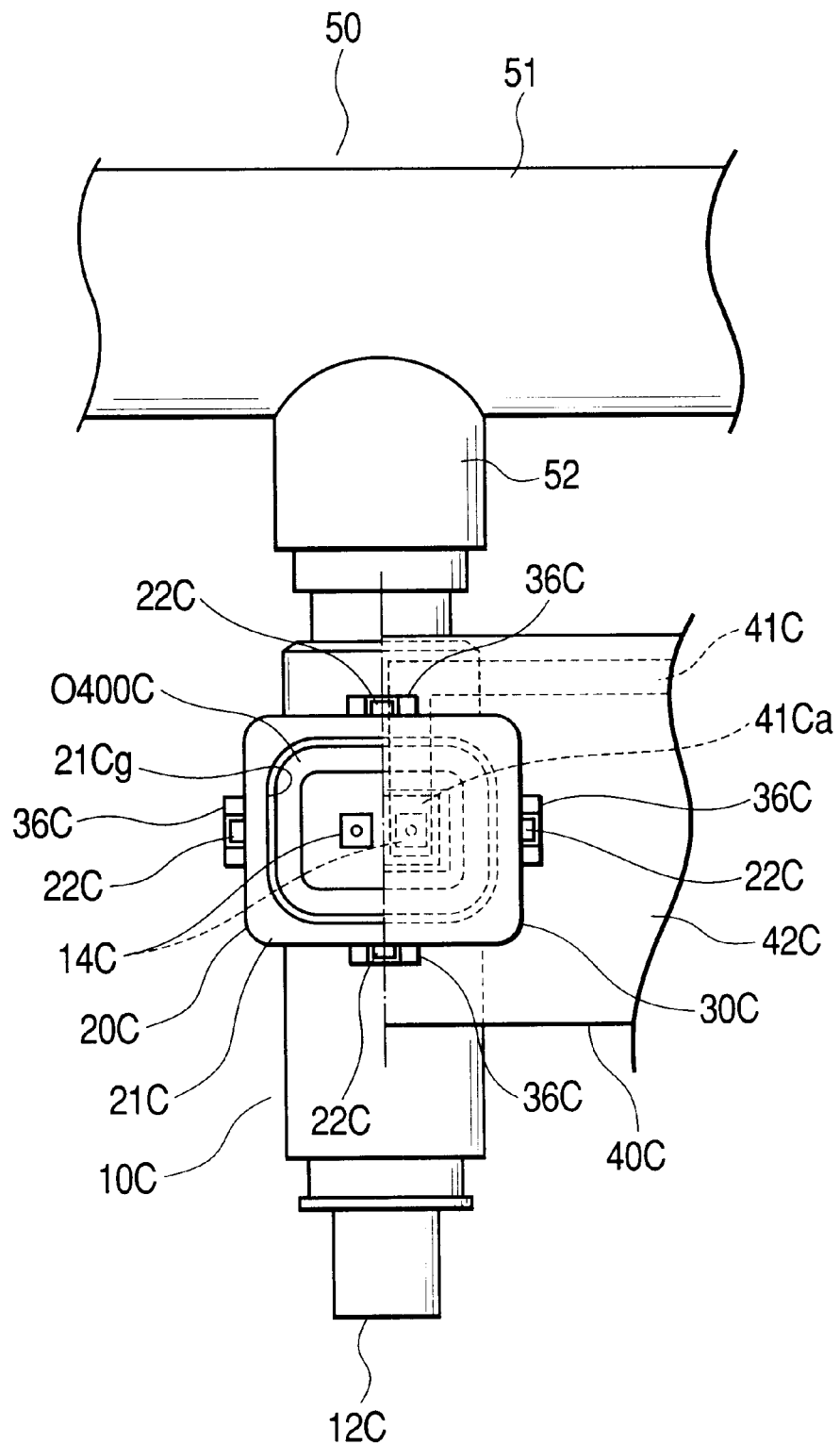
FIG. 47 is a partially broken front elevational view showing the same injector integrated module.
Figure 48:
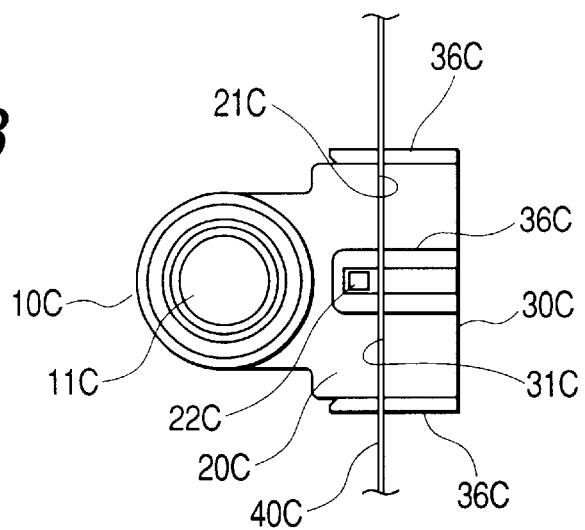
FIG. 48 is a plan view showing the same injector integrated module.
Figure 49:
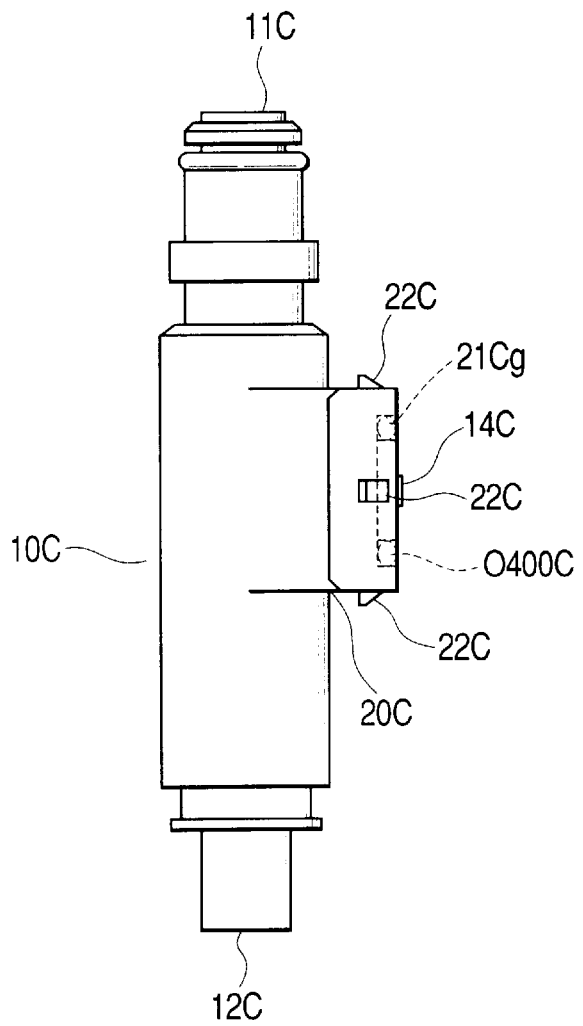
FIG. 49 is a front elevational view showing an injector member.
Figure 50:
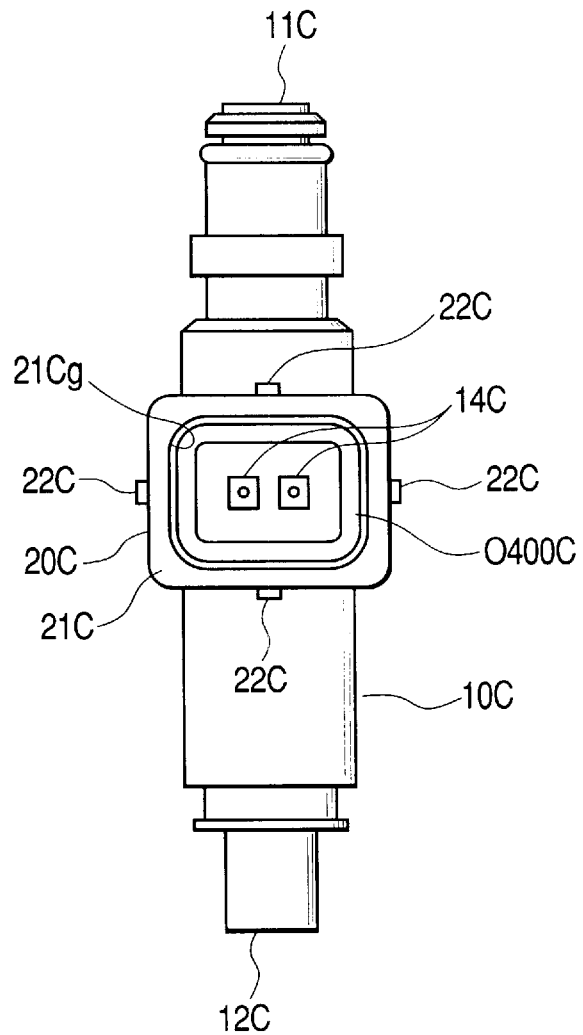
FIG. 50 is a side elevational view showing the injector member.
Figure 51:
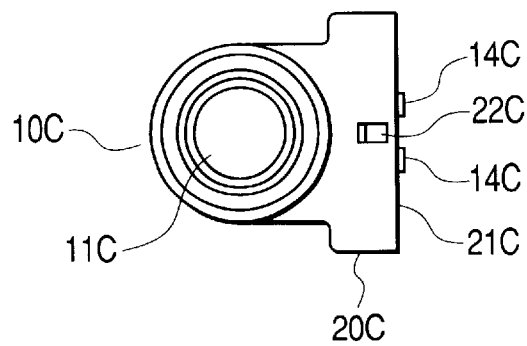
FIG. 51 is a plan view showing the injector member.

Further, as shown in FIG. 46 through FIG. 48, the flexible wiring member 40C is constructed so that a wiring conductor 41C to make electrical connections between the engine control unit 1 and the respective injector members 10C is placed between a pair of insulation films, for example, an FPC (flexible wiring board) may be used.

The flexible wiring member 40C is formed to be roughly band-shaped, wherein a connector (not illustrated) secured at one end portion thereof is connected to a connector at the engine control unit 1 side.

At the respective parts of the flexible wiring member 40C, which are held and fixed between the respective injector fixing members 30C and the respective connection base portions 20C, the insulation film 42C at one surface side (the side in contact with the respective connection base portions 20C) is partially removed, wherein exposed connection end portions 41Ca are formed at the corresponding surface side.

Connection base portions 20C that protrude outwardly of one side portion are formed at the side portion of the intermediate portion of the respective injector members 10C in the lengthwise direction. The connection base portions 20C have rectangular faces 21C to be pinched and fixed, and are roughly longitudinal. The corresponding rectangular pinched and fixed faces 21C are brought into surface contact with the flexible wiring member 40C in a state where the flexible wiring member 40C is held and fixed between the connection base portions 20C and the injector fixing members 30C.

The injector fixing members 30C are formed on the above-described connection base portions 20C so as to be attached and fixed thereat. In detail, the injector fixing members 30C are formed on a rectangular thick member having a pinched and fixed surfaces 31C corresponding to the pinched and fixed surfaces 21C of the connection base portion 20C. And, the engagement portion 36C formed at the middle part at the respective side portions of the injector fixing members 30C are engaged with the projections 22C formed at the corresponding portions at the connection base portion 20C side, whereby the injector fixing member 30C is formed so as to be attached and fixed at the connection base portion 20C.

In addition, the exposed connection end portion 41Ca at the flexible wiring member 40C side is electrically connected to the connection piece 14C at the injector member 10C side between the connection base portion 20C and the injector fixing member 30C.

In the embodiment, resilient pressing pieces 34C that press the respective exposed connection end portions 41Ca toward the respective connection pieces 14C are formed between the respective connection base portions 20C and the respective injector fixing members 30C, wherein the exposed connection end portions 41Ca are pressed, by the resilient pressing pieces 34C, to the connection pieces 14C so that the exposed connection end portions 41Ca are electrically connected thereto, and the exposed connection end portions 41Ca are electrically connected to the connection pieces 14C.

That is, a pair of connection pieces 14C that are electrically connected to the fuel opening and shutting mechanism in the injector members 10C are exposed to and formed at the pinched and fixed surfaces 21C of the above-described connection base portion 20C. The connection pieces 14C are formed of a thin band-shaped conductive piece such as metal, one end portion of which is buried in the injector member 10C and is electrically connected to the above-described fuel opening and shutting mechanism, and the other end portion of which is exposed to the pinched and fixed surfaces 21C of the connection base portion 20C.

Also, a recess 32C is formed roughly at the central portion of the pinched and fixed surface 31C of the injector fixing members 30C, and a resilient pressing piece 34C is provided in the recess 32C (Refer to FIG. 47).

The resilient pressing piece 34C is formed of a resilient member such as metal or resin, etc., one end portion of which is disposed in the above-described recess 32C, and the other end portion of which is formed at a flat and roughly C-shaped pressing portion 34Ca and is disposed in the above-described recess 32C. And, where the respective exposed connection end portions 41Ca are held and disposed between the pressing portion 34Ca and connection piece 34C, the respective exposed connection end portions 41Ca are pressed to the resilient pressing pieces 34C so that the connection end portions 41Ca are electrically connected to the respective connection pieces 14C.

Also, the resilient pressing piece 34C maybe made of a single material or may be made of a plurality of materials corresponding to the respective connection pieces 14C.

In addition, in the present embodiment, the exposed connection end portions 41Ca are pressed, by the resilient pressing pieces 34C, to the connection pieces 14C so that the exposed connection end portions 41Ca are electrically connected thereto. However, welding and/or soldering may be employed for electrical connection therebetween.

Also, in the present embodiment, annular resilient members O400C are disposed so that the annular resilient members can surround the connection portions of the respective exposed connection end portions 41Ca and the respective connection pieces 14C between the respective connection base portions 20C and the respective injector fixing members 30C.

In detail, an annular (in this example, to be annular with a rectangular section whose corners are roughly round) accommodating groove 21Cg is formed at the pinched and fixed surface 21C of the above-described connection base portion 20C, and annular resilient members O400C formed of a rubber, etc., are disposed and accommodated in the accommodating groove 21Cg.

Also, the annular resilient members O400C are compressed to intervene between the connection base end portions 20C and the flexible wiring member 40C in a state where the respective exposed connection end portions 41Ca are placed between the connection base end portions 20C and the injector fixing members 30C, whereby water can be prevented from invading between the connection base portions 20C and the injector fixing members 30C.

A description is given of an assembled example of the integrated module constructed as described above.

First, the annular resilient members O400C are accommodated and disposed in the accommodating grooves 21Cg that are formed on the pinched and fixed surfaces 21C of the connection base portions 20C, and the respective exposed connection end portions 41Ca of the flexible wiring member 40C are disposed on the respective connection pieces 14C corresponding thereto. In this state, the engagement portions 36C are engaged with the projections 22C, and the injector fixing members 30C are attached to and fixed at the connection base portions 20C. Thereby, the flexible wiring member 40C is held and fixed between the connection base portions 34C and the injector fixing members 30C, and the resilient pressing pieces 34C press the respective exposed connection end portions 41Ca toward the respective connection pieces 14C corresponding thereto, so that the respective exposed connection end portions 41Ca are electrically connected to the respective connection pieces 14C. Simultaneously therewith, the annular resilient members O400C are compressed to intervene between the connection base portions 20C and the flexible wiring member 40C.

Upon the completion of all of these steps of assembly with respect to all the injector members 10C, the injector integrated module is now assembled.

Further, the end portions of the respective injector members 10C at the fuel intake port 11C side are inserted into and connected to the respective attaching ports 52 of the delivery pipe 50 in an adequate process of the above-described assembly, wherein the end portions are integrated with the corresponding delivery pipe 50.

Thus, after the injector integrated module is assembled, the respective injector members 10C are installed at the engine body E side, wherein the injector integrated module is assembled to and attached to the engine body E.

The injector integrated module constructed as described above is provided with a flexible wiring member 40C in which a wiring conductor 41C that makes electrical connections between the engine control unit 1 and the respective injector members 10C is placed between a pair of insulation films 42; and a plurality of injector members 10C that internally incorporate a fuel opening and shutting mechanism which is driven to open and shut on the basis of a fuel injection control signal from the engine control unit 1 and that adjust the injection timing of fuel from the fuel injection holes. The respective wiring conductors 41C are electrically connected to the fuel opening and shutting mechanism in the respective injector members 10C at respective positions, on the flexible wiring member 40C, with spaces in which the respective injector members 10C are installed at the engine body E side. That is, a detailed description thereof is given below in compliance with the present embodiment. The connection base portions 20C are formed at one side portion of the respective injector members 10C, the connection pieces 14C that are electrically connected to the fuel opening and shutting mechanism are exposed to and formed at the connection base portions 20C, and injector fixing members 30C that can be fixed at the respective connection base portions 20C from a side direction are provided, wherein the respective injector fixing members 30C are fixed at the respective connection base portions 20C, the flexible wiring member 40C is held and fixed between the respective injector fixing members 30C and the respective connection base portions 20C, and the connection end portions of the wiring conductors 41C to the respective injector members 10C are formed as exposed connection end portions 41Ca that are exposed to the outside, at respective parts of the flexible wiring member 40C, which are held and fixed between the respective injector fixing members 30C and the respective connection base portions 20C. The exposed connection end portions 41Ca are electrically connected to the connection pieces 14C between the connection base portions 20C and the injector fixing members 30C at the respective injector members 10C. Therefore, unlike the prior arts, there is no need for the harness end portions led out from the engine control unit to be connected, one by one, to the respective injector members 10C that are installed on the engine body, wherein the injector members 10C and the flexible wiring member 40C that is a wiring material therefor can be easily assembled to the engine body.

Further, since the flexible wiring member 40C is employed as the wiring material to the respective injector members 10C, the weight can be further decreased in comparison with a structure in which harnesses are used for electric lines as the wiring materials to the respective injector members 10C.

Since the flexible wiring member 40C is held and fixed between the respective connection base portions 20C and the respective injector fixing members 30C, and the exposed connection end portions 41Ca are electrically connected to the connection pieces 14C between the connection base portions 20C and the respective injector fixing members 30C, a relative positional slip between the flexible wiring member 40C and the respective injector members 10C can be prevented from occurring, wherein connected states between the exposed connection end portions 41Ca and the connection pieces 14C can be further reliably maintained.

Further, since resilient pressing pieces 34C that press the respective exposed connection end portions 41Ca to the respective connection pieces 14C are formed at the respective injector fixing members 30C between the respective connection base portions 20C and the respective injector fixing members 30C, and the exposed connection end portions 41Ca are pressed to the connection pieces 14C by the resilient pressing pieces 34C at the respective injector members 10C so that the exposed connection end portions 41Ca are electrically connected to the connection pieces 14C, it is possible to electrically connect the exposed connection end portions 41Ca to the connection pieces more easily in comparison with the case where welding and soldering are carried out.

In particular, in the present embodiment, since the exposed connection end portions 41Ca of the flexible wiring member 40C are pressed to the connection pieces 14C so as to be brought into electrical contact with the connection pieces 14C along the direction orthogonal to the surface direction of the flexible wiring member 40C, an electrically connected state can be maintained between the exposed connection end portions 41Ca and the connection pieces 14C even if the respective injector members 10C slip more or less in the surface direction of the flexible wiring member 40C. Therefore, an electrically connected state between the exposed connection end portions 41Ca and the connection pieces 14C can be further reliably maintained with respect to a positional slip of the respective injector members 10C along the surface direction of the flexible wiring member 40.

Further, since such a construction is employed, in which the end portion of the injector members 10C at the fuel intake port 11C side is inserted into and connected to the attaching portion 52, it is possible to absorb a positional slip at the attaching portions between the delivery pipe 50 and the injector members 10C of the engine body E at the cylinder head side, which results from production tolerances and slips due to thermal expansion.

Also, prior to assembling the injector members 10C in the engine body E, the respective injector members 10C are integrated with the delivery pipe 50 in a state where the respective injector members 10C are connected to and held at the engine body E side in an installable state, wherein it is possible to simultaneously and easily install the respective injector members 10C at the engine body E.

Also, as in the mode shown in FIG. 9 in the above-described Embodiment 1, the delivery pipe 50 may be integrated with the engine head cover.

The constructions described in connection with the above-described respective embodiments and those according to the modified examples may be applicable to the other embodiments and other modified examples.

EFFECTS OF THE INVENTION

As described above, the injector integrated module as set forth in Aspects 1 through 15 of the invention is provided with a flexible wiring member, in which a wiring conductor to make electrical connections between the engine control unit 1 and the respective injector members is placed between a pair of insulation films, and a plurality of injector members internally having a fuel opening and shutting mechanism that is driven to open and shut on the basis of a fuel injection control signal from the engine control unit and that adjusts the injection timing of fuel from the fuel injection holes. The respective wiring conductors of the flexible wiring member are electrically connected to the fuel opening and shutting mechanism in the respective injector members at respective positions, on the flexible wiring member, with spaces in which the respective injector members are installed at the engine body side. Therefore, unlike the prior arts, it is not necessary to connect, one by one, the end portions of the harnesses from the engine control unit to the respective injector members secured at the engine body, and the injector members and the wiring members thereto can be easily assembled to the engine body.

The flexible wiring member is employed as the wiring material to the respective injector members, a decrease in the total weight can be achieved.

Also, a construction by which the wiring conductors of the flexible wiring members are electrically connected to the fuel opening and shutting mechanism in the respective injector members maybe that described in Aspect 2. That is, the respective injector members may be formed to be roughly cylindrical, at one end side of which a fuel intake port is formed, and at the other end portion of which a fuel injection hole is formed; collar-shaped holding portions are formed at the outer circumferential portion of the respective injector so as to protrude along the circumferential direction thereof, and simultaneously, a plurality of injector fixing members that are externally fitted from the end portion at the fuel intake port side or the fuel injection hole side and are fixed at the respective injector members are provided, corresponding to the respective injector members; a circumferential edge part of the respective injector inserting holes of the flexible wiring member is held and fixed between the respective collar-shaped holding portions and the respective injector fixing members that are externally fitted to the respective injector members in a state where the injector members are, respectively, inserted into a plurality of injector inserting holes formed on the flexible wiring member; connection pieces that are electrically connected to the fuel opening and shutting mechanism are exposed at and formed at the outer circumference of the respective injector members while connection end portions of the wiring conductor to the respective injector members are formed at an exposed connection end portion that is exposed to the outside at the circumferential edge portions of the respective injector inserting holes; and the exposed connection end portions are electrically connected to the connection pieces between the collar-shaped holding portions and the injector fixing members in the respective injector members. In this case, as is described in Aspect 3, resilient pressing pieces that press the respective exposed connection end portions toward the respective connection pieces may be formed at the respective injector fixing members between the respective collar-shaped holding portions and the respective injector fixing members; and the exposed connection end portions are pressed so as to be brought into electrical contact with the connection pieces by the resilient pressing pieces in the respective injector members, whereby it is possible to further easily connect the exposed connection end portions to connection pieces in comparison with welding and/or soldering.

As is described in Aspect 4, the respective connection pieces may be exposed to and formed at positions where the respective connection pieces can be brought into contact with one surface side of the flexible wiring member of the respective collar-shaped holding portions, which is held and fixed between the respective collar-shaped holding portions and the respective injector fixing members; the respective exposed connection end portions are formed so as to be exposed to a position where the respective exposed connection end portions are brought into contact with the respective connection pieces at one surface side of the flexible wiring member; resilient pressing pieces that press the respective exposed connection end portions from the other side of the flexible wiring member to the connection pieces corresponding thereto are formed at the respective injector fixing members; the exposed connection end portions are pressed by the resilient pressing members from the other side of the flexible wiring member along the direction orthogonal to the surface direction of the flexible wiring member in the respective injector members so that the exposed connection end portions are brought into electrical contact with the connection pieces. In this case, it is possible to easily connect the exposed connection end portions to connection pieces in comparison with welding and/or soldering. In addition thereto, an electrically connected state between the exposed connection end portions and the connection pieces can be further reliably maintained even if the respective injector members slip more or less in the surface direction of the flexible wiring member. Therefore, an electrically connected state between the exposed connection end portions and the connection pieces can be further reliably maintained with respect to a positional slip of the respective injector members along the surface direction of the flexible wiring member.

Further, as is described in Aspect 5, wherein it is assumed that an annular resilient member is disposed, at a position avoiding the respective injector members so that the injector members are not internally included, between the respective collar-shaped holding portions and the respective injector fixing members; and the exposed connection end portions are electrically connected to the connection pieces, at a position surrounded by the annular resilient member, between the collar-shaped holding portions and the injection fixing members, a waterproof feature can be achieved by the corresponding annular resilient members at the connection parts between the exposed connection end portions and the connection pieces, wherein it is possible to simplify the waterproof structure and to make it small.

As is set forth in Aspect 6, where it is assumed that the respective injector members are integrated with a delivery pipe in a state where the respective injector members are connected to and held at the engine body side in an installable state, it is possible to simultaneously and easily install the respective injector members at the engine body side.

Also, a construction by which the wiring conductors of the flexible wiring members are electrically connected to the fuel opening and shutting mechanism in the respective injector members maybe that described in Aspect 7. That is, the respective injector members maybe formed to be roughly cylindrical, at one end portion of which a fuel intake port is formed, and at the other end portion of which a fuel injection hole is formed; a delivery pipe having a plurality of injection attaching base portions is provided, into and to which the end portion at the fuel intake port side of the respective injector members are inserted and connected, and which holds the respective injector members in a state where the respective injector members are installed at the engine body side; a plurality of injector fixing members, which are externally fitted to the respective injector members from the end portion at the fuel injection hole side, and are fixed at the respective injector attaching base portions, are provided, corresponding to the respective injector members; circumferential edge parts of the respective injector inserting holes of the flexible wiring member are held and fixed between the respective injector attaching base portions and the respective injector fixing members, which are externally fitted to the respective injector members, in a state where the end portions of the respective injector members at the fuel intake port side are inserted into and connected to the respective injector attaching base portions, and at the same time the respective injector members are, respectively, inserted into and connected to a plurality of injector inserting holes formed in the flexible wiring member; connection pieces that are electrically connected to the fuel opening and shutting mechanism are exposed to and formed at the outer circumference of the respective injector members while connection end portions of the wiring conductor to the respective injector members are formed at exposed connection end portions that are exposed to the outside at the circumferential edge part of the respective injector inserting holes; and the exposed connection end portions are electrically connected to the connection pieces between the injector attaching base portions and the injector fixing members at the respective injector members. In this case, as in Aspect 8, the injector fixing member may be integrated with the injector member. Thereby, a waterproof structure is no longer required between the corresponding injector fixing members and the injector members.

As in Aspect 9, resilient pressing pieces that press the respective exposed connection end portions toward the respective connection pieces may be formed at the respective injector attaching base portions between the respective injector attaching base portions and the respective injector fixing members, and the exposed connection end portions are pressed to the connection pieces by the resilient pressing pieces in the respective injector members so as to be brought into electrical contact with the connection pieces. In this case, it is possible to electrically connect the exposed connection end portions and the connection pieces together in comparison with cases of welding and/or soldering.

Also, as in Aspect 10, the respective connection pieces may be exposed to and formed at positions where the respective connection pieces are brought into contact with one surface side of the flexible wiring member of the respective injector fixing members, which is held and fixed between the respective injector fixing members and the respective injector attaching base portions; the respective exposed connection end portions exposed to and formed at positions where the exposed connection end portions are brought into contact with the respective connection pieces at one surface side of the flexible wiring member; resilient pressing pieces that press the respective exposed connection end portions to the respective connection pieces corresponding thereto from the other side of the flexible wiring member are formed at the respective injection attaching base portions; and the exposed connection end portions are pressed, by the resilient pressing pieces, along the direction orthogonal to the surface direction of the flexible wiring member in the respective injector members in a state where the exposed connection end portions are brought into electrical contact with the connection pieces. In this case, the exposed connection end portions can be more easily electrically connected to the connection pieces in comparison with cases of welding and soldering. In addition, since an electrically connected state can be maintained between the exposed connection end portions and the connection pieces even if the respective injector members slip more or less in the surface direction of the flexible wiring member, an electrically connected state between the exposed connection end portions and connection pieces can be further reliably secured with respect to a positional slip of the respective injector members along the surface direction of the flexible wiring member.

Still further, as is described in Aspect 11, where it is assumed that annular resilient members are disposed at positions avoiding the respective injector members, so that the respective injector members are not internally included, between the respective injector attaching base portions and the respective injector fixing members; and the exposed connection end portions are electrically connected to the connection pieces at positions, where the exposed connection end portions are surrounded by the annular resilient members between the injector attaching base portions and the injector fixing members, a waterproof feature can be achieved by the corresponding annular resilient members at the connected portions between the corresponding connection end portions and the connection pieces, wherein the waterproof structure can be simplified and made smaller in size.

Also, a construction by which the wiring conductors of the flexible wiring member are electrically connected to the fuel opening and shutting mechanism in the respective injector members may be that described in Aspect 12. That is, connection base portions may be formed at one side portion of the respective injector members, and at the same time, connection pieces that are electrically connected to the fuel opening and shutting mechanism may be exposed to and formed at the connection base portions; injector fixing members that are able to be fixed at the respective connection base portions from aside may be provided, corresponding to the respective injector members; the flexible wiring member may be held and fixed between the respective injector fixing members and the respective connection base portions by the respective injector fixing members being fixed at the respective connection base portions; exposed connection end portions in which the connection end portions of the wiring conductor to the respective injector members are exposed to the outside may be formed at respective portions of the flexible wiring member, which are held and fixed between the respective injector fixing member and the respective connection base portions; and the exposed connection end portions may be electrically connected to the connection pieces between the connection end portions and the injector fixing members in the respective injector members. In this case, as in Aspect 13, an annular resilient member may be disposed so as to surround the connection portions of the respective exposed connection end portions and the respective connection pieces between the respective connection end portions and the respective injector fixing members. A waterproof feature can be secured by the corresponding annular resilient members between the exposed connection end portions and connection pieces, wherein the waterproof structure can be simplified and can be made smaller in size.

As in Aspect 14, where it is assumed that resilient pressing pieces that press the exposed connection end portions toward the respective connection pieces between the respective connection base portions and the respective injector fixing members are formed in the injector fixing members; and the exposed connection end portions are pressed by the resilient pressing piece so as to be brought into electrical contact with the connection pieces in the respective injector members, it is possible to electrically connect both the exposed connection end portions and the connection pieces more easily in comparison with cases of welding and soldering, etc.

Still further, as in Aspect 15, the delivery pipe may be integrated with the engine head cover, wherein since the respective injector members can be assembled simultaneously with the mounting of the engine head cover, its assembly can be further facilitated.

What is claimed is:

1. An injector integrated module provided with a plurality of injector members corresponding to respective combustion chambers of an engine, which carries out fuel injection control of said respective injectors by an engine control unit;

said injector integrated module comprising:
a flexible wiring member in which a wiring conductor to make electrical connections between said engine control unit and said respective injector members is placed between a pair of insulation films; and
a plurality of injector members internally having a fuel opening and shutting mechanism incorporated, which is driven to open and shut on the basis of a fuel injection control signal from said engine control unit and adjusts injection timing of fuel from a fuel injection hole, wherein
said wiring conductor of said flexible wiring member is electrically connected to a fuel opening and shutting mechanism in said respective injector members at respective positions on said flexible wiring member having spacing that permits said respective injector members to be installed at the engine body side.

2. The injector integrated module as set forth in claim 1, wherein
said respective injector members are formed to be roughly cylindrical, at one end side of which a fuel intake port is formed, and at the other end side of which a fuel injection hole is formed;
collar-shaped holding portions are formed at the circumferential portion of said respective injector members so as to protrude along the circumferential direction thereof, and simultaneously, a plurality of injector fixing members that are externally fitted from the end portion at the fuel intake port side or the fuel injection hole side and are fixed at the respective injector members are provided, corresponding to said respective injector members;
a circumferential edge part of said respective injector inserting holes of said flexible wiring member is held and fixed between said respective collar-shaped holding portions and said respective injector fixing members that are externally fitted to said respective injector members in a state where said injector members are, respectively, inserted into a plurality of injector inserting holes formed on said flexible wiring member;
connection pieces that are electrically connected to said fuel opening and shutting mechanism are exposed at and formed at the outer circumference of said respective injector members while connection end portions of said wiring conductor to said respective injector members are formed at an exposed connection end portion that is exposed to the outside at the circumferential edge part of said respective injector inserting holes; and
said exposed connection end portions are electrically connected to said connection pieces between said collar-shaped holding portions and said injector fixing members in said respective injector members.

3. The injector integrated module as set forth in claim 2, wherein
resilient pressing pieces that press said respective exposed connection end portions toward said respective connection pieces are formed at said respective injector fixing members between said respective collar-shaped holding portions and said respective injector fixing members; and
said exposed connection end portions are pressed so as to be brought into electrical contact with said connection pieces by said resilient pressing pieces in said respective injector members.

4. The injector integrated module as set forth in claim 2, wherein
said respective connection pieces are exposed to and formed at positions where the respective connection pieces is capable to be brought into contact with one surface side of said flexible wiring member of said respective collar-shaped holding portions, which is held and fixed between said respective collar-shaped holding portions and said respective injector fixing members;
said respective exposed connection end portions are formed so as to be exposed to a position where the respective exposed connection end portions are brought into contact with said respective connection pieces at one surface side of said flexible wiring member;
resilient pressing pieces that press said respective exposed connection end portions from the other side of said flexible wiring member to said connection pieces corresponding thereto are formed at said respective injector fixing members;
said exposed connection end portions are pressed by said resilient pressing members from the other side of said flexible wiring member along the direction orthogonal to the surface direction of said flexible wiring member in said respective injector members so that the exposed connection end portions are brought into electrical contact with said connection pieces.

5. The injector integrated module as set forth in claim 2, wherein an annular resilient member is disposed, at a position avoiding said respective injector members so that said injector members are not internally included, between said respective collar-shaped holding portions and said respective injector fixing members; and said exposed connection end portions are electrically connected to said connection pieces, at a position surrounded by said annular resilient member, between said collar-shaped holding portions and said injection fixing members.

6. The injector integrated module as set forth in claim 2, wherein said respective injector members are integrated with a delivery pipe in a state where said respective injector members are connected to and held at the engine body side in an installable state.

7. The injector integrated module as set forth in claim 1, wherein said respective injector members are formed to be roughly cylindrical, at one end side of which a fuel intake port is formed, and at the other end side of which a fuel injection hole is formed;

a delivery pipe having a plurality of injection attaching base portions is provided, into and to which the end portion at the fuel intake port side of said respective injector members are inserted and connected, and which holds said respective injector members in a state where the respective injector members are installed at said engine body side;

a plurality of injector fixing members, which are externally fitted to the respective injector members from the end portion at the fuel injection hole side, and are fixed at said respective injector attaching base portions, are provided, corresponding to said respective injector members;

circumferential edge parts of said respective injector inserting holes of said flexible wiring member are held and fixed between said respective injector attaching base portions and said respective injector fixing members, which are externally fitted to said respective injector members, in a state where the end portions of said respective injector members at the fuel intake port side are inserted into and connected to said respective injector attaching base portions, and at the same time said respective injector members are, respectively, inserted into and connected to a plurality of injector inserting holes formed in said flexible wiring member;

connection pieces that are electrically connected to said fuel opening and shutting mechanism are exposed to and formed at the outer circumference of said respective injector members while connection end portions of said wiring member to said respective injector members are formed at exposed connection end portions that are exposed to the outside at the circumferential edge part of said respective injector inserting holes; and said exposed connection end portions are electrically connected to said connection pieces between said injector attaching base portions and said injector fixing members at said respective injector members.

8. The injector integrated module as set forth in claim 7, wherein said injector fixing member is integrated with said injector member.

9. The injector integrated module as set forth in claim 7, wherein resilient pressing pieces that press said respective exposed connection end portions toward said connection pieces are formed at said respective injector attaching base portions between said respective injector attaching base portions and said respective injector fixing members, and said exposed connection end portions are pressed to said connection pieces by said resilient pressing pieces in said respective injector members so as to be brought into electrical contact with the connection pieces.

10. The injector integrated module as set forth in claim 7, wherein said respective connection pieces are exposed to and formed at positions where the connection pieces are brought into contact with one surface side of said flexible wiring member of said respective injector fixing members, which is held and fixed between said respective injector fixing members and said respective injector attaching base portions;

said respective exposed connection end portions exposed to and formed at positions where the exposed connection end portions are brought into contact with said respective connection pieces at one surface side of said flexible wiring member;

resilient pressing pieces that press said respective exposed connection end portions to said respective connection pieces corresponding thereto from the other side of said flexible wiring member are formed at said respective injection attaching base portions; and said exposed connection end portions are pressed, by said resilient pressing pieces, along the direction orthogonal to the surface direction of said flexible wiring member in said respective injector members in a state where the exposed connection end portions are brought into electrical contact with said connection pieces.

11. The injector integrated module as set forth in claim 7, wherein annular resilient members are disposed at positions avoiding said respective injector members, so that the respective injector members are not internally included, between said respective injector attaching base portions and said respective injector fixing members; and said exposed connection end portions are electrically connected to said connection pieces at positions, where the exposed connection end portions are surrounded by said annular resilient member between said injector attaching base portions and said injector fixing members.

12. The injector integrated module as set forth in claim 1, wherein connection base portions are formed at one side of said respective injector members, and at the same time, connection pieces that are electrically connected to said fuel opening and shutting mechanism are exposed to and formed at the connection base portions;

injector fixing members that are able to be fixed at said respective connection base portions from a side direction are provided, corresponding to said respective injector members;

said flexible wiring member is held and fixed between the respective injector fixing members and the respective connection base portions by said respective injector fixing members being fixed at said respective connection base portions;

exposed connection end portions in which the connection end portions of said wiring conductor to said respective injector members are exposed to the outside are formed at respective portions of said flexible wiring member, which are held and fixed between said respective injector fixing member and said respective connection base portions; and said exposed connection end portions are electrically connected to said connection pieces between said connection end portions and said injector fixing members in said respective injector members.

13. The injector integrated module as set forth in claim 12, wherein an annular resilient member is disposed so as to surround the connection portions of said respective exposed connection end portions and said respective connection pieces between said respective connection end portions and said respective injector fixing members.

14. The injector integrated module as set forth in claim 12, wherein resilient pressing pieces that press said exposed connection end portions toward said connection pieces between said respective connection base portions and said respective injector fixing members are formed in said injector fixing members; and said exposed connection end portions are pressed by said resilient pressing member so as to be brought into electrical contact with said connection pieces in said respective injector members.

15. The injector integrated module as set forth in claim 1, wherein said delivery pipe is integrated with the engine head cover.

* * * * *